United States Patent
Saito et al.

(10) Patent No.: US 8,686,636 B2
(45) Date of Patent: Apr. 1, 2014

(54) LAMP ASSEMBLY HAVING LIGHT SOURCE WITH LUMINANCE PEAK PORTION AT ONE OF THE LONG SIDES OF THE LIGHT SOURCE

(75) Inventors: Tatsuma Saito, Tokyo (JP); Yusuke Yokobayashi, Tokyo (JP); Shigeru Murata, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 177 days.

(21) Appl. No.: 13/217,231

(22) Filed: Aug. 24, 2011

(65) Prior Publication Data
US 2012/0051079 A1 Mar. 1, 2012

(30) Foreign Application Priority Data

Aug. 24, 2010 (JP) .................. 2010-187585
Aug. 24, 2010 (JP) .................. 2010-187586
Sep. 8, 2010 (JP) .................. 2010-201296
Sep. 8, 2010 (JP) .................. 2010-201297

(51) Int. Cl.
*B60Q 1/04* (2006.01)
*B60Q 1/14* (2006.01)

(52) U.S. Cl.
USPC ............ 313/538; 313/507; 313/521; 313/539

(58) Field of Classification Search
USPC ........................ 362/507, 520–522, 538, 539
See application file for complete search history.

(56) References Cited

U.S. PATENT DOCUMENTS

| | | |
|---|---|---|
| 6,828,596 B2 | 12/2004 | Steigerwald et al. |
| 2005/0088853 A1* | 4/2005 | Yatsuda et al. ............. 362/545 |
| 2005/0242355 A1 | 11/2005 | Guenther et al. |
| 2007/0121690 A1* | 5/2007 | Fujii et al. .............. 372/43.01 |
| 2009/0001490 A1 | 1/2009 | Bogner et al. |
| 2009/0237938 A1* | 9/2009 | Tsutsumi .............. 362/257 |

FOREIGN PATENT DOCUMENTS

JP 2005-322923 A 11/2005
JP 2008-507850 A 3/2008

OTHER PUBLICATIONS

U.S. Appl. No. 13/218,960.*
U.S. Appl. No. 13/653,677.*

* cited by examiner

*Primary Examiner* — Nimeshkumar Patel
*Assistant Examiner* — Steven Horikoshi
(74) *Attorney, Agent, or Firm* — Kenealy Vaidya LLP

(57) ABSTRACT

A lamp assembly is provided, that utilizes a light source including an LED element without cutting part of light therefrom and capable of forming a luminance distribution where the light with a maximum peak portion can be arranged substantially at (i.e., at or near) the cutoff line, thereby improving light utilization efficiency. The lamp assembly with an illumination direction can include a light source including an LED element with an emission surface, and a projection optical system for projecting an image of the light source in the illumination direction so that a desired light distribution pattern can be formed on a virtual vertical screen. The light source can have a rectangular shape having long sides and short sides, and can be configured to provide a luminance distribution on the emission surface such that a luminance peak portion is provided at or near one of the long sides.

11 Claims, 42 Drawing Sheets

Fig. 4
Conventional Art
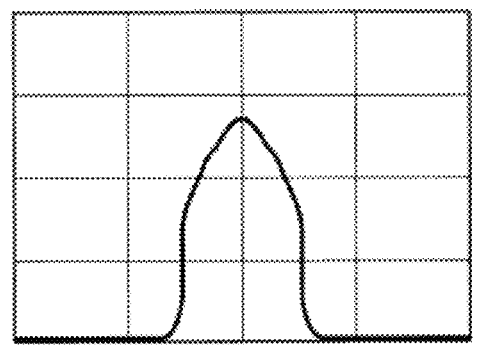
Cut
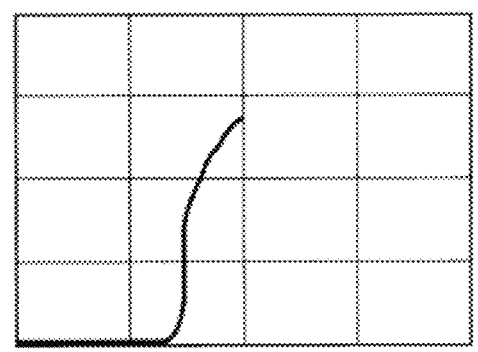

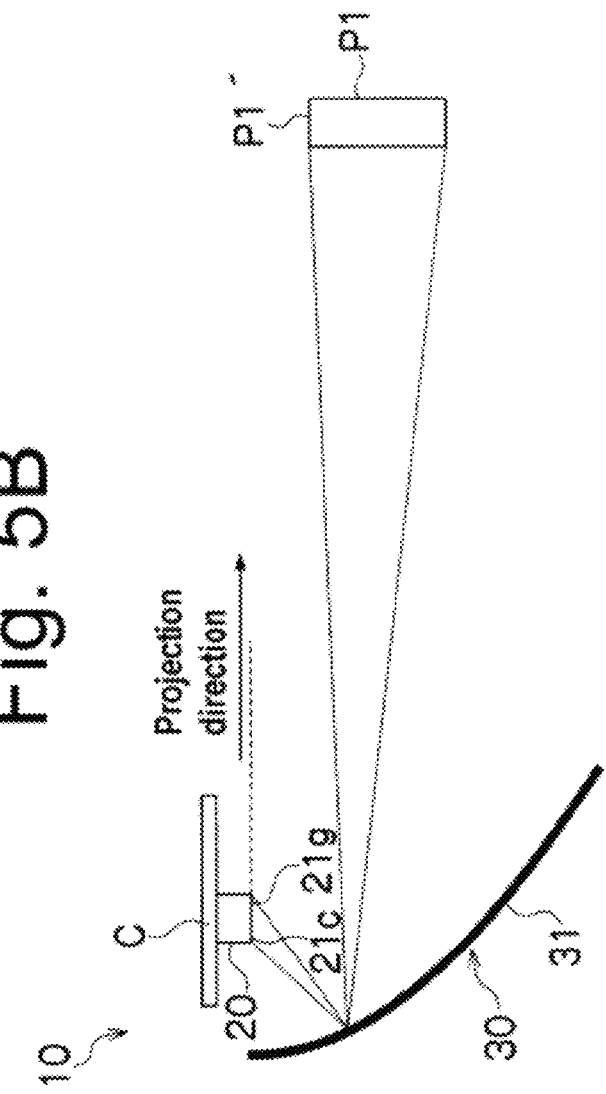
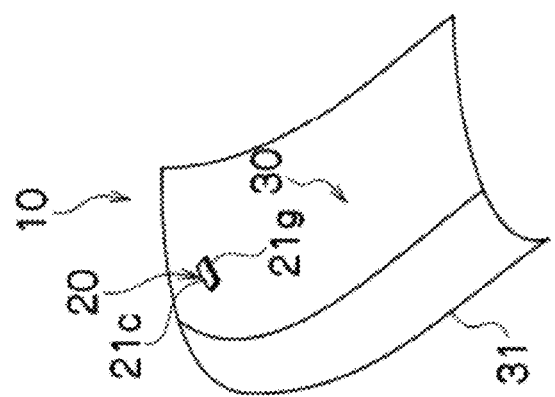

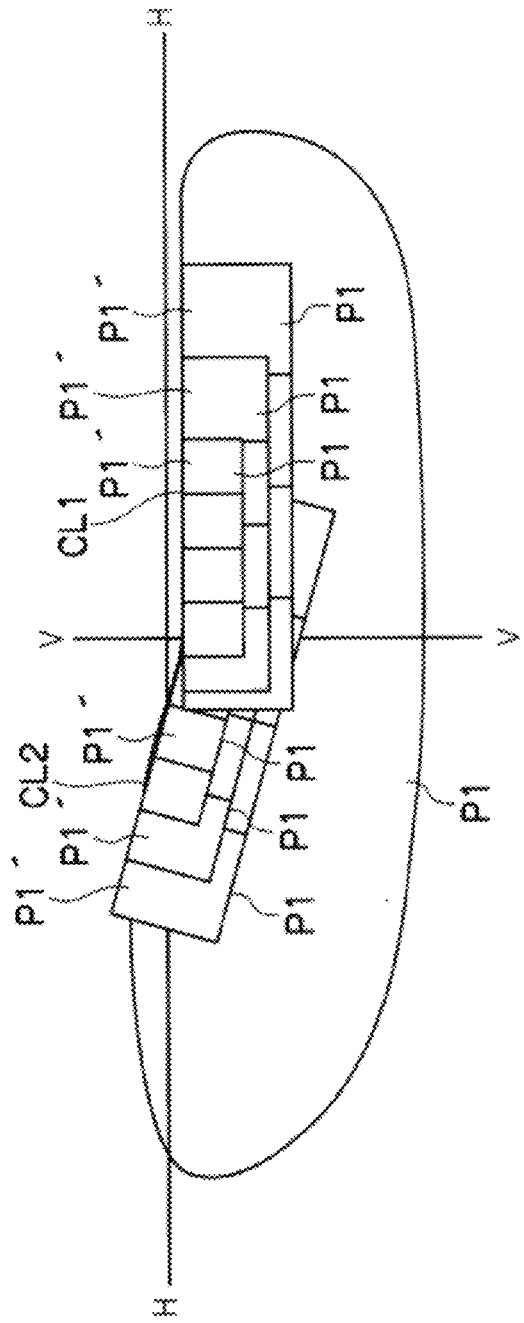

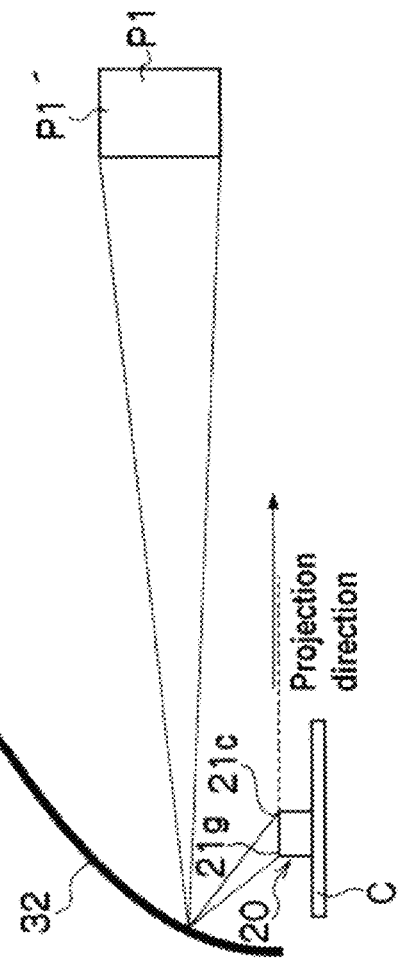
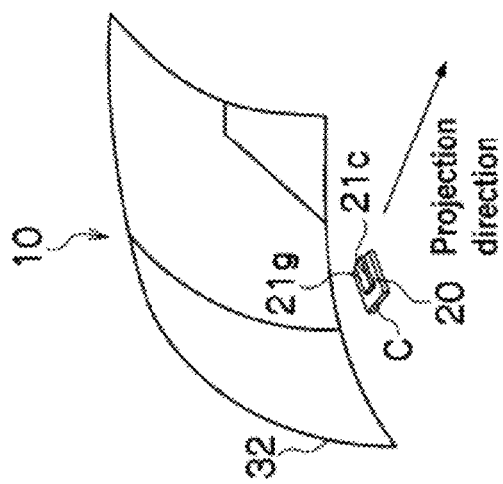

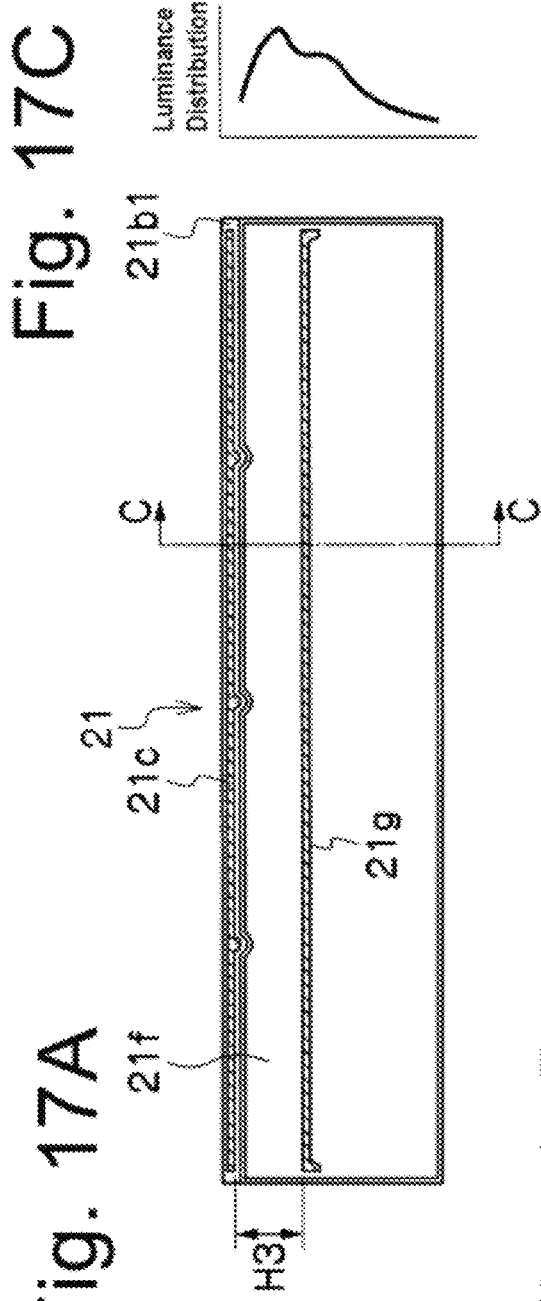

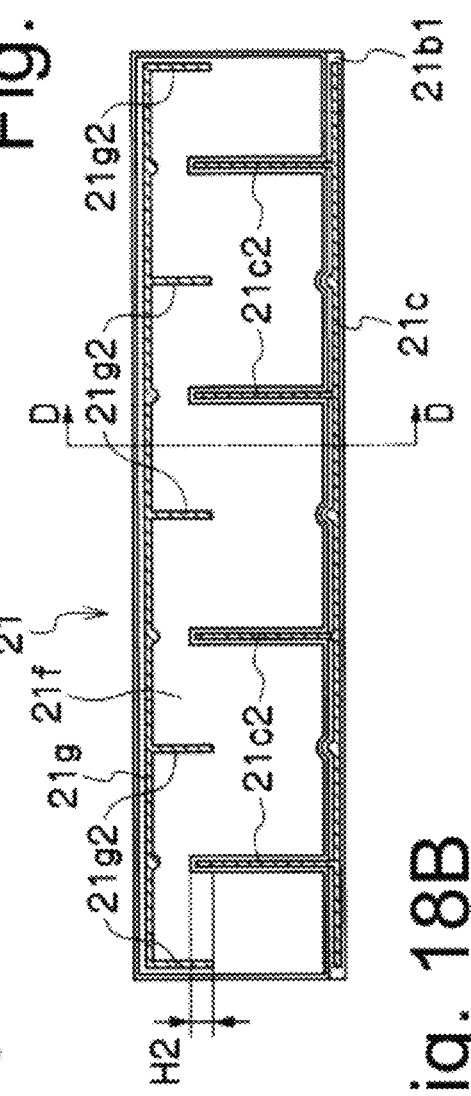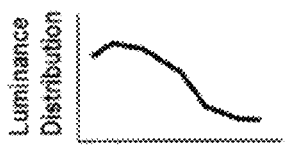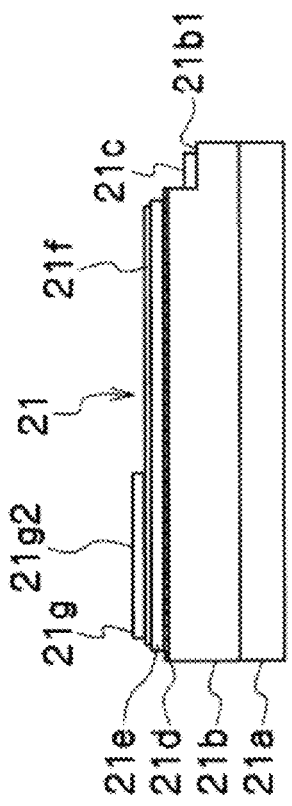

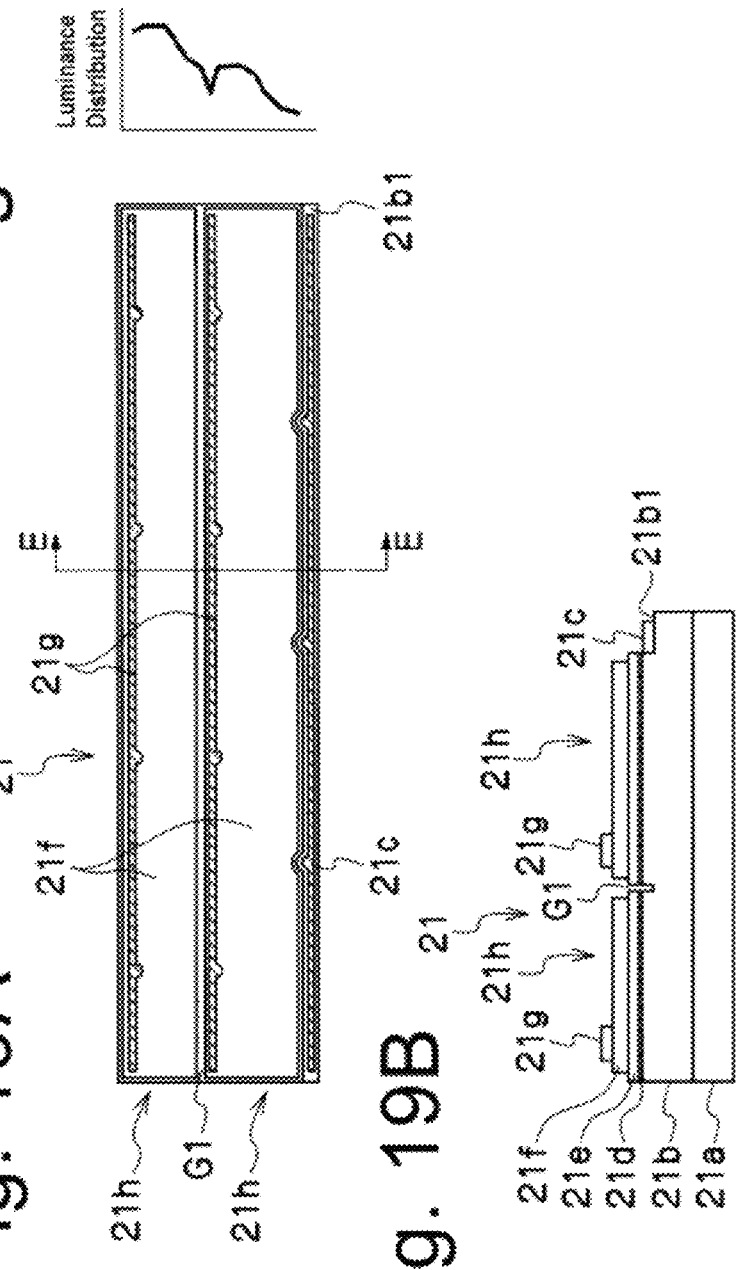

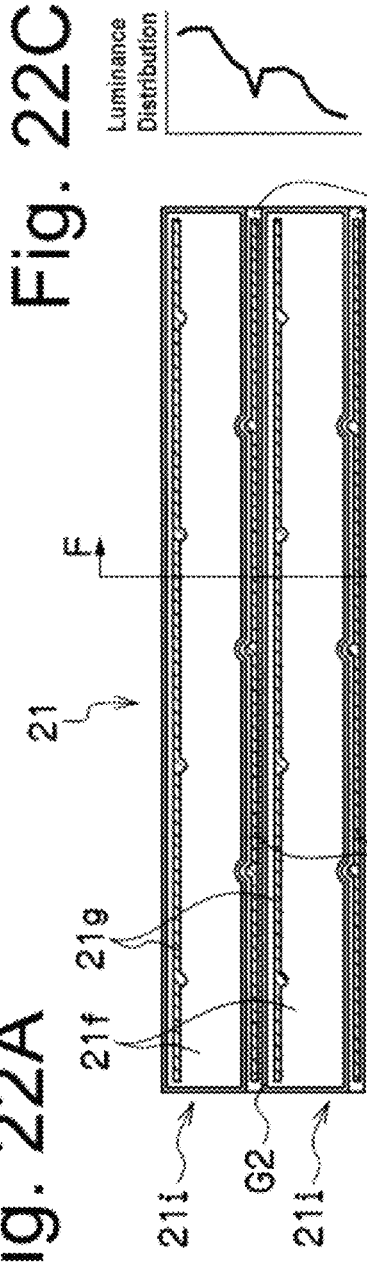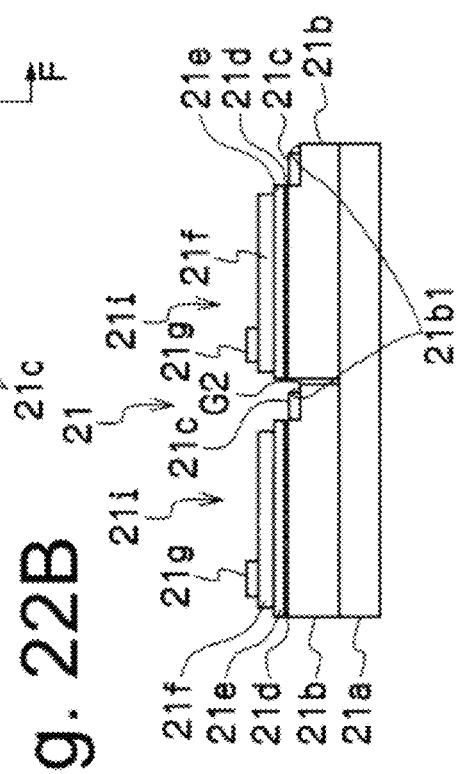

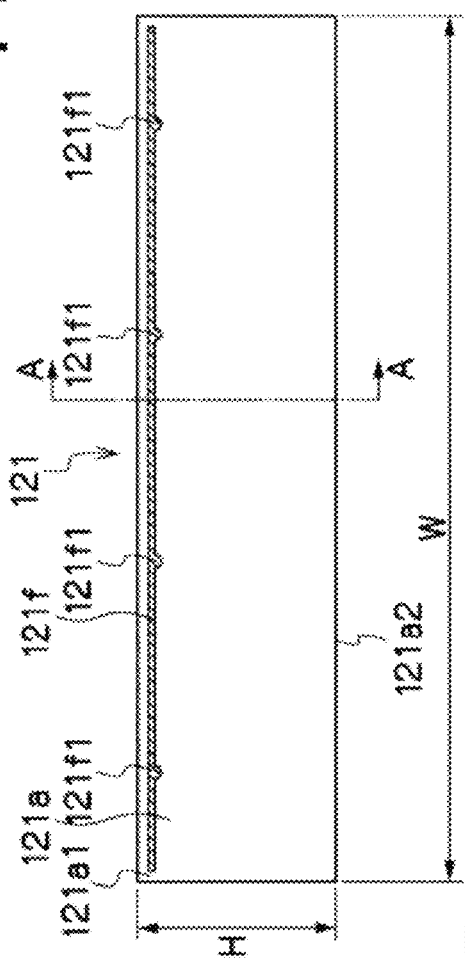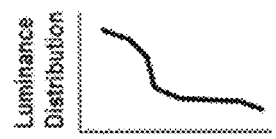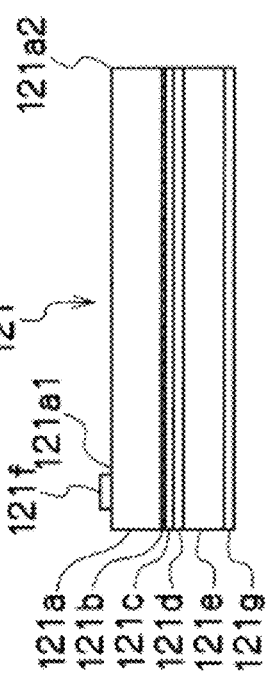

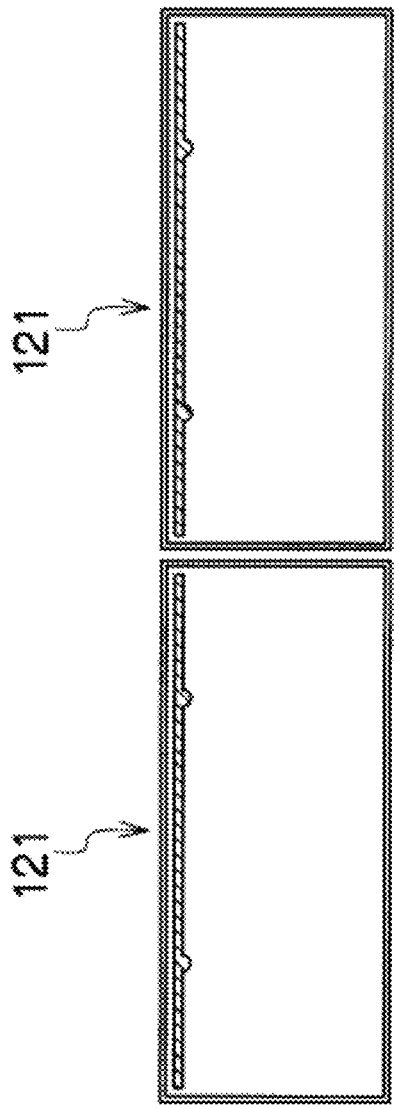

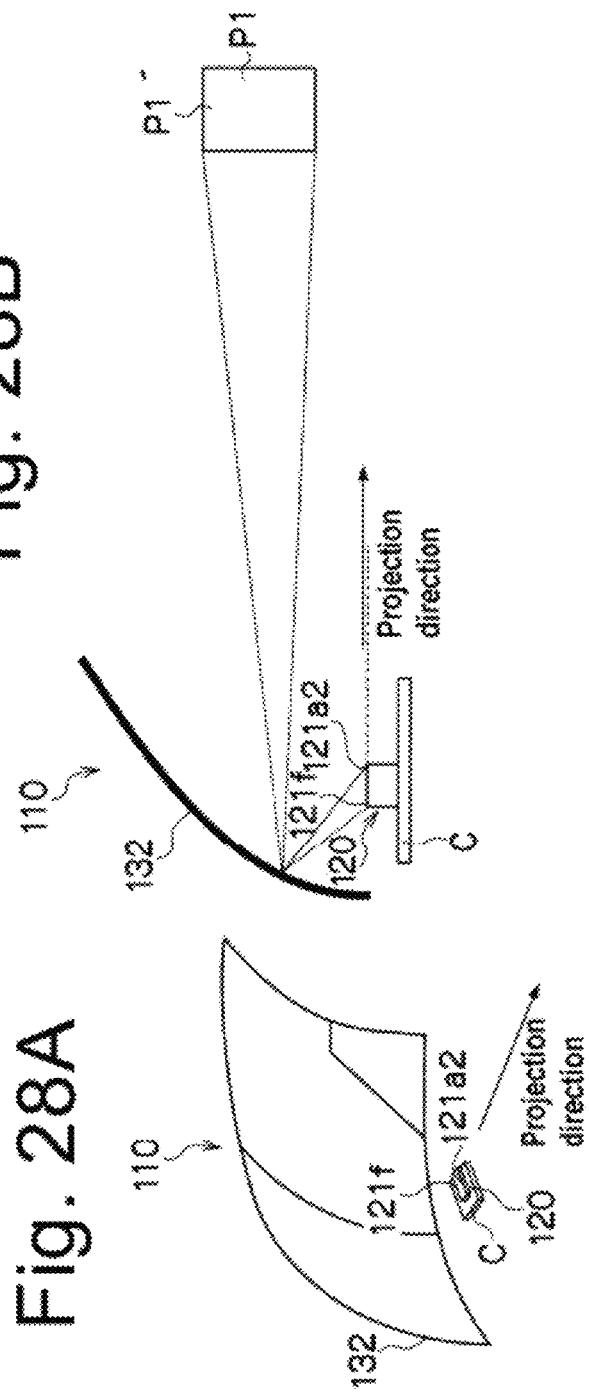

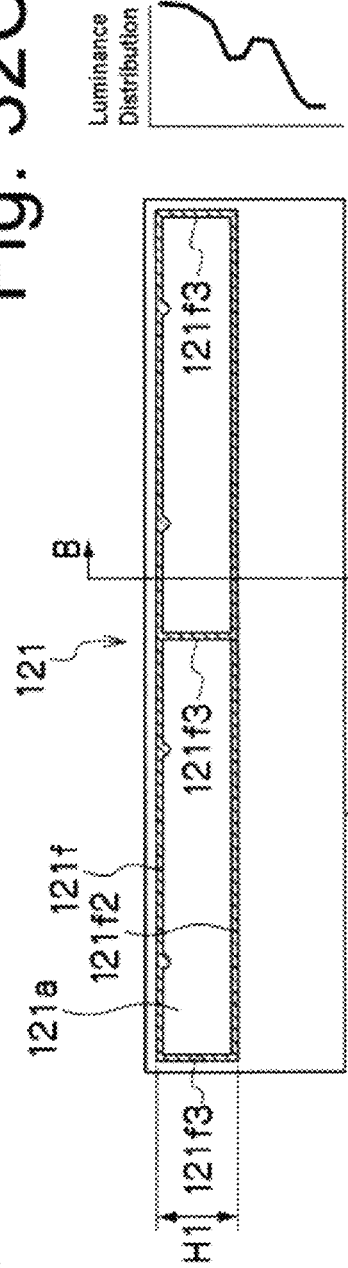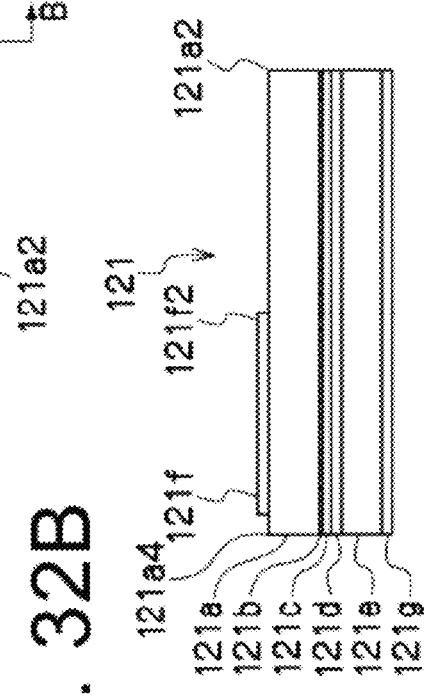

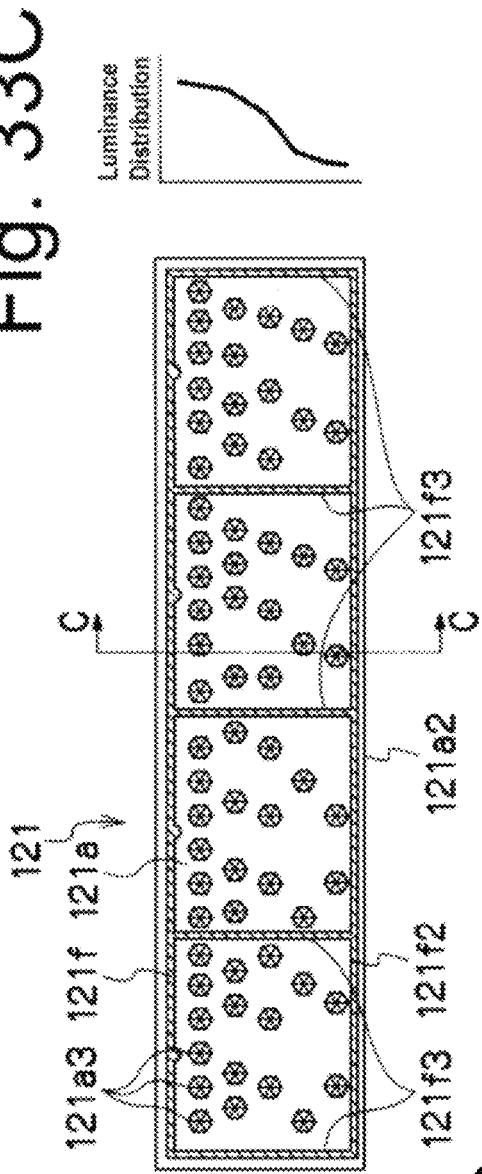
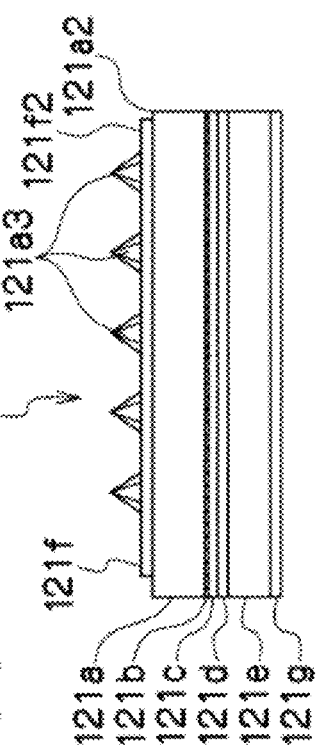

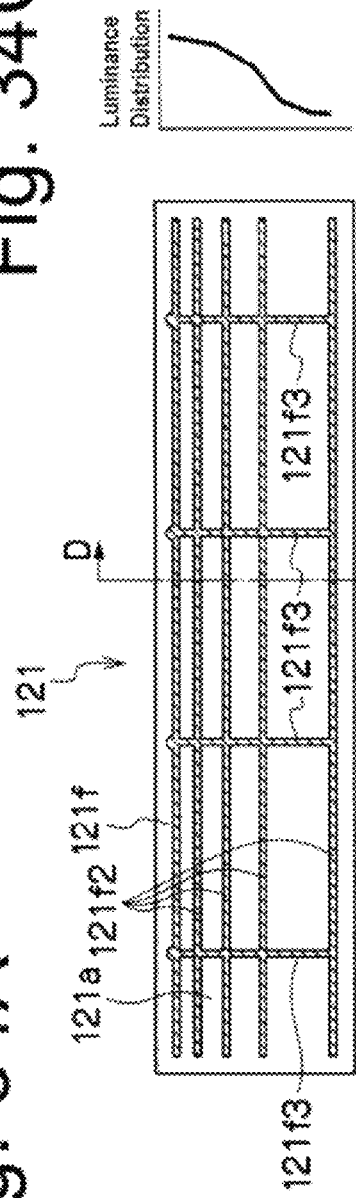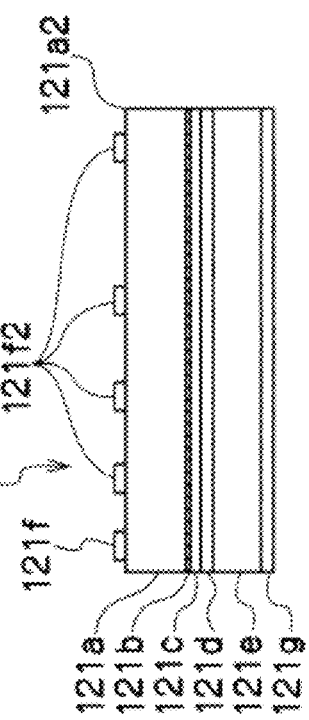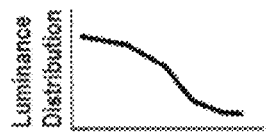

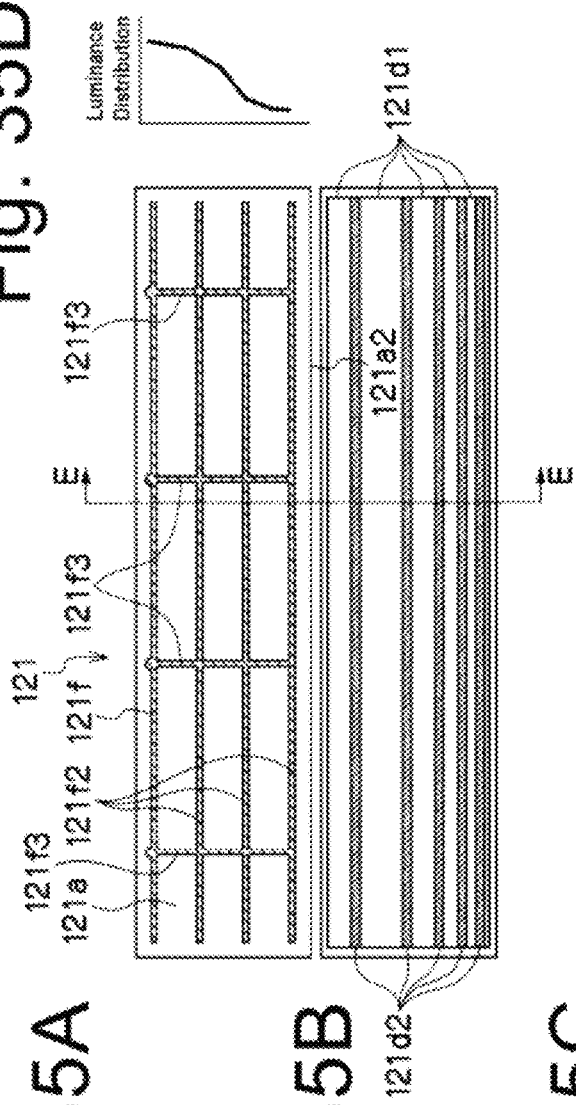

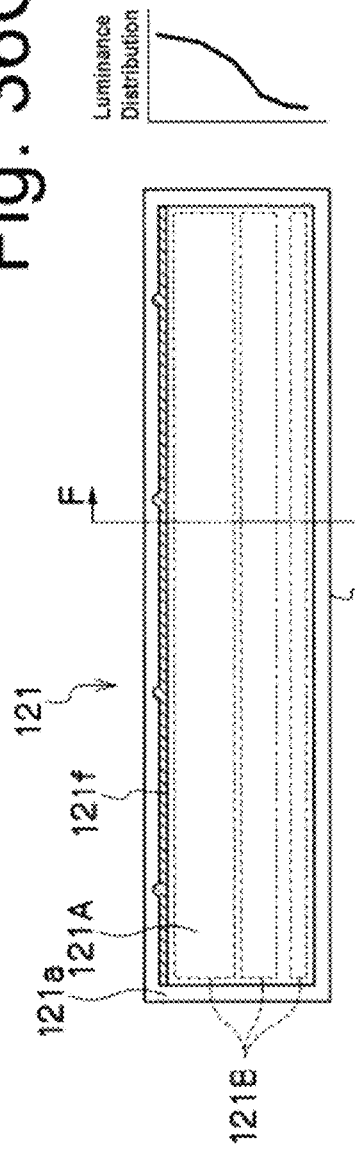
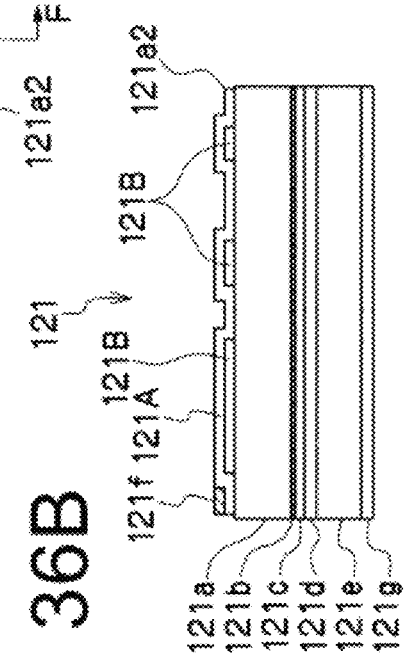
Fig. 36A
Fig. 36B
Fig. 36C

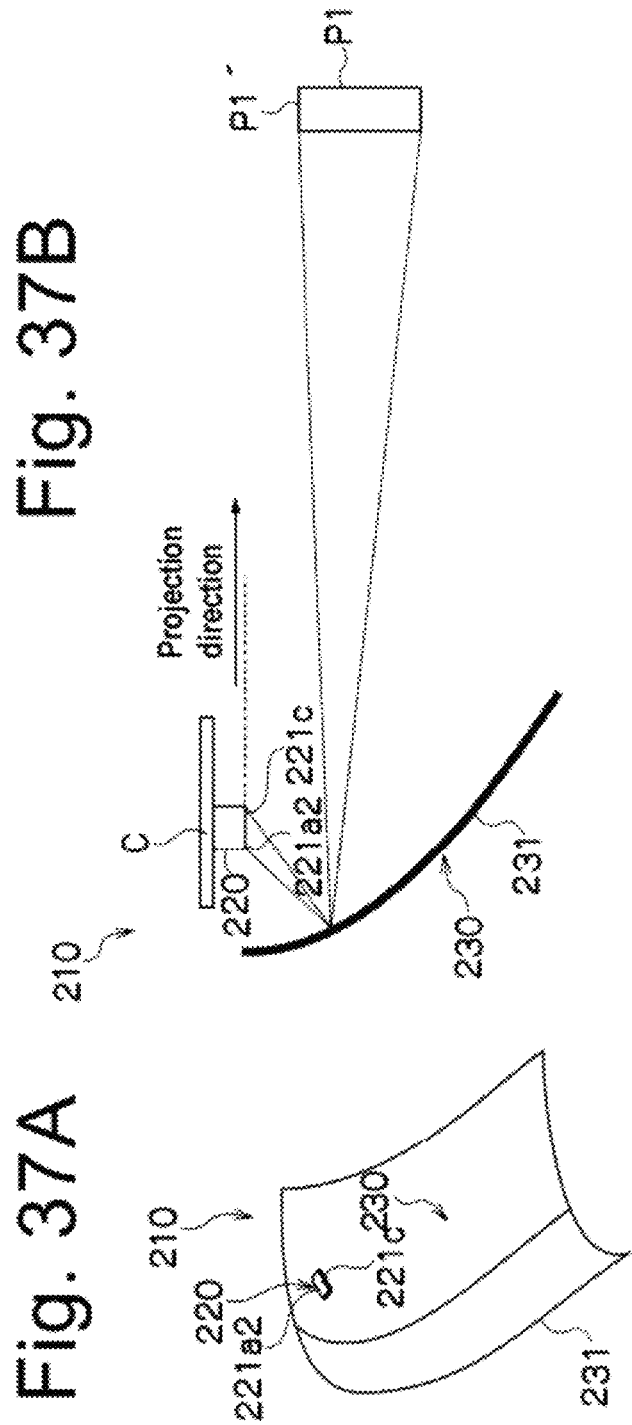

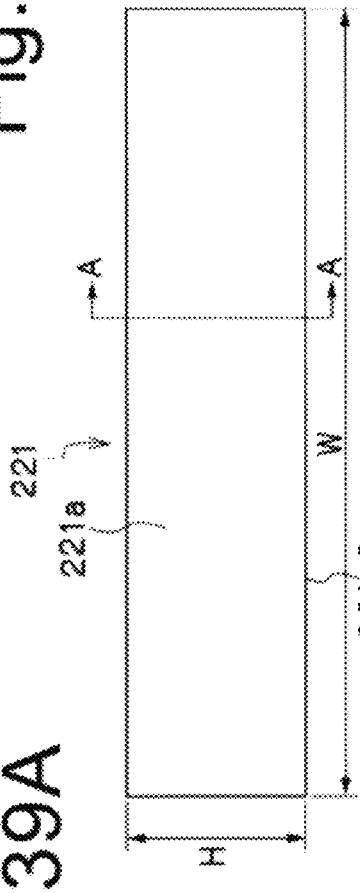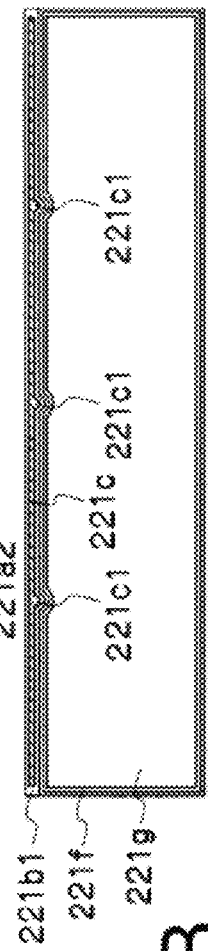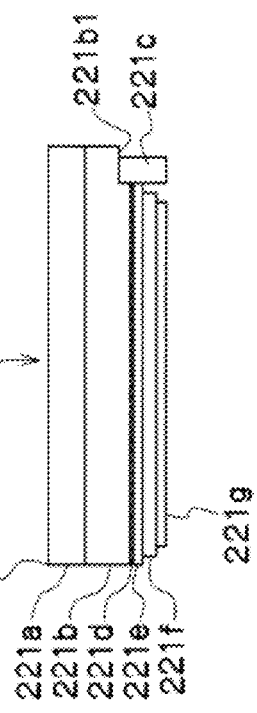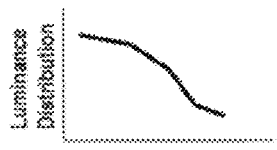

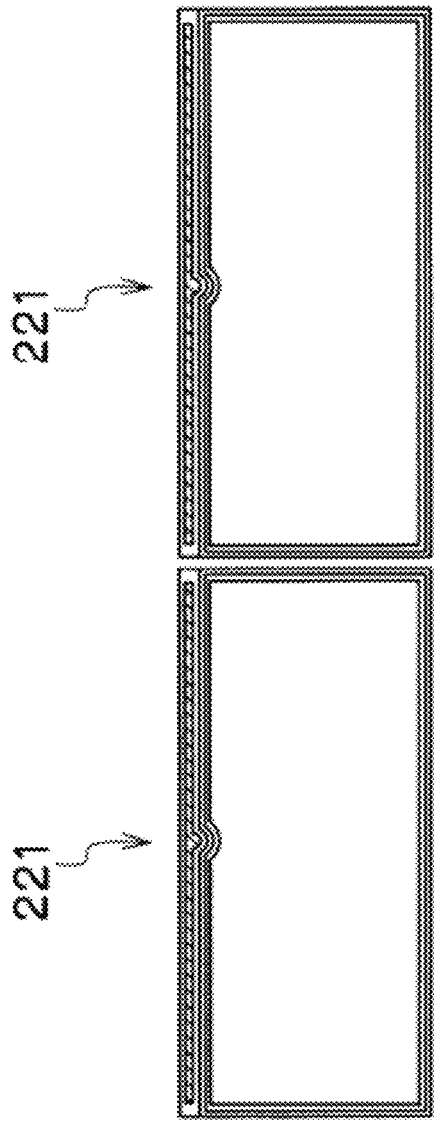

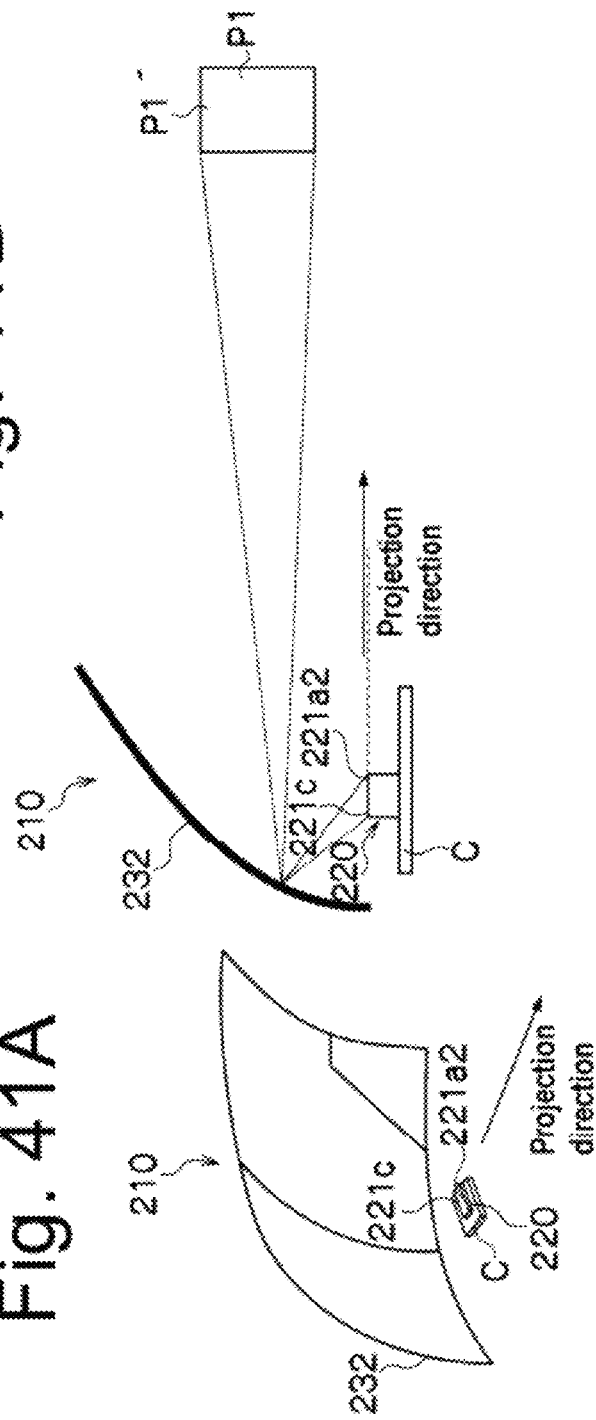

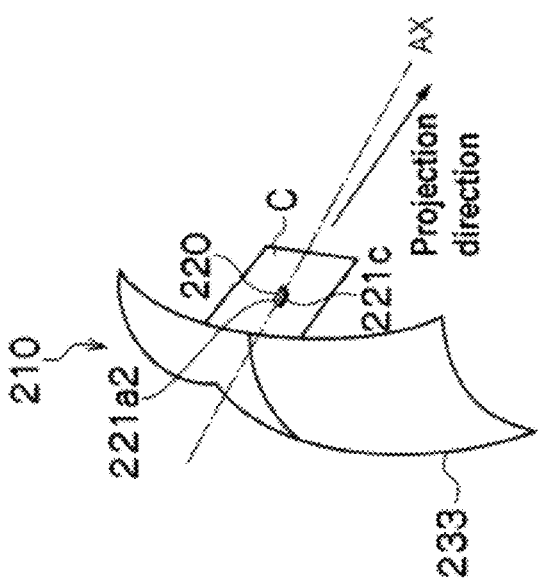

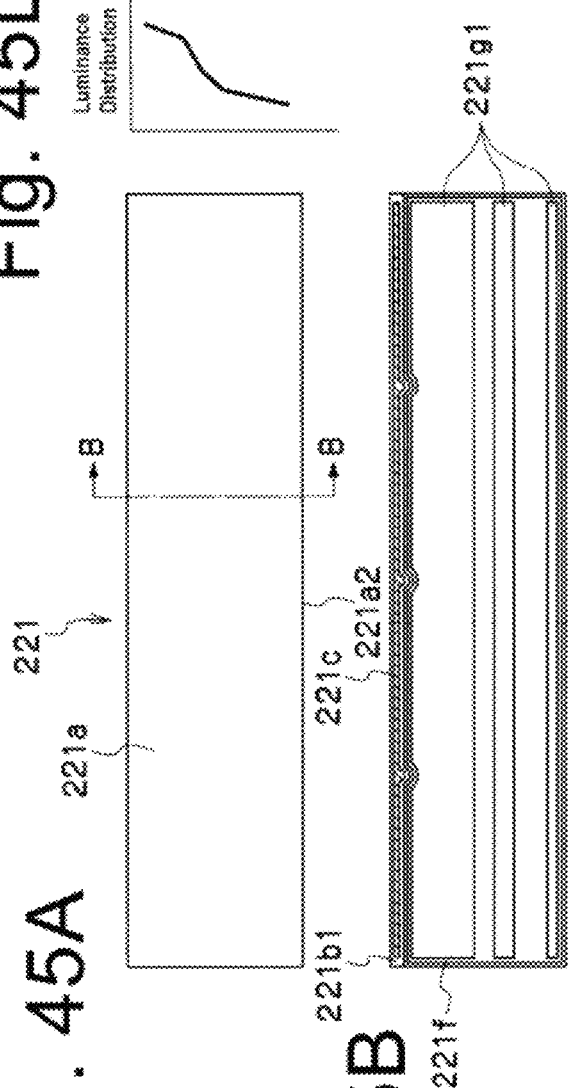

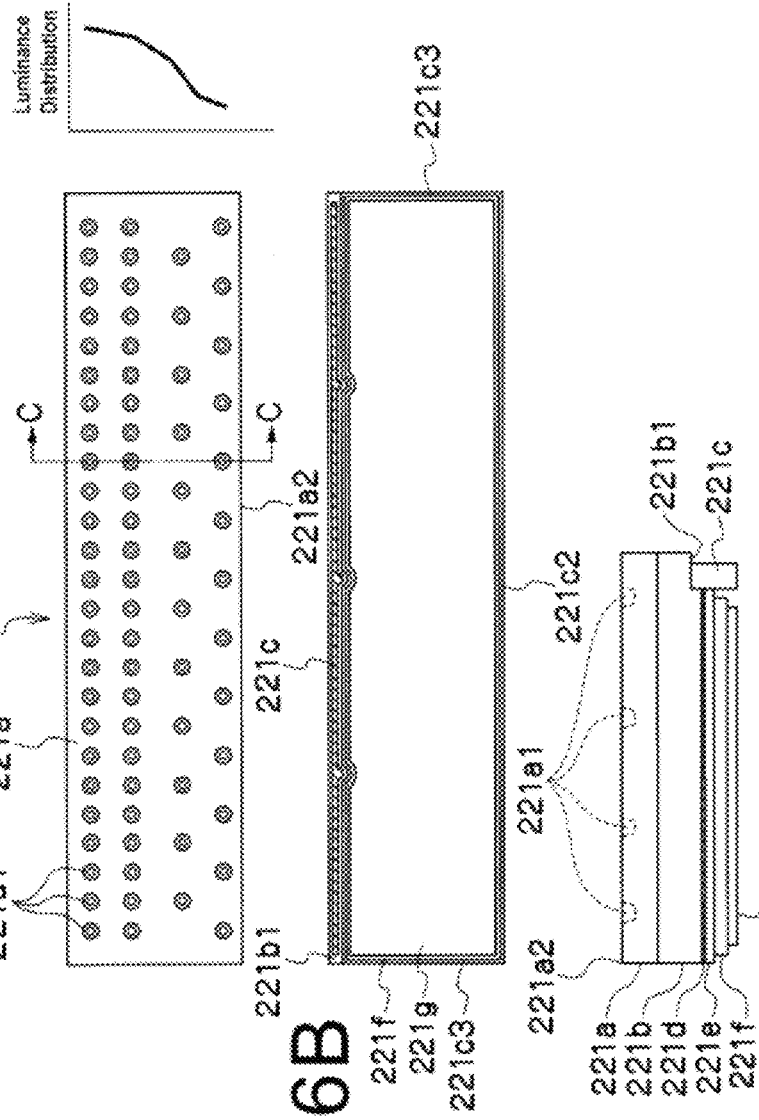

LAMP ASSEMBLY HAVING LIGHT SOURCE WITH LUMINANCE PEAK PORTION AT ONE OF THE LONG SIDES OF THE LIGHT SOURCE

This application claims the priority benefit under 35 U.S.C.§119 of Japanese Patent Applications No. 2010-187585 filed on Aug. 24, 2010, No. 2010-187586 filed on Aug. 24, 2010, No. 2010-201296 filed on Sep. 8, 2010, and No. 2010-201297 filed on Sep. 8, 2010, which are hereby incorporated in their entireties by reference.

TECHNICAL FIELD

The presently disclosed subject matter relates to a lamp assembly, and in particular, to a vehicle lamp assembly capable of forming a clear cut-off line in the light distribution pattern.

BACKGROUND ART

Recent conventional vehicle lamp assemblies can include those employing a semiconductor light emitting apparatus including an LED element and a wavelength conversion layer having a uniform thickness formed on the surface of the LED element (for example, see Japanese Patent Application Laid-Open Nos. 2005-322923 and 2008-507850). FIGS. 1 and 2 show examples of this type of semiconductor light emitting apparatus including an LED element Cp and a wavelength conversion layer Ly uniformly formed on the surface of the LED element Cp. The semiconductor light emitting apparatus described in Japanese Patent Application Laid-Open No. 2005-322923 can include a wavelength conversion layer with a uniform thickness. This apparatus can provide a luminance distribution in which the maximum peak appears at and near the center of the chip (around its optical axis) and the luminance is gradually lowered toward the peripheral area (see FIG. 3). This is a similar phenomenon to the Lambertian distribution for surface light emission, and can be explained as a phenomenon in accordance with the COS function wherein, if in-plane luminance distribution is uniform, the center area shows the maximum value.

In the technical field of, in particular, vehicle headlamps, the maximum value in the luminance distribution of a vehicle headlamp is typically arranged at or near the cutoff line in order to form a clear cutoff line. A shade or the like type of shielding member is typically utilized to cut the half of the luminance distribution as shown in FIG. 4. When the configuration including such a shade is employed, almost half the light at the maximum value in the luminance distribution cannot be utilized, thereby reducing the light utilization efficiency.

SUMMARY

The presently disclosed subject matter was devised in view of these and other problems and in association with the conventional art. According to an aspect of the presently disclosed subject matter, a lamp assembly is provided, that utilizes a light source including an LED element without cutting part of the light emitted from the LED element and which light source is capable of forming a luminance distribution where the light with a maximum value can be arranged at or near the cutoff line, thereby improving its light utilization efficiency.

According to another aspect of the presently disclosed subject matter, a lamp assembly with an illumination direction can include a light source including an LED element with an emission surface, and a projection optical system for projecting an image of the light source in the illumination direction so that a desired light distribution pattern can be formed on a virtual vertical screen assumed to be disposed in front of the lamp assembly. The light source can have a rectangular shape having long sides and short sides, and can be configured to provide a luminance distribution on the emission surface such that a luminance peak portion is provided at or near one of the long sides. The lamp assembly can be configured to project an image corresponding to the luminance peak portion toward a predetermined area in the desired light distribution pattern.

In the lamp assembly with the above configuration, the light source can further include a wavelength conversion layer disposed so as to cover the emission surface, so that the light source can emit light with a desired color by additive color mixture of part of the light emitted from the LED element which passes through the wavelength conversion layer and the light emitted from the wavelength conversion layer as a result of excitation of the wavelength conversion layer by the other part of the light from the LED element.

According to one exemplary embodiment, the LED element in the above basic configuration can have a first long side and a second long side. The LED element can include a rectangular substrate, an n-type semiconductor layer deposited on one surface of the substrate, an n electrode formed on a narrow region including the first long side of the surface of the n-type semiconductor layer and extending in a direction parallel to the long side, an active layer deposited on the n-type semiconductor layer, a p-type semiconductor layer deposited on the active layer, a transparent electrode formed on the p-type semiconductor layer, and a p electrode formed on a narrow region including the second long side of the surface of the transparent electrode and extending in the direction parallel to the long side, so that the LED element can be configured as a face-up type LED element. (First aspect)

The LED element with the above specific electrode configuration can provide a luminance distribution having a luminance peak at the p electrode side as seen in a cross section in a direction parallel to the short side (namely, the luminance distribution abruptly increases near the p-electrode side), with gradually decreased luminance from the side of the p electrode to the n electrode while having a constant luminance distribution as seen in a cross section in a direction parallel to the long side so that the luminance distribution is suitable for forming a light distribution pattern for a headlamp.

Furthermore, the projection optical system can form and project a plurality of light source images each including the image corresponding to the p electrode side, or the luminance peak portion so that the plurality of images corresponding to the luminance peak portion are densely arranged in a horizontal direction and in an oblique direction (for example, by an angle of 15 degrees with respect to the horizontal direction) in the light distribution pattern. This configuration can form the desired light distribution pattern, in particular, suitable for a low-beam, which can include a cut-off line (including a horizontal cut-off line and an oblique cut-off line) with the maximum luminance distribution and have a gradation where the luminance distribution gradually decreases from the cut-off line to the lower side. The lamp assembly with this configuration can provide an improved far-distance visibility.

As described above, the LED element can have a luminance distribution with the luminance peak at the p electrode side (namely, the luminance distribution abruptly increases near the p-electrode side). In the lamp assembly utilizing the conventional LED element as described above, part of light is cut for forming a desired light distribution pattern (see FIG. 4). However, the lamp assembly with the above configuration need not cut part of light from the LED element, but can utilize the light emission state as is of the LED element with the above luminance distribution so as to form the light distribution pattern for a low beam. Accordingly, the projection optical system can have a reflection surface that is designed such that part of light from the LED element is not cut and the plurality of images corresponding to the luminance peak portion (the p electrode side) are densely arranged in a horizontal direction and in an oblique direction (for example, by an angle of 15 degrees with respect to the horizontal direction) in the light distribution pattern. Furthermore, the luminance gradation part can be matched to the desired light distribution pattern. This configuration can improve the light utilization efficiency.

The thickness of the transparent electrode, the areas of the respective electrodes, the distance between the p electrode and the n electrode, and the like can be adjusted so that the luminance distribution (luminance peak position, luminance peak width, and the like) in the cross section in the short side direction of the LED element (light source) can be controlled to provide the desired luminance distribution.

In the first aspect with the above configuration, the transparent electrode can be formed on the approximately entire surface of the p-type semiconductor layer from the first long side to the second long side. The projection optical system can project an image of the light source in the front direction (in the illumination direction of the lamp assembly) as a plurality of light source images so that the image of the luminance peak portion corresponding to the p electrode is positioned on one side (an upper side) of the light distribution pattern, thereby forming the light distribution pattern for a headlamp including a cut-off line formed of the images of the luminance peak portions of the plurality of the light source images on a virtual vertical screen located a certain distance away from the lamp assembly in the illumination direction at a certain distance.

The LED element with the above specific electrode configuration can constitute the light source with the luminance distribution suitable for forming a light distribution pattern for a headlamp as in the previous configuration. This configuration can form the desired light distribution pattern, in particular, suitable for a low-beam, which can include a cut-off line (including a horizontal cut-off line and an oblique cut-off line) with the maximum luminance distribution and have a gradation where the luminance distribution gradually decreases from the cut-off line to the lower side. The lamp assembly with this configuration can provide an improved far-distance visibility and improve the light utilization efficiency. The dimension of the electrode can be adjusted so that the luminance distribution (luminance peak position, luminance peak width, and the like) can be controlled to provide the desired luminance distribution.

In the first aspect with the above configuration, the transparent electrode can be formed on a region of the surface of the p-type semiconductor layer from the second long side to an intermediate line in the midpoint between the first long side and the second long side and extending in the direction parallel to the long side. The projection optical system can project an image of the light source in the illumination direction as a plurality of light source images so that the image of the luminance peak portion corresponding to the p electrode is positioned on one side (an upper side) of the light distribution pattern, thereby forming the light distribution pattern for a headlamp including a cut-off line formed of the images of the luminance peak portions of the plurality of the light source images on the virtual vertical screen.

The LED element with the above specific electrode configuration can constitute the light source with the luminance distribution suitable for forming a light distribution pattern for a headlamp as in the previous configuration. This configuration can form the desired light distribution pattern, in particular, suitable for a low-beam, which can include a cut-off line (including a horizontal cut-off line and an oblique cut-off line) with the maximum luminance distribution and have a gradation where the luminance distribution gradually decreases from the cut-off line to the lower side. The lamp assembly with this configuration can provide an improved far-distance visibility and improve the light utilization efficiency. The dimension of the electrode can be adjusted so that the luminance distribution (luminance peak position, luminance peak width, and the like) can be controlled to provide the desired luminance distribution.

According to another exemplary embodiment, the LED element in the above basic configuration can have a first long side and a second long side. The LED element can include a rectangular substrate, an n-type semiconductor layer deposited on one surface of the substrate, an n electrode formed on a narrow region including the first long side of a surface of the n-type semiconductor layer and extending in a direction parallel to the long side, an active layer deposited on the n-type semiconductor layer, a p-type semiconductor layer deposited on the active layer, a transparent electrode formed on the approximately entire surface of the p-type semiconductor layer from the first long side to the second long side, and a p electrode formed in the midpoint between the first long side and the second long side on the transparent electrode and extending in the direction parallel to the long side, so that the LED element can be configured as a face-up type LED element. The projection optical system can project an image of the light source in the illumination direction as a plurality of light source images so that the image of the luminance peak portion corresponding to the n electrode is positioned on one side (an upper side) of the light distribution pattern, thereby forming the light distribution pattern for a headlamp including a cut-off line formed of the images of the luminance peak portions of the plurality of the light source images on the virtual vertical screen. (Second aspect)

The LED element with the above specific electrode configuration can constitute the light source with the luminance distribution suitable for forming a light distribution pattern for a headlamp as in the previous configuration. This configuration can form the desired light distribution pattern, in particular, suitable for a low-beam, which can include a cut-off line (including a horizontal cut-off line and an oblique cut-off line) with the maximum luminance distribution and have a gradation where the luminance distribution gradually decreases from the cut-off line to the lower side. The lamp assembly with this configuration can provide an improved far-distance visibility and improve the light utilization efficiency. The dimension of the electrode can be adjusted so that the luminance distribution (luminance peak position, luminance peak width, and the like) can be controlled to provide the desired luminance distribution.

In the first aspect with the above configuration, the LED element can further include a plurality of additional p electrodes connected to the p electrode and extending from the p electrode toward the n electrode and a plurality of additional n electrodes connected to the n electrode and extending from the n electrode toward the p electrode. The projection optical system can project an image of the light source in the illumination direction as a plurality of light source images so that the image of the luminance peak portion corresponding to an area between tip ends of the plurality of additional p electrodes and of the plurality of additional n electrodes is positioned on one side of the light distribution pattern, thereby forming the light distribution pattern for a headlamp including a cut-off line formed of the images of the luminance peak portions of the plurality of the light source images on the virtual vertical screen.

The LED element with the above specific electrode configuration can constitute the light source with the luminance distribution suitable for forming a light distribution pattern for a headlamp as in the previous configuration. This configuration can form the desired light distribution pattern, in particular, suitable for a low-beam, which can include a cut-off line (including a horizontal cut-off line and an oblique cut-off line) with the maximum luminance distribution and have a gradation where the luminance distribution gradually decreases from the cut-off line to the lower side. The lamp assembly with this configuration can provide an improved far-distance visibility and improve the light utilization efficiency. The dimensions of the additional n electrodes and the additional p electrodes of the respective electrodes can be adjusted so that the luminance distribution (luminance peak position, luminance peak width, and the like) can be controlled to provide the desired luminance distribution.

According to still another exemplary embodiment, the LED element in the above basic configuration can have a first long side and a second long side. The LED element can include a rectangular substrate, an n-type semiconductor layer deposited on one surface of the substrate, an n electrode formed on a narrow region including the first long side of a surface of the n-type semiconductor layer and extending in a direction parallel to the long side, a plurality of active layers deposited on the n-type semiconductor layer and separated by at least one groove portion that extends in the direction parallel to the long side and reaches the n-type semiconductor layer, p-type semiconductor layers deposited on the respective active layers, transparent electrodes formed on the respective p-type semiconductor layers, and p electrodes formed on respective narrow regions including respective long sides closer to the second long side on the respective transparent electrodes and extending in the direction parallel to the long side, so that the LED element can be configured as a face-up type LED element. The projection optical system can project an image of the light source in the illumination direction as a plurality of light source images so that the image of the luminance peak portion corresponding to one of the p electrodes positioned closer to the second long side than the other p electrode is positioned on one side (an upper side) of the light distribution pattern, thereby forming the light distribution pattern for a headlamp including a cut-off line formed of the images of the luminance peak portions of the plurality of the light source images on the virtual vertical screen. (Third aspect)

The LED element with the above specific electrode configuration can constitute the light source with the luminance distribution suitable for forming a light distribution pattern for a headlamp as in the previous configuration. This configuration can form the desired light distribution pattern, in particular, suitable for a low-beam, which can include a cut-off line (including a horizontal cut-off line and an oblique cut-off line) with the maximum luminance distribution and have a gradation where the luminance distribution gradually decreases from the cut-off line to the lower side. The lamp assembly with this configuration can provide an improved far-distance visibility and improve the light utilization efficiency. The dimension of the electrode can be adjusted so that the luminance distribution (luminance peak position, luminance peak width, and the like) can be controlled to provide the desired luminance distribution.

According to still another exemplary embodiment, the LED element in the above basic configuration can have a first long side and a second long side. The LED element can include a rectangular substrate, a plurality of n-type semiconductor layers deposited on one surface of the substrate and separated by at least one groove portion that extends in a direction parallel to the long side and reaches the substrate, n electrodes formed on respective narrow regions including respective long sides of the n-type semiconductor layers closer to the first long side and extending in the direction parallel to the long side, active layers deposited on the respective n-type semiconductor layers, p-type semiconductor layers deposited on the respective active layers, transparent electrodes formed on the respective p-type semiconductor layers, and p electrodes formed on respective narrow regions including respective long sides closer to the second long side on the respective transparent electrodes and extending in the direction parallel to the long side, so that the LED element can be configured as a face-up type LED element. The projection optical system can project an image of the light source in the front direction as a plurality of light source images so that the image of the luminance peak portion corresponding to one of the p electrodes positioned closer to the second long side than the other p electrode is positioned on one side (an upper side) of the light distribution pattern, thereby forming the light distribution pattern for a headlamp including a cut-off line formed of the images of the luminance peak portions of the plurality of the light source images on the virtual vertical screen. (Fourth aspect)

The LED element with the above specific electrode configuration can constitute the light source with the luminance distribution suitable for forming a light distribution pattern for a headlamp as in the previous configuration. This configuration can form the desired light distribution pattern, in particular, suitable for a low-beam, which can include a cut-off line (including a horizontal cut-off line and an oblique cut-off line) with the maximum luminance distribution and have a gradation where the luminance distribution gradually decreases from the cut-off line to the lower side. The lamp assembly with this configuration can provide an improved far-distance visibility and improve the light utilization efficiency. The dimension of the electrode can be adjusted so that the luminance distribution (luminance peak position, luminance peak width, and the like) can be controlled to provide the desired luminance distribution.

In the above third aspect, a second-long-side element portion can be configured to include a second-long-side one of the separated active layers, the second-long-side p-type semiconductor layer deposited on the second-long-side active layer, the second-long-side transparent electrode formed on the second-long-side p-type semiconductor layer, and the second-long-side p electrode formed on the narrow region including the long side closer to the second long side of the second-long-side transparent electrode and extending in the direction parallel to the long side. Furthermore, a first-long-side element portion can be configured to include a first-long-side one of the separated active layer, the first-long-side p-type semiconductor layer deposited on the first-long-side active layer, the first-long-side transparent electrode formed on the first-long-side p-type semiconductor layer, and the first-long-side p electrode formed on the narrow region including the long side closer to the second long side of the first-long-side transparent electrode and extending in the direction parallel to the long side. The lamp assembly can include a power supply circuit for supplying the second-long-side element portion and the first-long-side electrode portion with a current so that the second-long-side element portion is supplied with a current with a larger current density than the first-long-side element portion.

The LED element with the above specific current supply control can constitute the light source with the luminance distribution suitable for forming a light distribution pattern for a headlamp as in the previous configuration. This configuration can form the desired light distribution pattern, in particular, suitable for a low-beam, which can include a cut-off line (including a horizontal cut-off line and an oblique cut-off line) with the maximum luminance distribution and have a gradation where the luminance distribution gradually decreases from the cut-off line to the lower side. The lamp assembly with this configuration can provide an improved far-distance visibility and improve the light utilization efficiency. The supplied current density can be adjusted so that the luminance distribution (luminance peak position, luminance peak width, and the like) can be controlled to provide the desired luminance distribution.

In the above fourth aspect, a second-long-side element portion can be configured to include a second-long-side one of the separated n-type semiconductor layers, the second-long-side n electrode formed on the narrow region including the long side closer to the first long side of the second-long-side n-type semiconductor layer and extending in the direction parallel to the long side, the second-long-side active layer deposited on the second-long-side n-type semiconductor layer, the second-long-side p-type semiconductor layer deposited on the second-long-side active layer, the second-long-side transparent electrode formed on the second-long-side p-type semiconductor layer, and the second-long-side p electrode formed on the narrow region including the long side closer to the second long side of the second-long-side transparent electrode and extending in the direction parallel to the long side. Furthermore, a first-long-side element portion can be configured to include a first-long-side one of the separated n-type semiconductor layers, the first-long-side n electrode formed on the narrow region including the long side closer to the first long side of the first-long-side n-type semiconductor layer and extending in the direction parallel to the long side, the first-long-side active layer deposited on the first-long-side n-type semiconductor layer, the first-long-side p-type semiconductor layer deposited on the first-long-side active layer, the first-long-side transparent electrode formed on the first-long-side p-type semiconductor layer, and the first-long-side p electrode formed on the narrow region including the long side closer to the second long side of the first-long-side transparent electrode and extending in the direction parallel to the long side. The lamp assembly can include a power supply circuit for supplying the second-long-side element portion and the first-long-side electrode portion with a current so that the second-long-side element portion is supplied with a current with a larger current density than the first-long-side element portion.

The LED element with the above specific current supply control can constitute the light source with the luminance distribution suitable for forming a light distribution pattern for a headlamp as in the previous configuration. This configuration can form the desired light distribution pattern, in particular, suitable for a low-beam, which can include a cut-off line (including a horizontal cut-off line and an oblique cut-off line) with the maximum luminance distribution and have a gradation where the luminance distribution gradually decreases from the cut-off line to the lower side. The lamp assembly with this configuration can provide an improved far-distance visibility and improve the light utilization efficiency. The supplied current density can be adjusted so that the luminance distribution (luminance peak position, luminance peak width, and the like) can be controlled to provide the desired luminance distribution.

According to still another exemplary embodiment, the LED element in the above basic configuration can have a first long side and a second long side. The LED element can include a rectangular substrate, a rear surface electrode formed on one surface of the substrate, a p electrode formed on a surface opposite to the one surface of the substrate, the p electrode serving as a reflection electrode, a p-type semiconductor layer deposited on the p electrode, an active layer formed on the p-type semiconductor layer, an n-type semiconductor layer formed on the active layer, and an n electrode formed on a narrow region including the first long side of a surface of the n-type semiconductor layer and extending in a direction parallel to the long side. The LED element can be of a vertical type. The projection optical system can project an image of the light source in the illumination direction as a plurality of light source images so that the image of the luminance peak portion corresponding to the n electrode is positioned on one side (an upper side) of the light distribution pattern, thereby forming the light distribution pattern for a headlamp including a cut-off line formed of the images of the luminance peak portions of the plurality of the light source images on the virtual vertical screen. (Fifth aspect)

The LED element with the above specific electrode configuration can constitute the light source with the luminance distribution suitable for forming a light distribution pattern for a headlamp as in the previous configuration. This configuration can form the desired light distribution pattern, in particular, suitable for a low-beam, which can include a cut-off line (including a horizontal cut-off line and an oblique cut-off line) with the maximum luminance distribution and have a gradation where the luminance distribution gradually decreases from the cut-off line to the lower side. The lamp assembly with this configuration can provide an improved far-distance visibility and improve the light utilization efficiency. The dimension of the electrode can be adjusted so that the luminance distribution (luminance peak position, luminance peak width, and the like) can be controlled to provide the desired luminance distribution.

In the fifth aspect with the above configuration, the LED element can further include an additional n electrode connected to the n electrode, extending in the direction parallel to the long side and formed in a midway position between the first long side and the second long side on the surface of the n-type semiconductor layer.

The LED element with the above specific electrode configuration can constitute the light source with the luminance distribution suitable for forming a light distribution pattern for a headlamp as in the previous configuration. This configuration can form the desired light distribution pattern, in particular, suitable for a low-beam, which can include a cut-off line (including a horizontal cut-off line and an oblique cut-off line) with the maximum luminance distribution and have a gradation where the luminance distribution gradually decreases from the cut-off line to the lower side. The lamp assembly with this configuration can provide an improved far-distance visibility and improve the light utilization efficiency. The dimension and number of the additional electrode and the arrangement thereof can be adjusted so that the luminance distribution (luminance peak position, luminance peak width, and the like) can be controlled to provide the desired luminance distribution.

In the fifth aspect with the above configuration, a plurality of concave and/or convex structural units are formed on the surface of the n-type semiconductor layer so that a density of the structural units is increased from the second long side toward the n electrode.

The LED element with the above specific structural units can constitute the light source with the luminance distribution suitable for forming a light distribution pattern for a headlamp as in the previous configuration. This configuration can form the desired light distribution pattern, in particular, suitable for a low-beam, which can include a cut-off line (including a horizontal cut-off line and an oblique cut-off line) with the maximum luminance distribution and have a gradation where the luminance distribution gradually decreases from the cut-off line to the lower side. The lamp assembly with this configuration can provide an improved far-distance visibility and improve the light utilization efficiency. The dimension, number and density of the structural units and the arrangement thereof can be adjusted so that the luminance distribution (luminance peak position, luminance peak width, and the like) can be controlled to provide the desired luminance distribution.

In the fifth aspect with the above configuration, the LED element can further include a plurality of additional n electrodes each connected to the n electrode and extending in the direction parallel to the long side and formed so that a distance between adjacent additional n electrodes is decreased from the second long side toward the n electrode (i.e., density).

The LED element with the above specific electrode configuration can constitute the light source with the luminance distribution suitable for forming a light distribution pattern for a headlamp as in the previous configuration. This configuration can form the desired light distribution pattern, in particular, suitable for a low-beam, which can include a cut-off line (including a horizontal cut-off line and an oblique cut-off line) with the maximum luminance distribution and have a gradation where the luminance distribution gradually decreases from the cut-off line to the lower side. The lamp assembly with this configuration can provide an improved far-distance visibility and improve the light utilization efficiency. The dimension and number of the additional n electrodes and the arrangement thereof can be adjusted so that the luminance distribution (luminance peak position, luminance peak width, and the like) can be controlled to provide the desired luminance distribution.

In the fifth aspect with the above configuration, the LED element can further include a plurality of additional n electrodes each connected to the n electrode and extending in the direction parallel to the long side, and the p electrode can include a plurality of first reflectance electrodes extending in the direction parallel to the long side and a plurality of second reflectance electrodes extending in the direction parallel to the long side, the second reflectance electrode having a reflectance lower than the first reflectance electrode, the first reflectance electrodes and the second reflectance electrodes can be formed alternately, and the plurality of second reflectance electrodes can be formed so that a distance between adjacent second reflectance electrodes is decreased from the n electrode toward the second long side (i.e., density).

The LED element with the above specific electrode configuration can constitute the light source with the luminance distribution suitable for forming a light distribution pattern for a headlamp as in the previous configuration. This configuration can form the desired light distribution pattern, in particular, suitable for a low-beam, which can include a cut-off line (including a horizontal cut-off line and an oblique cut-off line) with the maximum luminance distribution and have a gradation where the luminance distribution gradually decreases from the cut-off line to the lower side. The lamp assembly with this configuration can provide an improved far-distance visibility and improve the light utilization efficiency. The dimension and number of the additional electrodes and the first and second reflectance electrodes and the arrangement thereof can be adjusted so that the luminance distribution (luminance peak position, luminance peak width, and the like) can be controlled to provide the desired luminance distribution.

In the fifth aspect with the above configuration, the LED element can further include a plurality of first transparent conductive films formed on the surface of the n-type semiconductor layer and extending in the direction parallel to the long side and a second transparent conductive film covering the plurality of first transparent conductive films and the surface of the n-type semiconductor layer exposed between the first transparent conductive films, the second transparent conductive film having a refractive index lower than the first transparent conductive film. Portions where the first transparent conductive film and the second transparent conductive film overlap with each other can have a dimension in a direction parallel to the short side so that the dimension is increased away from the second long side toward the n electrode.

The LED element with the above specific electrode configuration can constitute the light source with the luminance distribution suitable for forming a light distribution pattern for a headlamp as in the previous configuration. This configuration can form the desired light distribution pattern, in particular, suitable for a low-beam, which can include a cut-off line (including a horizontal cut-off line and an oblique cut-off line) with the maximum luminance distribution and have a gradation where the luminance distribution gradually decreases from the cut-off line to the lower side. The lamp assembly with this configuration can provide an improved far-distance visibility and improve the light utilization efficiency. The dimension and number of the transparent conductive films can be adjusted so that the luminance distribution (luminance peak position, luminance peak width, and the like) can be controlled to provide the desired luminance distribution.

According to still another exemplary embodiment, the LED element in the above basic configuration can have a first long side and a second long side. The LED element can include a rectangular substrate, an n-type semiconductor layer formed on one surface of the substrate, an n electrode formed on a narrow region including the first long side of a surface of the n-type semiconductor layer and extending in a direction parallel to the long side, an active layer formed on the n-type semiconductor layer, a p-type semiconductor layer deposited on the active layer, a transparent electrode formed on the p-type semiconductor layer, and a p electrode formed on the transparent electrode serving as a reflection electrode. The LED element can be of a flip-chip type. The projection optical system can project an image of the light source in the illumination direction as a plurality of light source images so that the image of the luminance peak portion corresponding to the n electrode is positioned on one side (an upper side) of the light distribution pattern, thereby forming the light distribution pattern for a headlamp including a cut-off line formed of the images of the luminance peak portions of the plurality of the light source images on the virtual vertical screen. (Sixth aspect)

The LED element with the above specific electrode configuration can constitute the light source with the luminance distribution suitable for forming a light distribution pattern for a headlamp as in the previous configuration. This configuration can form the desired light distribution pattern, in particular, suitable for a low-beam, which can include a cut-off line (including a horizontal cut-off line and an oblique cut-off line) with the maximum luminance distribution and have a gradation where the luminance distribution gradually decreases from the cut-off line to the lower side. The lamp assembly with this configuration can provide an improved far-distance visibility and improve the light utilization efficiency. The dimension of the electrode can be adjusted so that the luminance distribution (luminance peak position, luminance peak width, and the like) can be controlled to provide the desired luminance distribution.

In the above sixth aspect, the p electrode can be formed on an approximately entire surface of the transparent electrode from the first long side to the second long side.

The LED element with the above specific electrode configuration can constitute the light source with the luminance distribution suitable for forming a light distribution pattern for a headlamp as in the previous configuration. This configuration can form the desired light distribution pattern, in particular, suitable for a low-beam, which can include a cut-off line (including a horizontal cut-off line and an oblique cut-off line) with the maximum luminance distribution and have a gradation where the luminance distribution gradually decreases from the cut-off line to the lower side. The lamp assembly with this configuration can provide an improved far-distance visibility and improve the light utilization efficiency. The dimension of the electrode can be adjusted so that the luminance distribution (luminance peak position, luminance peak width, and the like) can be controlled to provide the desired luminance distribution.

In the above sixth aspect, the p electrode can include a plurality of p electrodes formed on the transparent electrode and extending in the direction parallel to the long side while spaced apart from each other in a direction parallel to the short side so that the plurality of p electrodes have a dimension in the direction parallel to the short side being increased from the second side to the n electrode.

The LED element with the above specific electrode configuration can constitute the light source with the luminance distribution suitable for forming a light distribution pattern for a headlamp as in the previous configuration. This configuration can form the desired light distribution pattern, in particular, suitable for a low-beam, which can include a cut-off line (including a horizontal cut-off line and an oblique cut-off line) with the maximum luminance distribution and have a gradation where the luminance distribution gradually decreases from the cut-off line to the lower side. The lamp assembly with this configuration can provide an improved far-distance visibility and improve the light utilization efficiency. The dimension and number of the p electrodes can be adjusted so that the luminance distribution (luminance peak position, luminance peak width, and the like) can be controlled to provide the desired luminance distribution.

In the sixth aspect with the above configuration, a plurality of concave and/or convex structural units are formed on the surface of the substrate so that a density of the structural units is increased from the second long side toward the n electrode.

The LED element with the above specific structural units can constitute the light source with the luminance distribution suitable for forming a light distribution pattern for a headlamp as in the previous configuration. This configuration can form the desired light distribution pattern, in particular, suitable for a low-beam, which can include a cut-off line (including a horizontal cut-off line and an oblique cut-off line) with the maximum luminance distribution and have a gradation where the luminance distribution gradually decreases from the cut-off line to the lower side. The lamp assembly with this configuration can provide an improved far-distance visibility and improve the light utilization efficiency. The dimension, number and density of the structural units and the arrangement thereof can be adjusted so that the luminance distribution (luminance peak position, luminance peak width, and the like) can be controlled to provide the desired luminance distribution.

In the above lamp assembly with any of the above configurations, the desired color by additive color mixture is white or pseudo white, and the lamp assembly can be utilized for vehicles, such as an automobile. In particular, the lamp assembly can be utilized as a vehicle lamp assembly for a headlamp.

The lamp assembly with any of the above configuration need not cut part of light from the LED element like the conventional lamp assembly, but can utilize the luminance peak portion of the luminance distribution formed by the LED element so as to form a desired light distribution pattern, for example, for a low beam.

BRIEF DESCRIPTION OF DRAWINGS

These and other characteristics, features, and advantages of the presently disclosed subject matter will become clear from the following description with reference to the accompanying drawings, wherein:

FIG. 4 includes luminance distribution diagrams of the LED element with the conventional electrode structure, illustrating the state in which part of light emitted from the LED element is cut;

FIGS. 5A and 5B are a view illustrating an outer appearance of a vehicle lamp assembly made in accordance with principles of the presently disclosed subject matter and a vertical cross sectional view of the vehicle lamp assembly, respectively;

FIG. 11 is a diagram showing a light distribution pattern for a headlamp, including a plurality of light source images arranged horizontally and obliquely;

FIGS. 12A and 12B are a view illustrating an outer appearance of a vehicle lamp assembly configured as Modified Example 1-1 and a vertical cross sectional view of the same, respectively;

FIGS. 17A, 17B, and 17C are a front view (top plan view) of an LED element as Modified Example 2-2, a cross sectional view (side view) of the LED element, and a luminance distribution diagram of the LED element (light emission surface) when viewed along line C-C of FIG. 17A, respectively;

FIGS. 18A, 18B, and 18C are a front view (top plan view) of an LED element as Modified Example 2-3, a cross sectional view (side view) of the LED element, and a luminance distribution diagram of the LED element (light emission surface) when viewed along line D-D of FIG. 18A, respectively;

FIGS. 19A, 19B, and 19C are a front view (top plan view) of an LED element as Modified Example 2-4, a cross sectional view (side view) of the LED element, and a luminance distribution diagram of the LED element (light emission surface) when viewed along line E-E of FIG. 19A, respectively;

FIGS. 22A, 22B, and 22C are a front view (top plan view) of an LED element as Modified Example 2-5, a cross sectional view (side view) of the LED element, and a luminance distribution diagram of the LED element (light emission surface) when viewed along line F-F of FIG. 22A, respectively;

FIGS. 26A, 26B, and 26C are a front view (top plan view) of an LED element, a cross sectional view (side view) of the LED element, and a luminance distribution diagram of the LED element (light emission surface) when viewed along line A-A of FIG. 26A, respectively;

FIG. 27 is a front view (top plan view) of the LED element according to a modified example;

FIGS. 28A and 28B are a view illustrating an outer appearance of a vehicle lamp assembly configured as Modified Example 3-1 and a vertical cross sectional view of the same, respectively;

FIGS. 32A, 32B, and 32C are a front view (top plan view) of an LED element as Modified Example 4-1, a cross sectional view (side view) of the LED element, and a luminance distribution diagram of the LED element (light emission surface) when viewed along line B-B of FIG. 32A, respectively;

FIGS. 33A, 33B, and 33C are a front view (top plan view) of an LED element as Modified Example 4-2, a cross sectional view (side view) of the LED element, and a luminance distribution diagram of the LED element (light emission surface) when viewed along line C-C of FIG. 33A, respectively;

FIGS. 34A, 34B, and 34C are a front view (top plan view) of an LED element as Modified Example 4-3, a cross sectional view (side view) of the LED element, and a luminance distribution diagram of the LED element (light emission surface) when viewed along line D-D of FIG. 34A, respectively;

FIGS. 35A, 35B, and 35C are a front view (top plan view) of an LED element as Modified Example 4-4, a cross sectional view (side view) of the LED element, and a luminance distribution diagram of the LED element (light emission surface) when viewed along line E-E of FIG. 35A, respectively, and FIG. 35D depicts a luminance distribution;

FIGS. 36A, 36B, and 36C are a front view (top plan view) of an LED element as Modified Example 4-5, a cross sectional view (side view) of the LED element, and a luminance distribution diagram of the LED element (light emission surface) when viewed along line F-F of FIG. 36A, respectively;

FIGS. 37A and 37B are a view illustrating an outer appearance of a vehicle lamp assembly made in accordance with principles of the presently disclosed subject matter and a vertical cross sectional view of the vehicle lamp assembly, respectively;

FIGS. 39A, 39B, and 39C are a front view (top plan view) of an LED element, a cross sectional view (side view) of the LED element, and a luminance distribution diagram of the LED element (light emission surface) when viewed along line A-A of FIG. 39A, respectively, and FIG. 39D depicts a luminance distribution;

FIG. 40 is a front view (top plan view) of the LED element according to a modified example;

FIGS. 41A and 41B are a view illustrating an outer appearance of a vehicle lamp assembly configured as Modified Example 5-1 and a vertical cross sectional view of the same, respectively;

FIGS. 42A and 42B are a view illustrating an outer appearance of a vehicle lamp assembly configured as Modified Example 5-2 and a vertical cross sectional view of the same, respectively;

FIGS. 45A, 45B, and 45C are a front view (top plan view) of an LED element as Modified Example 6-1, a cross sectional view (side view) of the LED element, and a luminance distribution diagram of the LED element (light emission surface) when viewed along line B-B of FIG. 45A, respectively, and FIG. 45D depicts a luminance distribution; and FIGS. 46A, 46B, and 46C are a front view (top plan view) of an LED element as Modified Example 6-2, a cross sectional view (side view) of the LED element, and a luminance distribution diagram of the LED element (light emission surface) when viewed along line C-C of FIG. 46A, respectively, and FIG. 46D depicts a luminance distribution.

DESCRIPTION OF EXEMPLARY EMBODIMENTS

A description will now be made below to vehicle lamp assemblies of the presently disclosed subject matter with reference to the accompanying drawings in accordance with exemplary embodiments.

A vehicle lamp assembly 10 made in accordance with the principles of the presently disclosed subject matter can be suitable for a headlamp to be arranged on either side of the front portion of a vehicle body.

Figure 6:
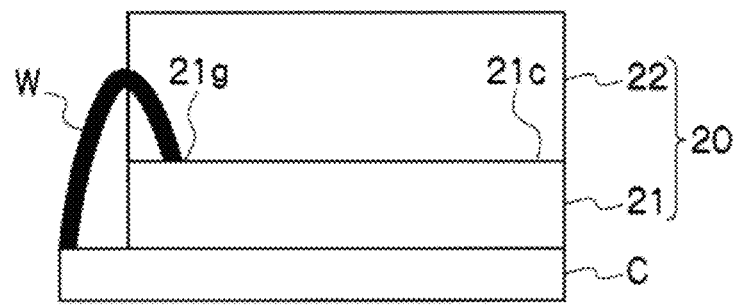
FIG. 6 is a schematic cross sectional view showing a light source for use in the vehicle lamp assembly in FIGS. 5A and 5B.

FIGS. 5A and 5B are a view illustrating an outer appearance of the vehicle lamp assembly 10 and a vertical cross sectional view of the vehicle lamp assembly 10, respectively. FIG. 6 is a schematic cross sectional view showing a light source 20 for use in the vehicle lamp assembly 10 in FIGS. 5A and 5B.

As shown in FIGS. 5A, 5B, and 6, the vehicle lamp assembly 10 can include the light source 20, a projection optical system 30, and the like components. The light source 20 can include an LED element 21 and a wavelength conversion layer 22. The wavelength conversion layer 22 can includes a phosphor or the like wavelength conversion material and be arranged to cover the light emission surface of the LED element 21. The light source 20 can be energized to cause the LED element 21 to emit light. Part of the light from the LED element 21 can pass the wavelength conversion layer 22 as is while the other part of the light can excite the wavelength conversion layer 22 to perform wavelength conversion of light so that the wavelength conversion layer 22 can emit the light that has been wavelength converted. As a result of the additive color mixture of the original light and the wavelength converted light, the light source 20 can project white or pseudo white light. The projection optical system 30 can be configured to project a light source image of the light source 20 in front of the vehicle body so that a light distribution pattern for a headlamp, for example, can be formed on a virtual vertical screen assumed to be disposed away from the vehicle body in the front direction.

[Structure of LED Element 21]

First, a description will be given of the structure of the LED element 21. FIGS. 7A, 7B, and 7C are a front view (top plan view) of the LED element 21, a cross sectional view (side view) of the LED element 21, and a luminance distribution diagram of the LED element 21, in particular, its light emission surface when viewed along line A-A of FIG. 7A, respectively.

The LED element 21 can be an LED element of a face-up type (so-called as an FU type) that can emit blue light from its epitaxial growth surface side and can have a rectangular light emission surface in a plan view (see FIG. 7A). Although a general LED element has a light emission surface with about 300 µm×about 500 µm, the LED element 21 of the present exemplary embodiment can be configured to have a larger light emission surface with about 500 to 1200 µm (height H in a direction parallel to the short side) and about 4 to 5 mm (width W in a longitudinal direction or a direction parallel to the long side).

As shown in FIG. 7B, the LED element 21 can be configured to include a rectangular substrate 21a, an n-type semiconductor layer 21b deposited on one surface of the substrate 21a, an n electrode 21c formed on a narrow region 21b1 including the first long side of the surface of the n-type semiconductor layer 21b and extending in the direction parallel to the long side, an active layer 21d deposited on the n-type semiconductor layer 21b between the second long side and the n electrode 21c, a p-type semiconductor layer 21e deposited on the active layer 21d between the first long side and the second long side, a transparent electrode 21f formed on the p-type semiconductor layer 21e between the first long side and the second long side, and a p electrode 21g formed on a narrow region 21f1 including the second long side of the transparent electrode 21f and extending in the same direction as the n electrode 21c.

The substrate 21a can be a single crystalline substrate such as a sapphire substrate. The n-type semiconductor layer 21b can be a nitride semiconductor layer such as an n-GaN layer. The n electrode 21c can be an electrode including a pad 21c1 to be connected to a power supply wire. The number of pads 21c1 can be increased/decreased according to the supplied power. The active layer 21d can be a light emission layer such as an InGaN layer. The p-type semiconductor layer 21e can be a nitride semiconductor layer such as a p-GaN layer. The transparent electrode 21f can be a transparent electrode with a low resistance such as a thin film made of AuNi, ITO, or the like. The transparent electrode 21f can be deposited all over the area from the first long side to the second long side on the surface of the p-type semiconductor layer 21e (see FIG. 7A). The transparent electrode 21f can be used for compensating for the current diffusion of the p-type semiconductor layer 21e having a higher resistivity than the n-type semiconductor layer 21b. The p electrode 21g can be an electrode including a pad 21g1 to be connected to a power supply wire. The number of pads 21g1 can be increased/decreased according to the supplied power. Suppose the case where the lamp assembly is utilized for a headlamp. In this case, the LED element 21 can be connected to a circuit for supplying the element with a constant current (a forward current of 1 to 5 A with a current density of 35 A/cm$^2$ or larger) controlled by a DC-DC converter and the like. For example, such a circuit may be a constant current circuit (not shown). This circuit can supply the LED element 21 with a current with a certain current density for forming the following current distribution. The current from the circuit can flow through the p electrode 21g, the transparent electrode 21f, the p-type semiconductor layer 21e, the active layer 21d, the n-type semiconductor layer 21b and the n electrode 21c, thereby causing the active layer 21d to emit blue light. The blue light can be emitted through the transparent electrode 21f upward as shown in FIG. 7B.

The current supplied to the p electrode 21g can be diffused uniformly through the p electrode 21g because the p electrode 21g is made of a metal material that can easily diffuse current. On the other hand, the current cannot diffuse uniformly over the transparent electrode 21f (vertical cross section) due to the resistivity of the transparent electrode 21f but concentrate in the vicinity of the p electrode 21g (namely, a peak can appear on the side of the p electrode 21g), and decrease gradually from the p electrode 21g toward the n electrode 21c (current distribution substantially corresponding to the luminance distribution of FIG. 7C). Furthermore, the current supplied to the p electrode 21g can be diffused uniformly through the transparent electrode 21f (in the horizontal cross sectional direction) due to the parallel arrangement of the n electrode 21c and the p electrode 21g (see FIG. 7A) so that a constant current distribution can be formed.

The current having such a distribution can activate the active layer 21d so that the active layer 21d can emit light. Accordingly, the light emission surface of the LED element 21 can provide a luminance distribution similar to the current distribution. Namely, the luminance distribution taken along the vertical cross sectional direction can be formed such that a peak appears in the vicinity of the p electrode 21g and gradually decreases from the p electrode 21g toward the n electrode 21c (see FIG. 7C) while the light emission surface of the LED element 21 can show a constant luminance distribution when taken along the horizontal cross sectional direction.

Figure 8:
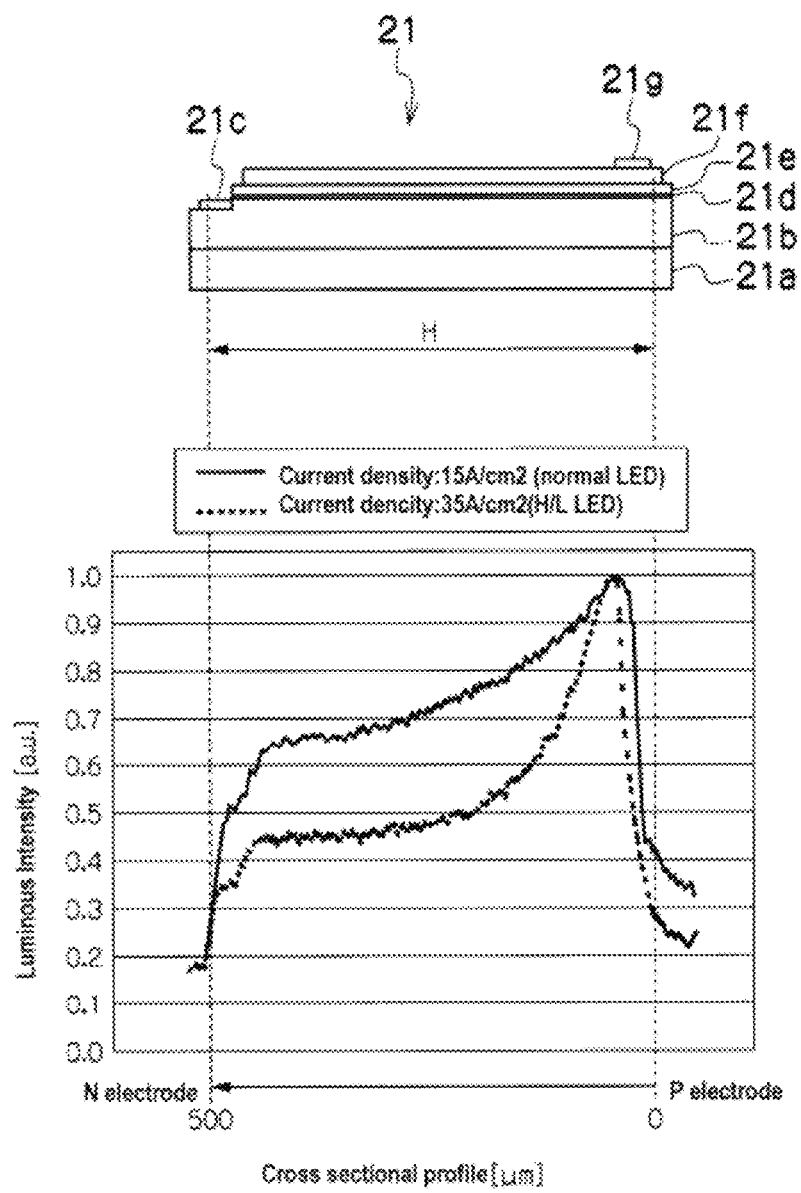
FIG. 8 includes a side view of the LED element and a luminance distribution diagram (along a vertical cross section) when the LED element is supplied with a current with a current density of 15 A/cm$^2$ or 35 A/cm$^2$.

For example, when a current with a current density of 15 A/cm$^2$ or 35 A/cm$^2$ is supplied to an LED element 21 having a short side (vertical direction) H of 500 μm, a luminance distribution as shown in FIG. 8 can be formed (along the vertical cross sectional direction).

It should be noted that the adjustment of the thickness of the transparent electrode 21f, the areas of the respective electrodes 21c, 21f, 21g and the like, the distance between the electrodes 21c and 21g, and the like can control the target luminance distribution of the light emission surface of the LED element 21 (light source 20) in the direction parallel to the vertical cross section (for example, the position, width and the like of the luminance peak).

[Production Method of LED Element 21]

A description will next be given of a method for producing the LED element 21 as one example, to which the presently disclosed subject matter is not limited.

First, a sapphire substrate 21a is prepared on which respective semiconductor layers including the n-type semiconductor layer 21b, the active layer 21d, the p-type semiconductor layer 21e, and the like can be grown (epitaxial growth) by MOCVD.

The growth of each of the semiconductor layers will be specifically described in order. The prepared sapphire substrate 21a is transferred to the MOCVD apparatus and subjected to thermal cleaning in a hydrogen atmosphere at 1000° C. for 10 minutes. Then, trimethyl gallium (TMG) and NH$_3$ are supplied to form a buffer layer (not shown) composed of GaN layer. Then, TMG, NH$_3$, and SiH$_4$ which serves as a dopant gas are supplied to form the n-type semiconductor layer 21b composed of n-GaN layer on the sapphire substrate 21a. Next, the active layer 21d is formed on the n-type semiconductor layer 21b. In the present example, the active layer 21d is configured to include a multiple quantum well structure composed of InGaN/GaN. Specifically, assume that InGaN/GaN is formed in one cycle, and then the active layer 21d is formed by performing the process for five cycles. More specifically, TMG, trimethyl indium (TMI), and NH$_3$ are supplied to form an InGaN well layer, and then TMG and NH$_3$ are supplied to form a GaN barrier layer. These processes are repeated for five cycles to form the active layer 21d. Next, TMG, trimethyl aluminum (TMA), NH$_3$, and CP$_2$Mg (biscyclopentadienyl Mg) which serves as a dopant are supplied to form a p-type AlGaN cladding layer (not shown). Then, TMG, NH$_3$, and CP$_2$Mg as a dopant are supplied to form the p-type semiconductor layer 21e composed of p-type GaN layer.

Next, dry etching is performed above the wafer so that part of the n-type semiconductor layer 21b (n-type GaN layer) is exposed. Specifically, a resist pattern is first formed by photolithography so as to be formed as a mask, and then the portions that are not covered with the mask are etched by reactive ion etching (RIE), followed by removing the resist pattern with a remover. Then, another resist pattern for covering the exposed portion 21b1 of the n-type semiconductor layer 21b (n-type GaN layer) is formed by photolithography, and the transparent electrode 21f of ITO is formed in a vapor and alloying furnace so as to cover the p-type semiconductor layer 21e. Then, the resist pattern is removed by a remover.

Then, the p electrode 21g and the n electrode 21c both made of Ti Au are formed on part of the surface of the transparent electrode 21f and the exposed surface 21b1 of the n-type semiconductor layer 21b (n-type GaN electrode), respectively. When the electrodes 21g and 21c are formed, the portions other than the portions where the electrodes are formed are covered with a mask by photolithography, and after the formation of the electrodes 21g and 21c, the mask is removed by a remover.

In this manner, the LED element 21 is completed.

[Wavelength Conversion Layer 22]

The wavelength conversion layer 22 can be arranged so as to cover the light emission surface of the LED element 21. FIG. 6 shows one exemplary embodiment including an LED element 21 mounted on a mounting board C such as a ceramic or silicon substrate and a wavelength conversion layer 22 arranged so as to cover the light emission surface of the LED element 21. Note that the LED element 21 and the pattern electrode of the mounting board C can be electrically connected by a wiring W, for example. It should be appreciated that the LED element 21 is shown as a simplified shape in this drawing for facilitating the understanding.

With this configuration, the LED element 21 can emit blue light and the blue light enters the wavelength conversion layer 22 so as to excite the wavelength conversion material contained in the wavelength conversion layer 22, whereby the wavelength conversion layer 22 can emit, for example, yellow light. The blue light that does not excite the wavelength conversion layer 22 and passes through the layer 22 and the yellow light can be mixed to produce white light (pseudo white light). Accordingly, the light source 20 can emit white light or function as a white light source. The material to be contained in the wavelength conversion layer 22 can be a phosphor that is excited by the blue light from the LED element 21 and emits yellow light, and the layer 22 can be a resin layer in which phosphor particles such as YAG-based phosphor particles are dispersed. In the present exemplary embodiment, a description has been given of the case where the LED element 21 can emit blue light and the wavelength conversion layer 22 that has been excited by the blue light from the LED element 21 can emit yellow light, but the presently disclosed subject matter is not limited thereto. The LED element 21 can be any other LED elements for emitting light beams with other wavelengths than blue light, and the wavelength conversion layer 22 can be those capable of emitting light with other wavelengths than yellow light. The appropriate selection of combinations of the type of LED element 21 and the material of the wavelength conversion material can provide any desired light color according to need other than white light.

The luminance distribution can be formed on the light emission surface of the LED element 21 (see FIG. 7C). Namely, the luminance distribution taken along the vertical cross sectional direction (along narrow width side) can be formed such that a peak appears on the side of the p electrode 21g and gradually decreases from the p electrode 21g toward the n electrode 21c (see FIG. 7C) while the light emission surface of the LED element 21 can show a constant luminance distribution when taken along the horizontal cross sectional direction (longitudinal direction).

Figure 3:
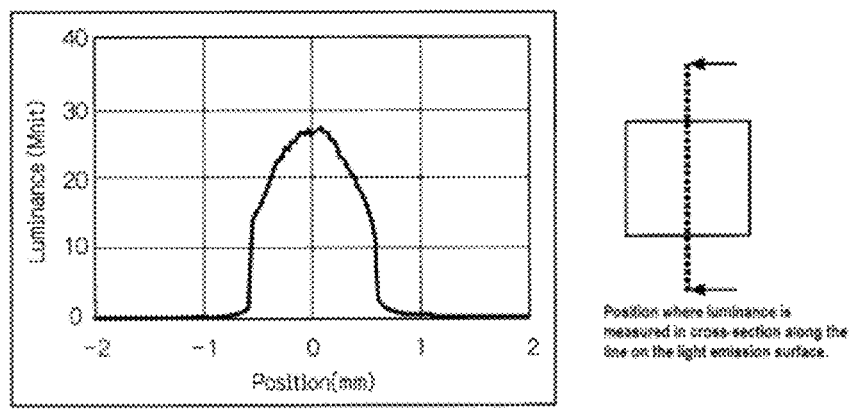
FIG. 3 is a diagram illustrating a luminance distribution of an LED element (in particular, light emission surface) with a conventional electrode structure with a front view showing the measuring position.

FIG. 7C shows one example of the luminance distribution in the direction along the vertical cross section of the light emission surface of the LED element 21. An LED element with a conventional electrode structure has a luminance distribution having a peak at its chip center and gradually decreasing toward its peripheral area (see FIG. 3). In contrast, the LED element 21 can provide the above mentioned luminance distribution having a peak in the vicinity of the p electrode 21g (the luminance is sharply risen at the side of the p electrode 21g) as shown in FIG. 7C and FIG. 8.

Figure 9:
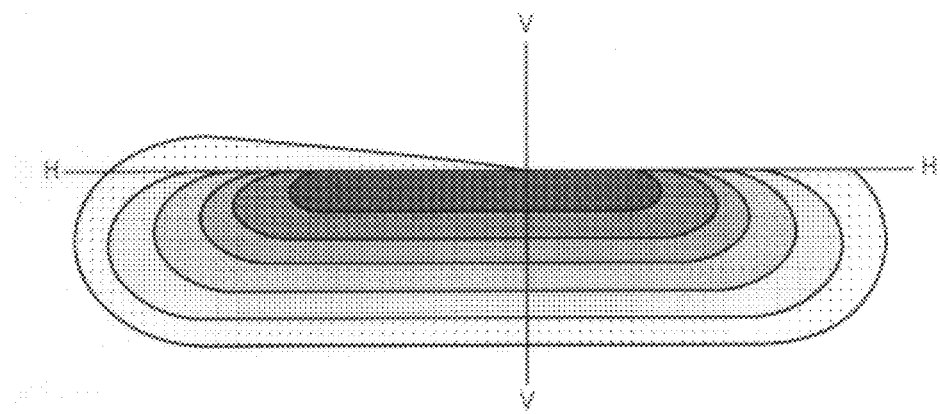
FIG. 9 is a diagram showing a light distribution pattern for a headlamp.

FIG. 9 shows an exemplary light distribution pattern for a headlamp. The center horizontal line in FIG. 9 represents a dark/bright boundary, the upper area of which is the opposite car lane while the lower area of which include the front road surface and the pedestrian way. The maximum luminance area (brightest area) in FIG. 9 can correspond to the darkest shaded area immediately below the dark/bright boarder. When the luminance is gradually decreased toward the lower area (as the distance is nearer the vehicle body when considering in a three dimensional manner), the optimal far distance visibility and the road luminance can be achieved with the best light distribution. The LED element with the conventional electrode configuration shows the luminance distribution as shown in the upper graph of FIG. 4 that has a luminance peak at its chip center. Accordingly, in order to comply with the required light distribution condition, the half of the light emission area is cut, resulting in waste of light.

In contrast, the LED element 21 of the present exemplary embodiment can show the luminance distribution having a luminance peak in the vicinity of the p electrode 21g (the luminance is sharply raised at the side of the p electrode 21g) as shown in FIG. 7C and FIG. 8. Accordingly, part of the light emitted from the LED element need not be cut, but the light emission state of the LED element 21 with the above luminance distribution can be utilized as is, thereby being capable of forming the light distribution pattern suitable for a low beam. Namely, without cutting part of the light, the portion on the side of the p electrode 21g (portion where the luminance peak is located in the luminance distribution) can be disposed at a position corresponding to the maximum luminance portion in the light distribution pattern. In this manner, it is possible to also dispose the luminance gradation portion to the required light distribution. This can improve the light utilization efficiency.

As described above, since the LED element 21 of the present exemplary embodiment can have the above specific electrode structure, the luminance distribution on the rectangular light emission surface can be formed such that a peak appears in the vicinity of the p electrode 21g (the luminance is sharply risen at the side of the p electrode 21g) and gradually decreases from the p electrode 21g toward the n electrode 21c (see FIG. 7C) in the vertical cross sectional direction while the light emission surface of the LED element 21 can show a constant luminance distribution when taken along the horizontal cross sectional direction, thereby forming a luminance distribution suitable for a light distribution pattern for a headlamp.

Figure 1:
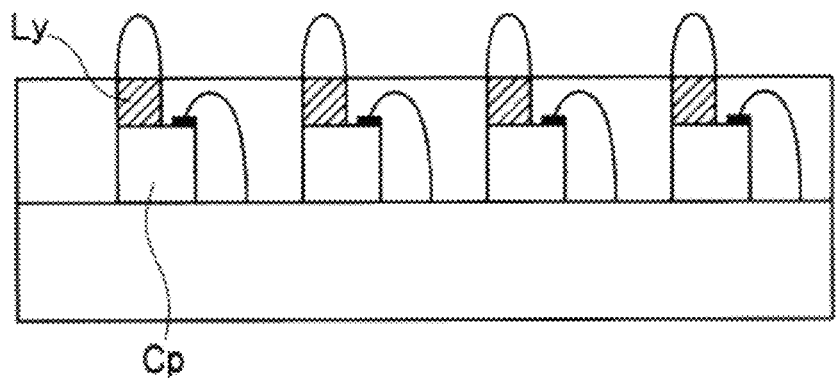
FIG. 1 is a schematic side view of a conventional semiconductor light emitting apparatus.
Figure 2:
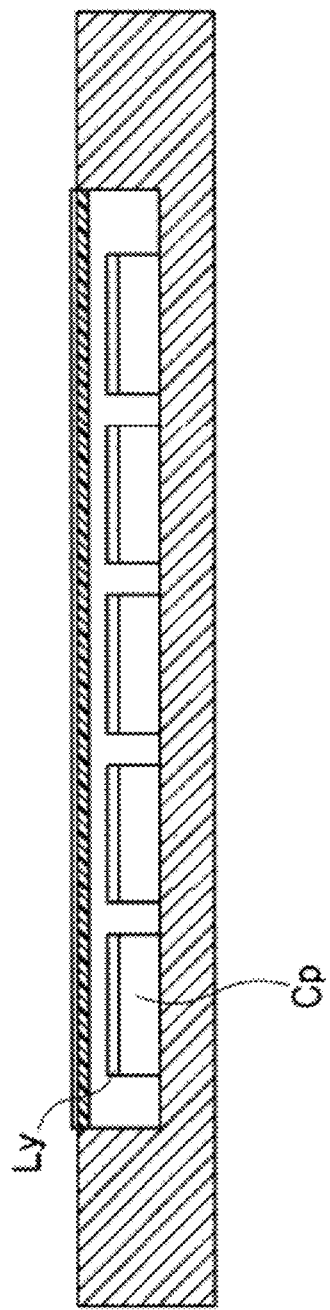
FIG. 2 is a schematic side view of another conventional semiconductor light emitting apparatus.
Figure 10:
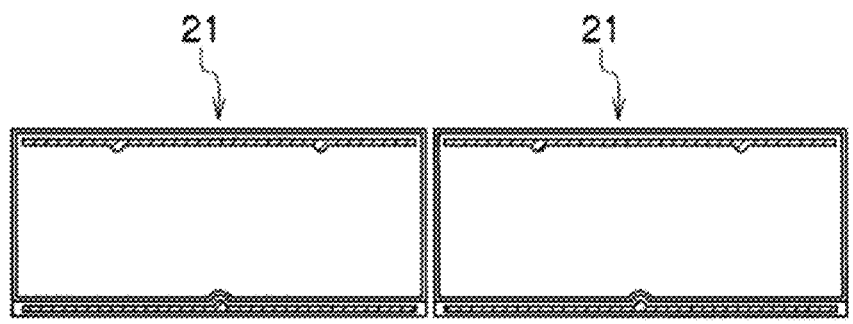
FIG. 10 is a front view (top plan view) of the LED element according to a modified example.

Further, the LED element 21 being a single horizontally long LED element can form the light emission surface with more uniform luminance than the conventional lamp assembly that is composed of a plurality of LED elements arranged in line (see FIG. 1). It should be appreciated, as shown in FIG. 10, a plurality of LED element 21 with the electrode structure according to the presently disclosed subject matter can be arranged in line according to the desired luminance distribution.

When a horizontally long single LED element 21 is used, the wavelength conversion layer 22 can also has a horizontally long shape. Accordingly, when compared with the case where a plurality of conventional LED elements each covered with a corresponding wavelength conversion layer are arranged in line (like that shown in FIG. 1), the distribution of the phosphor particles is difficult to be uneven, thereby preventing the color unevenness, the luminance unevenness, and the like.

[Vehicle Lamp Assembly 10]

A description will now be given of the configuration of a vehicle lamp assembly 10 utilizing the light source 20 with the above configuration with reference to the accompanying drawings.

As shown in FIGS. 5A and 5B, the vehicle lamp assembly 10 can include the light source 20 disposed in the front side of a vehicle body, and a projection optical system having a reflector 31 and the like disposed in the rear of the light source 20.

The light source 20 with the above described structure of the presently disclosed subject matter can be disposed such that the p electrode 21g (or the luminance peak portion) side is positioned closer to the forefront side while the n electrode 21c side is positioned farther from the forefront side (namely, closer to the reflector 31). In addition, the light source 20 can be disposed such that the illumination direction of the light source 20 (or the light emission surface of the light source 20) is directed downward (see FIG. 5B).

The reflector 31 can be a revolved paraboloid having a focal point close to the light source 20. The reflector 31 can be disposed to cover a range from the side to the front of the light source 20 so as to allow the light from the light source 20 to impinge on the reflector 31. Namely, the reflector 31 can be disposed to face the light emission surface of the light source 20 (see FIGS. 5A and 5B). It should be noted that the reflector 31 can be composed of a plurality of small separated reflection regions, and is of a type so called "multi-reflector" in the present exemplary embodiment.

The reflector 31 can project a plurality of light source images P1 of the light emission surface of the light source 20 so that the image portion P1' corresponding to the p electrode 21g (luminance peak portion) can be disposed upper side when the image is projected onto a virtual vertical screen (not shown) assumed to be formed in front of the vehicle lamp assembly 10 and separated away from the same. Note that FIG. 5B shows only one light source image P1. The projection of the plurality of light source images P1 of the light source 20 can be controlled such that the respective image portions P1' of the light source images P1 corresponding to the p electrode 21g (luminance peak portion) are densely arranged in a horizontal direction and in an oblique direction (for example, by an angle of 15 degrees with respect to the horizontal direction) on the virtual vertical screen. This configuration including the plurality of light source images P1 can form the desired light distribution pattern P for a headlamp including a desired cut-off line (including a horizontal cut-off line CL1 and an oblique cut-off line CL2, see FIG. 11).

In the vehicle lamp assembly 10 of the present exemplary embodiment, the light source 20 and the reflector 31 can be arranged in the above described physical relationship (see FIGS. 5A and 5B). Accordingly, the respective image portions P1' of the light source images P1 corresponding to the p electrode 21g (luminance peak portion) can be densely arranged in the horizontal direction and in the oblique direction (for example, by an angle of 15 degrees with respect to the horizontal direction) on the virtual vertical screen. This configuration can form the desired light distribution pattern P, in particular, suitable for a low-beam, which can include the cut-off line (including the horizontal cut-off line CL1 and the oblique cut-off line CL2) with the maximum luminance distribution and have a gradation where the luminance distribution gradually decreases from the cut-off line to the lower side. The vehicle lamp assembly 10 with this configuration can provide an improved far-distance visibility (see FIG. 11).

Furthermore, in the vehicle lamp assembly 10 of the present exemplary embodiment, the LED element 21 can have the luminance distribution with the luminance peak portion at the p electrode 21g side (namely, the luminance distribution abruptly increases near the p electrode 21g side, see FIGS. 7C and 8). In the lamp assembly utilizing the conventional LED element, part of light is cut for forming a desired light distribution pattern (see FIG. 4). However, the vehicle lamp assembly 10 with the above configuration need not cut part of light from the LED element 21, but can utilize the light emission state as is of the LED element 21 with the above luminance distribution so as to form the light distribution pattern P for a low beam (see FIG. 11). Accordingly, the projection optical system can have the reflector 31 that is designed such that part of light from the LED element 21 is not cut and the plurality of images P1' corresponding to the luminance peak portion (the p electrode side 21g) are densely arranged in the horizontal direction and in the oblique direction (for example, by an angle of 15 degrees with respect to the horizontal direction) in the light distribution pattern. Furthermore, the luminance gradation part can be matched to the desired light distribution pattern. The vehicle lamp assembly 10 of the present exemplary embodiment can improve the light utilization efficiency.

MODIFIED EXAMPLE 1-1

A description will next be given of Modified Example 1-1 of the vehicle lamp assembly 10 with reference to the drawings.

FIGS. 12A and 12B are a view illustrating an outer appearance of a vehicle lamp assembly 10 configured as Modified Example 1-1 and a vertical cross sectional view of the same, respectively.

As shown in FIGS. 12A and 12B, the vehicle lamp assembly 10 of Modified Example 1-1 can include a light source 20 disposed in the front side of a vehicle body and a projection optical system having a reflector 32 and the like disposed in the rear of the light source 20.

The light source 20 with the above described structure of the presently disclosed subject matter can be disposed such that the n electrode 21c side is positioned closer to the forefront side while the p electrode 21g (or the luminance peak portion) side is positioned farther from the forefront side (namely, closer to the reflector 31). In addition, the light source 20 can be disposed such that the illumination direction of the light source 20 (or the light emission surface of the light source 20) is directed upward (see FIG. 12B).

The reflector 32 can be a revolved paraboloid having a focal point close to the light source 20. The reflector 32 can be disposed to cover a range from the side to the front of the light source 20 so as to allow the light from the light source 20 to impinge on the reflector 31. Namely, the reflector 31 can be disposed to face the light emission surface of the light source 20 (see FIGS. 5A and 5B). It should be noted that the reflector 32 can be composed of a plurality of small separated reflection regions, and is of a type so called "multi-reflector" in the present exemplary embodiment.

As shown in FIG. 12B, the reflector 32 can project a plurality of light source images P1 of the light emission surface of the light source 20 so that the image portion P1' corresponding to the p electrode 21g (luminance peak portion) can be disposed upper side when the image is projected onto a virtual vertical screen (not shown) assumed to be formed in front of the vehicle lamp assembly 10 and separated away from the same. Note that FIG. 12B shows only one light source image P1. The projection of the plurality of light source images P1 of the light source 20 can be controlled such that the respective image portions P1' of the light source images P1 corresponding to the p electrode 21g (luminance peak portion) are densely arranged in the horizontal direction and in the oblique direction (for example, by an angle of 15 degrees with respect to the horizontal direction) on the virtual vertical screen. This configuration can form the desired light distribution pattern P for a headlamp including the cut-off line (including the horizontal cut-off line CL1 and the oblique cut-off line CL2, see FIG. 11) by the plurality of light source images P1.

In the vehicle lamp assembly 10 of the present Modified Example, the light source 20 and the reflector 32 can be arranged in the above described physical relationship (see FIGS. 12A and 12B). Accordingly, the respective image portions P1' of the light source images P1 corresponding to the p electrode 21g (luminance peak portion) can be densely arranged in the horizontal direction and in the oblique direction (for example, by an angle of 15 degrees with respect to the horizontal direction) on the virtual vertical screen. This configuration can form the desired light distribution pattern P, in particular, suitable for a low-beam, which can include the cut-off line (including the horizontal cut-off line CL1 and the oblique cut-off line CL2) with the maximum luminance distribution and have a gradation where the luminance distribution gradually decreases from the cut-off line to the lower side. The vehicle lamp assembly 10 with this configuration can provide an improved far-distance visibility (see FIG. 11).

Furthermore, in the vehicle lamp assembly 10 of the present Modified Example, the LED element 21 can have the luminance distribution with the luminance peak at the p electrode 21g side (namely, the luminance distribution abruptly increases near the p electrode 21g side, see FIG. 7C). In the lamp assembly utilizing the conventional LED element, part of light is cut for forming a desired light distribution pattern (see FIG. 4). However, the vehicle lamp assembly 10 with the above configuration need not cut part of light from the LED element 21, but can utilize the light emission state as is of the LED element 21 with the above luminance distribution so as to form the light distribution pattern P for a low beam (see FIG. 11). Accordingly, the projection optical system can have the reflector 32 that is designed such that part of light from the LED element 21 is not cut and the plurality of images P1' corresponding to the luminance peak portion (the p electrode side 21g) are densely arranged in the horizontal direction and in the oblique direction (for example, by an angle of 15 degrees with respect to the horizontal direction) in the light distribution pattern. Furthermore, the luminance gradation part can be matched to the desired light distribution pattern. The vehicle lamp assembly 10 of the present Modified Example can improve the light utilization efficiency.

MODIFIED EXAMPLE 1-2

A description will next be given of Modified Example 1-2 of the vehicle lamp assembly 10 with reference to the drawings.

Figure 13B:
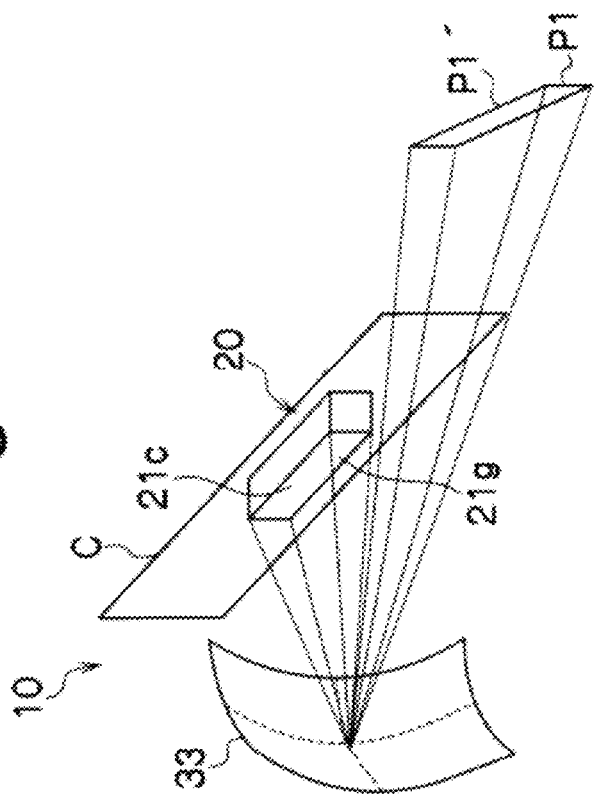
FIGS. 13A and 13B are a view illustrating an outer appearance of a vehicle lamp assembly configured as Modified Example 1-2 and a vertical cross sectional view of the same, respectively.
Figure 13A:
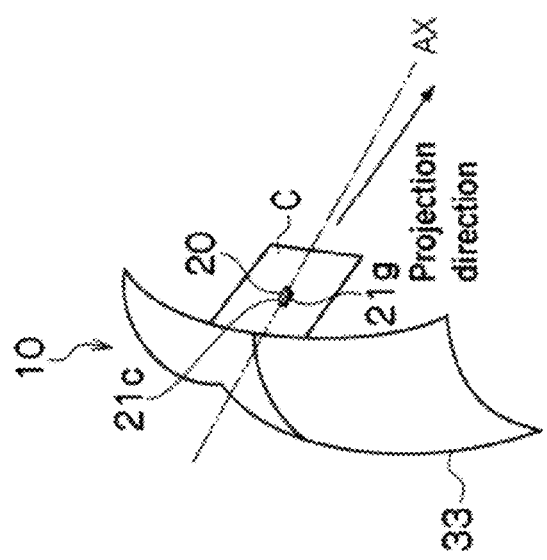

FIGS. 13A and 13B are a view illustrating an outer appearance of a vehicle lamp assembly 10 configured as Modified Example 1-2 and a vertical cross sectional view of the same, respectively.

As shown in FIGS. 13A and 13B, the vehicle lamp assembly 10 of Modified Example 1-2 can include a light source 20 disposed in the front side of a vehicle body and a projection optical system having a reflector 33 and the like disposed in the rear of the light source 20.

The light source 20 with the above described structure of the presently disclosed subject matter can be disposed such that the n electrode 21c side is positioned upward in the vertical direction while the p electrode 21g (or the luminance peak portion) side is positioned downward in the vertical direction. In addition, the light source 20 can be disposed such that the illumination direction of the light source 20 (or the light emission surface of the light source 20) is directed substantially in the horizontal direction (namely, the light emission surface of the light source 20 is directed in the substantially vertical direction, see FIG. 13B).

The reflector 33 can be a revolved paraboloid having a focal point close to the light source 20. The reflector 33 can be disposed in front of the light source 20 so as to allow the light from the light source 20 to impinge on the reflector 33 (see FIGS. 13A and 13B). It should be noted that the reflector 33 can be composed of a plurality of small separated reflection regions, and is of a type so called "multi-reflector" in the present exemplary embodiment.

As shown in FIG. 13B, the reflector 33 can project a plurality of light source images P1 of the light emission surface of the light source 20 so that the image portion P1' corresponding to the p electrode 21g (luminance peak portion) can be disposed upper side when the image is projected onto a virtual vertical screen (not shown) assumed to be formed in front of the vehicle lamp assembly 10 and separated away from the same. Note that FIG. 13B shows only one light source image P1. The projection of the plurality of light source images P1 of the light source 20 can be controlled such that the respective image portions P1' of the light source images P1 corresponding to the p electrode 21g (luminance peak portion) are densely arranged in the horizontal direction and in the oblique direction (for example, by an angle of 15 degrees with respect to the horizontal direction) on the virtual vertical screen. This configuration can form the desired light distribution pattern P for a headlamp including the cut-off line (including the horizontal cut-off line CL1 and the oblique cut-off line CL2, see FIG. 11) by the plurality of light source images P1.

In the vehicle lamp assembly 10 of the present Modified Example, the light source 20 and the reflector 33 can be arranged in the above described physical relationship (see FIGS. 13A and 13B). Accordingly, the respective image portions P1' of the light source images P1 corresponding to the p electrode 21g (luminance peak portion) can be densely arranged in the horizontal direction and in the oblique direction (for example, by an angle of 15 degrees with respect to the horizontal direction) on the virtual vertical screen. This configuration can form the desired light distribution pattern P, in particular, suitable for a low-beam, which can include the cut-off line (including the horizontal cut-off line CL1 and the oblique cut-off line CL2) with the maximum luminance distribution and have a gradation where the luminance distribution gradually decreases from the cut-off line to the lower side. The vehicle lamp assembly 10 with this configuration can provide an improved far-distance visibility (see FIG. 11).

Furthermore, in the vehicle lamp assembly 10 of the present Modified Example, the LED element 21 can have the luminance distribution with the luminance peak at the p electrode 21g side (namely, the luminance distribution abruptly increases near the p electrode 21g side, see FIG. 7C). In the lamp assembly utilizing the conventional LED element, part of light is cut for forming a desired light distribution pattern (see FIG. 4). However, the vehicle lamp assembly 10 with the above configuration need not cut part of light from the LED element 21, but can utilize the light emission state as is of the LED element 21 with the above luminance distribution so as to form the light distribution pattern P for a low beam (see FIG. 11). Accordingly, the projection optical system can have the reflector 33 that is designed such that part of light from the LED element 21 is not cut and the plurality of images P1' corresponding to the luminance peak portion (the p electrode side 21g) are densely arranged in the horizontal direction and in the oblique direction (for example, by an angle of 15 degrees with respect to the horizontal direction) in the light distribution pattern. Furthermore, the luminance gradation part can be matched to the desired light distribution pattern. The vehicle lamp assembly 10 of the present Modified Example can improve the light utilization efficiency.

MODIFIED EXAMPLE 1-3

A description will next be given of Modified Example 1-3 of the vehicle lamp assembly 10 with reference to the drawings.

Figure 14:
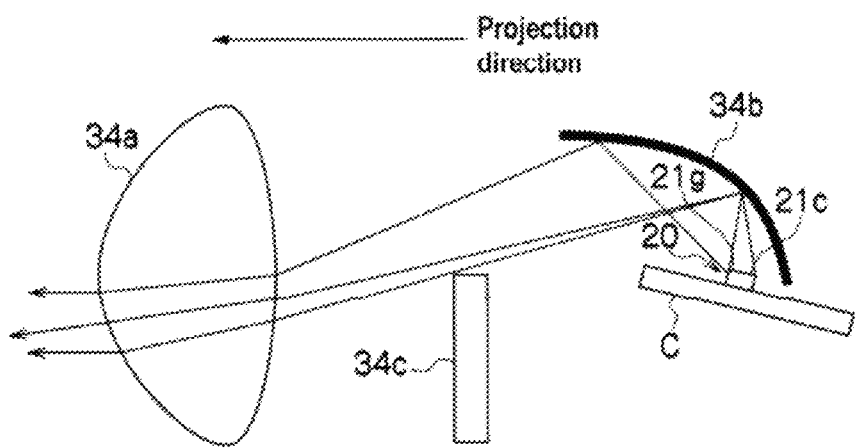
FIG. 14 is a vertical cross sectional view of a vehicle lamp assembly configured as Modified Example 1-3.

FIG. 14 is a vertical cross sectional view of a vehicle lamp assembly 10 configured as Modified Example 1-3.

As shown in FIG. 14, the vehicle lamp assembly 10 of the present Modified Example can include a projection lens 34a disposed in the front side of a vehicle body, a light source 20 disposed in the rear of the projection lens 34a, a reflector 34b disposed so as to cover the range from the side to the front of the light source 20 in order to allow the light from the light source 20 to impinge on the reflector 34b (namely, the reflector 34b faces the light source 20), a shade 34c disposed between the projection lens 34a and the light source 20, and the like. The projection lens 34a, the reflector 34b, and the shade 34c can constitute the projection optical system of the presently disclosed subject matter.

The light source 20 with the above described structure of the presently disclosed subject matter can be disposed such that the p electrode 21g (or the luminance peak portion) side is positioned closer to the forefront side while the n electrode 21c side is positioned farther from the forefront side (namely, closer to the reflector 34b). In addition, the light source 20 can be disposed such that the illumination direction of the light source 20 (or the light emission surface of the light source 20) is directed upward (see FIG. 14).

The reflector 34b can be a revolved elliptic surface having a first focal point close to the light source 20 and a second focal point close to the upper edge of the shade 34c. The reflector 34b can be disposed to cover the range from the side to the front of the light source 20 so as to allow the light from the light source 20 to impinge on the reflector 34b. Namely, the reflector 34b can be disposed to face the light emission surface of the light source 20 (see FIG. 14). The reflector 34b can project a plurality of light source images P1 of the light emission surface of the light source 20 so that the image portion P1' corresponding to the p electrode 21g (luminance peak portion) can be disposed upper side when the image is projected onto a virtual vertical screen (not shown). The projection of the plurality of light source images P1 of the light source 20 can be controlled such that the respective image portions P1' of the light source images P1 corresponding to the p electrode 21g (luminance peak portion) are densely arranged in the horizontal direction and in the oblique direction (for example, by an angle of 15 degrees with respect to the horizontal direction) on the virtual vertical screen. This configuration can form the desired light distribution pattern P for a headlamp including a desired cut-off line (including the horizontal cut-off line CL1 and the oblique cut-off line CL2, see FIG. 11).

The shade 34c can be a shading member configured to form the cut-off line by shielding part of light reflected from the reflector 34b. The shade 34c can be disposed between the projection lens 34a and the light source 20 so that the upper edge thereof is positioned at or near the focal point of the projection lens 34a.

In the vehicle lamp assembly 10 of the present Modified Example, the light source 20 and the projection light system can be arranged in the above described physical relationship (see FIG. 14). Accordingly, the respective image portions P1' of the light source images P1 corresponding to the p electrode 21g (luminance peak portion) can be densely arranged in the horizontal direction and in the oblique direction (for example, by an angle of 15 degrees with respect to the horizontal direction) on the virtual vertical screen. This configuration can form the desired light distribution pattern P, in particular, suitable for a low-beam, which can include the cut-off line (including the horizontal cut-off line CL1 and the oblique cut-off line CL2) with the maximum luminance distribution and have a gradation where the luminance distribution gradually decreases from the cut-off line to the lower side. The vehicle lamp assembly 10 with this configuration can provide an improved far-distance visibility (see FIG. 11).

Furthermore, in the vehicle lamp assembly 10 of the present Modified Example, the LED element 21 can have the luminance distribution with the luminance peak at the p electrode 21g side (namely, the luminance distribution abruptly increases near the p electrode 21g side, see FIG. 7C). In the lamp assembly utilizing the conventional LED element, part of light (approximately half thereof) is cut for forming a desired light distribution pattern (see FIG. 4). However, the vehicle lamp assembly 10 with the above configuration need not cut part of light from the LED element 21, but can utilize the light emission state as is of the LED element 21 with the above luminance distribution so as to form the light distribution pattern P for a low beam (see FIG. 11). Accordingly, the projection optical system can have the reflector 34b that is designed such that part of light from the LED element 21 is not cut and the plurality of images P1' corresponding to the luminance peak portion (the p electrode side 21g) are densely arranged in the horizontal direction and in the oblique direction (for example, by an angle of 15 degrees with respect to the horizontal direction) in the light distribution pattern. Furthermore, the luminance gradation part can be matched to the desired light distribution pattern. The vehicle lamp assembly 10 of the present Modified Example can improve the light utilization efficiency.

According to the vehicle lamp assembly 10 of the present Modified Example, the shade 34c can receive energy less than that in the lamp assembly utilizing a conventional LED element. Specifically, since the shade 34c can receive only part of light from the LED element 21 at the high luminance side, it is possible to reduce the amount of heat unnecessarily applied to the shade 34c.

MODIFIED EXAMPLE 1-4

A description will next be given of Modified Example 1-4 of the vehicle lamp assembly 10 with reference to the drawings.

Figure 15:
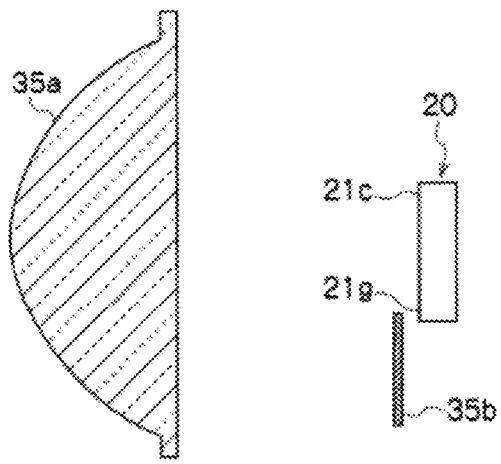
FIG. 15 is a vertical cross sectional view of a vehicle lamp assembly configured as Modified Example 1-4.

FIG. 15 is a vertical cross sectional view of a vehicle lamp assembly 10 configured as Modified Example 1-4.

As shown in FIG. 15, the vehicle lamp assembly 10 of the present Modified Example can include a projection lens 35a disposed in the front side of a vehicle body, a light source 20 disposed in the rear of the projection lens 35a, a shade 35b disposed between the projection lens 35a and the light source 20, and the like. The projection lens 35a and the shade 35b can constitute the projection optical system of the presently disclosed subject matter.

The light source 20 with the above described structure of the presently disclosed subject matter can be disposed such that the n electrode 21c side is positioned upward in the vertical direction while the p electrode 21g (or the luminance peak portion) side is positioned downward in the vertical direction. In addition, the light source 20 can be disposed such that the illumination direction of the light source 20 (or the light emission surface of the light source 20) is directed substantially in the horizontal direction (namely, the light emission surface of the light source 20 is directed in the substantially vertical direction, see FIG. 15).

The shade 35b can be a shading member configured to form the cut-off line by shielding part of light from the light source 20. The shade 35b can be disposed between the projection lens 35a and the light source 20 so that the upper edge thereof is positioned at or near the focal point of the projection lens 35a.

In the vehicle lamp assembly 10 of the present Modified Example, the light source 20 and the projection light system can be arranged in the above described physical relationship (see FIG. 15). Accordingly, the respective image portions P1' of the light source images P1 corresponding to the p electrode 21g (luminance peak portion) can be densely arranged in the horizontal direction and in the oblique direction (for example, by an angle of 15 degrees with respect to the horizontal direction) on the virtual vertical screen. This configuration can form the desired light distribution pattern P, in particular, suitable for a low-beam, which can include the cut-off line (including the horizontal cut-off line CL1 and the oblique cut-off line CL2) with the maximum luminance distribution and have a gradation where the luminance distribution gradually decreases from the cut-off line to the lower side. The vehicle lamp assembly 10 with this configuration can provide an improved far-distance visibility (see FIG. 11).

Furthermore, in the vehicle lamp assembly 10 of the present Modified Example, the LED element 21 can have the luminance distribution with the luminance peak at the p electrode 21g side (namely, the luminance distribution abruptly increases near the p electrode 21g side, see FIG. 7C). In the lamp assembly utilizing the conventional LED element, part of light (approximately half thereof) is cut for forming a desired light distribution pattern (see FIG. 4). However, the vehicle lamp assembly 10 with the above configuration need not cut part of light from the LED element 21, but can utilize the light emission state as is of the LED element 21 with the above luminance distribution so as to form the light distribution pattern P for a low beam (see FIG. 11). Accordingly, the projection optical system can have the projection optical system that is designed such that part of light from the LED element 21 is not cut and the plurality of images P1' corresponding to the luminance peak portion (the p electrode 21g side) are densely arranged in the horizontal direction and in the oblique direction (for example, by an angle of 15 degrees with respect to the horizontal direction) in the light distribution pattern. Furthermore, the luminance gradation part can be matched to the desired light distribution pattern. The vehicle lamp assembly 10 of the present Modified Example can improve the light utilization efficiency.

According to the vehicle lamp assembly 10 of the present Modified Example, the shade 35b can receive energy less than that in the lamp assembly utilizing a conventional LED element. Specifically, since the shade 35b can receive only part of light from the LED element 21 at the high luminance side, it is possible to reduce the amount of heat unnecessarily applied to the shade 35b.

MODIFIED EXAMPLE 2-1

Figures 16A, 16B, 16C:
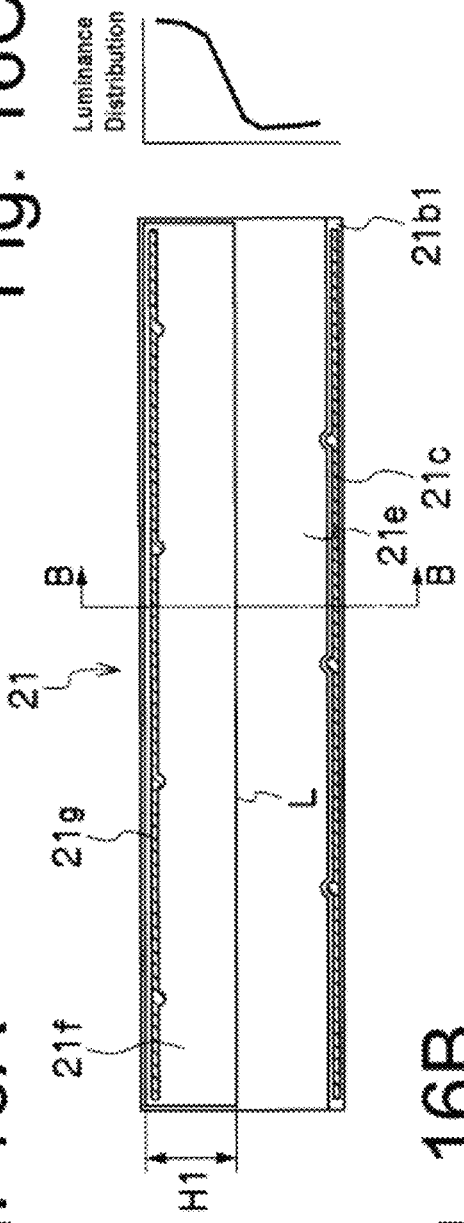
FIGS. 16A, 16B, and 16C are a front view (top plan view) of an LED element as Modified Example 2-1, a cross sectional view (side view) of the LED element, and a luminance distribution diagram of the LED element (light emission surface) when viewed along line B-B of FIG. 16A, respectively.

Next, a description will be given of the structure of the LED element 21 according to Modified Example 2-1 with reference to the drawings. FIGS. 16A, 16B, and 16C are a front view (top plan view) of the LED element 21, a cross sectional view (side view) of the LED element 21, and a luminance distribution diagram of the LED element 21, in particular, its light emission surface when viewed along line B-B of FIG. 16A, respectively.

In the embodiment and the respective Modified Examples above, the transparent electrode 21f can be formed over the substantially entire area from one long side to the other long side of the surface of the p-type semiconductor layer 21e (see FIG. 7A). However, the presently disclosed subject matter is not limited thereto. For example, as shown in FIGS. 16A and 16B, the transparent electrode 21f can be formed on a region of the p-type semiconductor layer 21e from a long side closer to the p electrode 21g (a second long side) to an intermediate line L in the midpoint between the other long side (a first long side) and the second long side and extending in the long side direction.

In the present Modified Example, the transparent electrode 21f is not formed on a region from the intermediate line L to the first long side closer to the n electrode 21c on the surface of the p-type semiconductor layer 21e, so that the current from the p electrode 21g can be prevented from being diffused. Accordingly, the current supplied to the p electrode 21g can be concentrated in the vicinity of the p electrode 21g in the vertical cross section (namely, a peak can appear on the side of the p electrode 21g), and decrease gradually from the p electrode 21g toward the n electrode 21c and rapidly and sharply decrease in the vicinity of the intermediate line L (meaning that current distribution substantially corresponding to the luminance distribution of FIG. 16C is formed). Therefore, the current having such a distribution can activate the active layer 21d so that the active layer 21d can emit light. Accordingly, the light emission surface of the LED element 21 can provide a luminance distribution similar to the current distribution. Namely, the luminance distribution taken along the vertical cross sectional direction can be formed such that a peak appears in the vicinity of the p electrode 21g and gradually decreases from the p electrode 21g toward the n electrode 21c and rapidly and sharply decrease in the vicinity of the intermediate line L (see FIG. 16C) while the light emission surface of the LED element 21 can show a constant luminance distribution when taken along the horizontal cross sectional direction.

When the wavelength conversion layer 22 is disposed so as to cover the light emission surface of the LED element 21 according to the present Modified Example, a luminance distribution can be formed as shown in FIG. 16C such that a luminance peak appears in the vicinity of the p electrode 21g and gradually decreases from the p electrode 21g toward the n electrode 21c and rapidly and sharply decrease in the vicinity of the intermediate line L (see FIG. 16C) while a constant luminance distribution can be formed when taken along the horizontal cross sectional direction. In this manner, the light source 20 with the above configuration can form the luminance distribution suitable for forming a desired light distribution pattern for a headlamp, for example.

Furthermore, the light source 20 including the LED element 21 according to the present Modified Example can have a similar luminance distribution to that of the light source 20 of the above exemplary embodiment, namely, the luminance distribution can have a luminance peak in the vicinity of the p electrode 21g (the luminance is sharply risen at the side of the p electrode 21g). Accordingly, the light source 20 including the LED element 21 according to the present Modified Example can be applied to the vehicle lamp assembly 10 (see FIG. 5) and the respective vehicle lamp assemblies 10 of the Modified Examples 1-1 to 1-4 (see FIGS. 12 to 15).

It should be noted that the adjustment of the vertical dimension H of the transparent electrode 21f (short side dimension, see FIG. 16A) can control the target luminance distribution of the light emission surface of the LED element 21 (light source 20) in the direction along the vertical cross section (for example, the position, width and the like of the luminance peak portion).

MODIFIED EXAMPLE 2-2

Next, a description will be given of the structure of the LED element 21 according to Modified Example 2-2 with reference to the drawings. FIGS. 17A, 17B, and 17C are a front view (top plan view) of the LED element 21, a cross sectional view (side view) of the LED element 21, and a luminance distribution diagram of the LED element 21, in particular, its light emission surface when viewed along line C-C of FIG. 17A, respectively.

In the embodiment and the respective Modified Examples above, the p electrode 21g can be formed on a narrow region 21f1 including the second long side of the transparent electrode 21f (the long side far from the n electrode 21c) (see FIG. 7A), to which the presently disclosed subject matter is not limited. For example, as shown in FIGS. 17A and 17B, the p electrode 21g can be formed at the midpoint between the first long side and the second long side on the transparent electrode 21f.

According to the present Modified Example, the current supplied to the p electrode 21g can be uniformly diffused thereinside because the p electrode 21g is made of metal that can facilitate the current diffusion. On the other hand, the current supplied to the transparent electrode 21f cannot be diffused uniformly because of the resistivity of the transparent electrode 21f, but concentrated between the p electrode 21g and the n electrode 21c (namely, a peak can appear between the p electrode 21g and the n electrode 21c), and decrease gradually from the p electrode 21g toward either far side in the vertical direction (short side direction). Accordingly, a current distribution substantially corresponding to the luminance distribution of FIG. 17C can be formed. On the other hand, the current supplied to the p electrode 21g can form a uniform current distribution in the horizontal cross sectional direction of the transparent electrode 21f because the n electrode 21c and the p electrode 21 are parallel to each other (see FIG. 17A).

Therefore, the current having such a distribution can activate the active layer 21d so that the active layer 21d can emit light. Accordingly, the light emission surface of the LED element 21 can provide a luminance distribution similar to the current distribution. Namely, the luminance distribution taken along the vertical cross sectional direction can be formed such that a peak appears between the p electrode 21g and the n electrode 21c (namely, the luminance distribution abruptly increases between the p electrode 21g and the n electrode 21c) and gradually decreases from the p electrode 21g toward the other long side (see FIG. 17C) while the light emission surface of the LED element 21 can show a constant luminance distribution when taken along the horizontal cross sectional direction.

When the wavelength conversion layer 22 is disposed so as to cover the light emission surface of the LED element 21 according to the present Modified Example, a luminance distribution can be formed as shown in FIG. 17C such that a luminance peak appears between the p electrode 21g and the n electrode 21c (namely, the luminance distribution abruptly increases between the p electrode 21g and the n electrode 21c) and gradually decreases from the p electrode 21g toward the other long side in the vertical direction (see FIG. 17C) while a constant luminance distribution can be formed when taken along the horizontal cross sectional direction. In this manner, the light source 20 with the above configuration can form the luminance distribution suitable for forming a desired light distribution pattern for a headlamp, for example.

Furthermore, the light source 20 including the LED element 21 according to the present Modified Example can have a similar luminance distribution to that of the light source 20 of the above exemplary embodiment, namely, the luminance distribution can have a luminance peak in the vicinity of one long side between the p electrode 21g and the n electrode 21c. Accordingly, the light source 20 including the LED element 21 according to the present Modified Example can be applied to the vehicle lamp assembly 10 (see FIG. 5) and the respective vehicle lamp assemblies 10 of the Modified Examples 1-1 to 1-4 (see FIGS. 12 to 15).

For example, the luminance peak portion between the p electrode 21g and the n electrode 21c can be positioned closer to the forefront side while the farther long side can be disposed in the rear side (namely, closer to the reflector 31). In addition, the light source 20 can be disposed such that the illumination direction of the light source 20 (or the light emission surface of the light source 20) is directed downward (see FIG. 5B). In this manner, the vehicle lamp assembly 10 shown in FIG. 5 can be substantially produced. In the same manner, the vehicle lamp assemblies 10 shown in FIGS. 12 to 15 can also be produced.

It should be noted that the adjustment of the distance H3 between the n electrode 21c and the p electrode 21g (see FIG. 17A) can control the target luminance distribution of the light emission surface of the LED element 21 (light source 20) in the direction along the vertical cross section (for example, the position, width and the like of the luminance peak portion).

Figure 23:
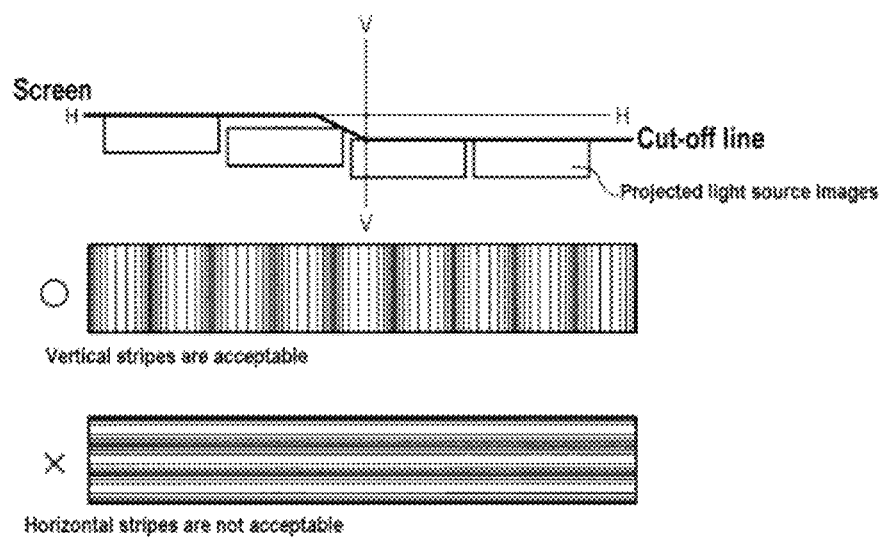
FIG. 23 is a diagram illustrating that vertical stripes are allowed when compared with horizontal stripes if stripes are generated in the luminance distribution of an LED element.

By the way, when considering a light distribution pattern for a headlamp, the diffusion in the horizontal direction of the light source (LED element) is larger than the diffusion in the vertical direction of the light source. Accordingly, the unevenness of light distribution can be affected less by the generation of longitudinal stripes than the generation of horizontal stripes (see, for example, FIG. 23). It should be noted the "horizontal stripes" used herein does not mean the luminance distribution where a luminance decreases from the upper end (one long side) to the lower end (the other long side), but the luminance distribution where a peak and a valley repeatedly appear in the vertical cross sectional direction (see FIG. 23).

To cope with this, the areas, vertical widths, thicknesses, and the like of the respective electrodes 21c, 21f and 21g and the distance between both the electrodes 21c and 21g can be adjusted to control the formed luminance distribution where the horizontal stripes including a plurality of peaks can be prevented from being generated.

MODIFIED EXAMPLE 2-3

Next, a description will be given of the structure of the LED element 21 according to Modified Example 2-3 with reference to the drawings. FIGS. 18A, 18B, and 18C are a front view (top plan view) of the LED element 21, a cross sectional view (side view) of the LED element 21, and a luminance distribution diagram of the LED element 21, in particular, its light emission surface when viewed along line D-D of FIG. 18A, respectively.

As shown in FIGS. 18A and 18B, the LED element 21 can include a plurality of additional p electrodes 21g2 connected to the p electrode 21g and extending from the p electrode 21g toward the n electrode 21c and a plurality of additional n electrodes 21c2 connected to the n electrode 21c and extending from the n electrode 21c toward the p electrode 21g. In the Modified Example shown in the drawings, these p electrode 21g with the additional p electrodes 21g2 and the n electrode 21c with the additional n electrode 21c2 can form a comb like shape so that they face each other with the additional p electrode 21g2 and the additional n electrode 21c2 disposed in an alternative manner.

According to the present Modified Example, the current supplied to the p electrode 21g can be uniformly diffused thereinside including the additional p electrodes 21g2 because the p electrode 21g and the additional p electrodes 21g2 are made of metal that can facilitate the current diffusion. On the other hand, the current supplied to the transparent electrode 21f cannot be diffused uniformly because of the resistivity of the transparent electrode 21f, but concentrated between tip ends of the additional p electrodes 21g2 of the p electrode 21g and the additional n electrodes 21c2 of the n electrode 21c (namely, a peak can appear between the tip ends of the additional p electrodes 21g2 of the p electrode 21g and the additional n electrodes 21c2 of the n electrode 21c), and decrease gradually toward the other long side in the vertical direction (short side direction). Accordingly, a current distribution substantially corresponding to the luminance distribution of FIG. 18C can be formed. On the other hand, the current supplied to the p electrode 21g can form a uniform current distribution in the horizontal cross sectional direction of the transparent electrode 21f because the n electrode 21c and the p electrode 21 are parallel to each other (see FIG. 18A).

Therefore, the current having such a distribution can activate the active layer 21d so that the active layer 21d can emit light. Accordingly, the light emission surface of the LED element 21 can provide a luminance distribution similar to the current distribution. Namely, the luminance distribution taken along the vertical cross sectional direction can be formed such that a peak appears between the tip ends of the additional p electrodes 21g2 of the p electrode 21g and the additional n electrodes 21c2 of the n electrode 21c (namely, the luminance distribution abruptly increases between the tip ends of the additional p electrodes 21g2 of the p electrode 21g and the additional n electrodes 21c2 of the n electrode 21c) and gradually decreases toward the other long side (see FIG. 18C) while the light emission surface of the LED element 21 can show a constant luminance distribution when taken along the horizontal cross sectional direction.

When the wavelength conversion layer 22 is disposed so as to cover the light emission surface of the LED element 21 according to the present Modified Example, a luminance distribution can be formed as shown in FIG. 18C such that a luminance peak appears between the tip ends of the additional p electrodes 21g2 of the p electrode 21g and the additional n electrodes 21c2 of the n electrode 21c (namely, the luminance distribution abruptly increases between the tip ends of the additional p electrodes 21g2 of the p electrode 21g and the additional n electrodes 21c2 of the n electrode 21c) and gradually decreases toward the other long side in the vertical direction (see FIG. 18C) while a constant luminance distribution can be formed when taken along the horizontal cross sectional direction. In this manner, the light source 20 with the above configuration can form the luminance distribution suitable for forming a desired light distribution pattern for a headlamp, for example.

Furthermore, the light source 20 including the LED element 21 according to the present Modified Example can have a similar luminance distribution to that of the light source of the above exemplary embodiment, namely, the luminance distribution can have a luminance peak between the tip ends of the additional p electrodes 21$g$2 of the p electrode 21$g$ and the additional n electrodes 21$c$2 of the n electrode 21$c$. Accordingly, the light source 20 including the LED element 21 according to the present Modified Example can be applied to the vehicle lamp assembly 10 (see FIG. 5) and the respective vehicle lamp assemblies 10 of the Modified Examples 1-1 to 1-4 (see FIGS. 12 to 15).

For example, the luminance peak portion between the tip ends of the additional p electrodes 21$g$2 of the p electrode 21$g$ and the additional n electrodes 21$c$2 of the n electrode 21$c$ can be positioned closer to the forefront side while the farther long side can be disposed in the rear side (namely, closer to the reflector 31). In addition, the light source 20 can be disposed such that the illumination direction of the light source 20 (or the light emission surface of the light source 20) is directed downward (see FIG. 5B). In this manner, the vehicle lamp assembly 10 shown in FIG. 5 can be substantially produced. In the same manner, the vehicle lamp assemblies 10 shown in FIGS. 12 to 15 can also be produced.

It should be noted that the adjustment of the overlapping distance H2 between the tip ends of the additional p electrodes 21$g$2 of the p electrode 21$g$ and the additional n electrodes 21$c$2 of the n electrode 21$c$ (see FIG. 18A) can control the target luminance distribution of the light emission surface of the LED element 21 (light source 20) in the direction along the vertical cross section (for example, the position, width and the like of the luminance peak portion).

MODIFIED EXAMPLE 2-4

Next, a description will be given of the structure of the LED element 21 according to Modified Example 2-4 with reference to the drawings. FIGS. 19A, 19B, and 19C are a front view (top plan view) of the LED element 21, a cross sectional view (side view) of the LED element 21, and a luminance distribution diagram of the LED element 21, in particular, its light emission surface when viewed along line E-E of FIG. 19A, respectively.

Figure 7:
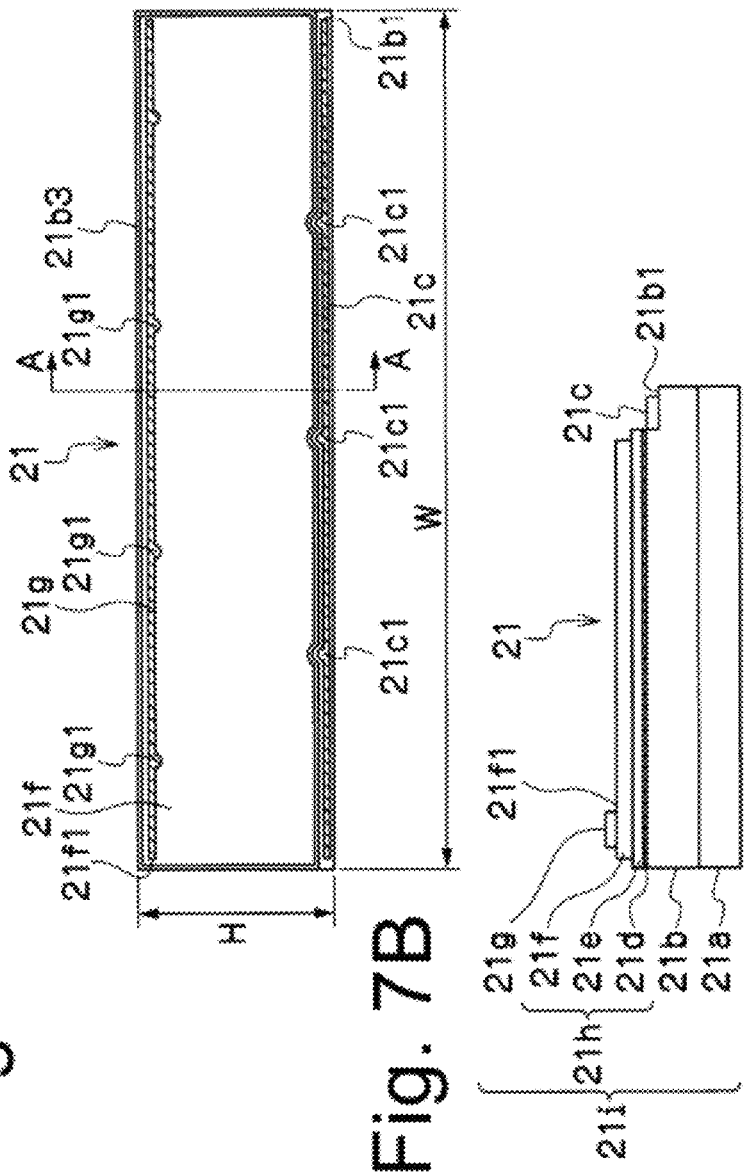
FIGS. 7A, 7B, and 7C are a front view (top plan view) of an LED element, a cross sectional view (side view) of the LED element, and a luminance distribution diagram of the LED element (light emission surface) when viewed along line A-A of FIG. 7A, respectively.

In the embodiment and the respective Modified Examples above, the single element portion 21$h$ including the active element 21$d$, the p-type semiconductor layer 21$e$ and the transparent electrode 21$f$ was described with reference to FIG. 7, to which the presently disclosed subject matter is not limited.

For example, as shown in FIGS. 19A and 19B, a plurality of (for example, two) element portions 21$h$. For example, at least one groove portion G1 can be formed by dry etching or the like from the surface of the p-type semiconductor layer 21$e$ so as to reach the n-type semiconductor layer 21$b$ and extend in the same direction as the n electrode 21$c$, thereby separating the p-type semiconductor layer 21$e$, and the like in the vertical direction (for example, into two element portions, as shown in FIG. 19A). A transparent electrode 21$f$ and a p electrode 21$g$ can be formed on each of the upper and lower p-type semiconductor layers 21$e$. In this manner, the vertically adjacent plurality of element portions 21$h$ can be formed (see FIGS. 19A and 19B).

Figure 20A:
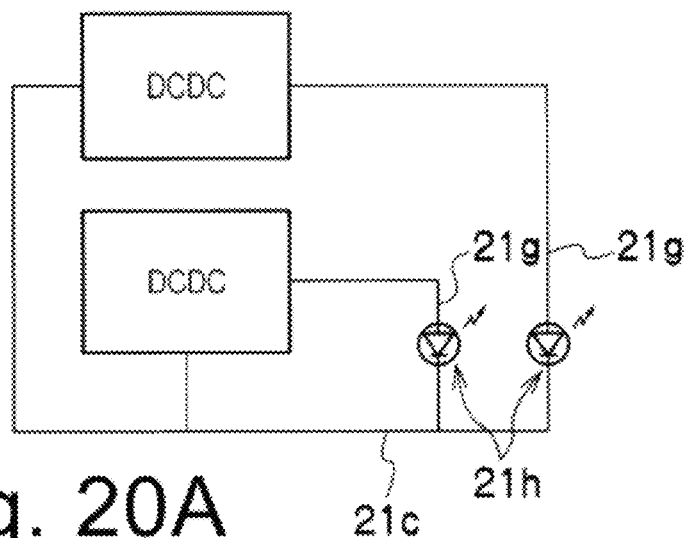
FIGS. 20A and 20B are a block diagram illustrating a constant current circuit, and a block diagram illustrating another constant current circuit.
Figure 20B:
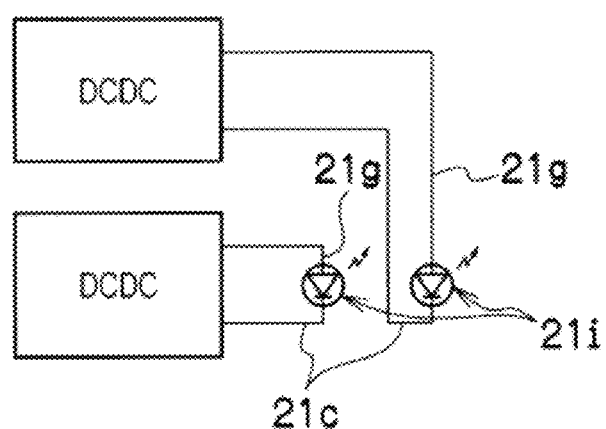

A circuit (for example, a constant current circuit) can be connected to the upper element portion 21$h$ (farther side from the n electrode 21$c$) and the lower element portion 21$h$ (close to the n electrode 21$c$) so as to supply a constant current (for example, a forward current of 1 to 5 A with a current density of 35 A/cm$^2$ or larger) controlled by a DC-DC converter or the like to them. In the present Modified Example, the circuit can supply a current with larger current density to the upper element portion 21$h$ than to the lower element portion 21$h$. FIG. 20A is an exemplary circuit for use in the above purpose.

According to the present Modified Example, a larger current is supplied to the upper element portion 21$h$ so that a peak can appear in the vicinity of the p electrode 21$g$ of the upper element portion 21$h$ in the vertical cross sectional direction while the current decreases from the p electrode 21$g$ of the upper element portion 21$h$ to the n electrode 21$c$. Accordingly, a current distribution substantially corresponding to the luminance distribution of FIG. 19C can be formed. In this case, the current density supplied to the upper element portion 21$h$ can be made larger than that supplied to the lower element portion 21$h$.

Therefore, the current having such a distribution can activate the active layer 21$d$ so that the active layer 21$d$ can emit light. Accordingly, the light emission surface of the LED element 21 can provide a luminance distribution similar to the current distribution. Namely, the luminance distribution taken along the vertical cross sectional direction can be formed such that a peak appears in the vicinity of the p electrode 21$g$ of the upper element portion 21$h$ and gradually decreases toward the n electrode 21$c$ (see FIG. 19C) while the light emission surface of the LED element 21 can show a constant luminance distribution when taken along the horizontal cross sectional direction.

When the wavelength conversion layer 22 is disposed so as to cover the light emission surface of the LED element 21 according to the present Modified Example, a luminance distribution can be formed as shown in FIG. 19C such that a luminance peak appears in the vicinity of the p electrode 21$g$ of the upper element portion 21$h$ and gradually decreases toward the n electrode 21$c$ in the vertical direction (see FIG. 19C) while a constant luminance distribution can be formed when taken along the horizontal cross sectional direction. In this manner, the light source 20 with the above configuration can form the luminance distribution suitable for forming a desired light distribution pattern for a headlamp, for example.

Furthermore, the light source 20 including the LED element 21 according to the present Modified Example can have a similar luminance distribution to that of the light source 20 of the above exemplary embodiment, namely, the luminance distribution can have a luminance peak in the vicinity of the p electrode 21$g$ of the upper element portion 21$h$ (the luminance is sharply risen at the side of the p electrode 21$g$ of the upper element portion 21$h$). Accordingly, the light source 20 including the LED element 21 according to the present Modified Example can be applied to the vehicle lamp assembly 10 (see FIG. 5) and the respective vehicle lamp assemblies 10 of the Modified Examples 1-1 to 1-4 (see FIGS. 12 to 15).

For example, the luminance peak portion in the vicinity of the p electrode 21$g$ of the upper element portion 21$h$ can be positioned closer to the forefront side while the farther long side (n electrode 21$c$) can be disposed in the rear side (namely, closer to the reflector 31). In addition, the light source 20 can be disposed such that the illumination direction of the light source 20 (or the light emission surface of the light source 20) is directed downward (see FIG. 5B). In this manner, the vehicle lamp assembly 10 shown in FIG. 5 can be substantially produced. In the same manner, the vehicle lamp assemblies 10 shown in FIGS. 12 to 15 can also be produced.

It should be noted that the separate adjustment of the current to be supplied to the upper element portion 21h and the lower element portion 21h can control the target luminance distribution of the light emission surface of the LED element 21 (light source 20) in the direction along the vertical cross section (for example, the position, width and the like of the luminance peak portion).

Also in this case, the areas, vertical widths, thicknesses, and the like of the respective electrodes 21c, 21f and 21g, the distance between both the electrodes 21c and 21g, and the position, vertical width, number of the groove G1 can be adjusted to control the formed luminance distribution where the horizontal stripes including a plurality of peaks can be prevented from being generated.

In addition, according to the present Modified Example 2-4, the amount of the active layer 21d to be removed can be made less when compared with Modified Example 2-5 that will be described later (see FIG. 19B and FIG. 22B). Accordingly, a brighter LED element 21 (light source 20) can be composed.

Figure 21:
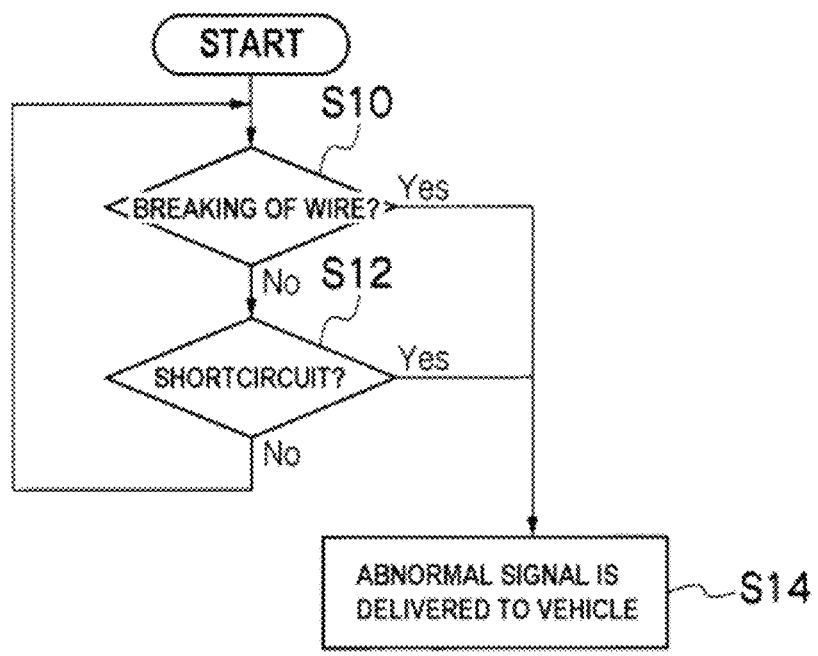
FIG. 21 is a flow chart showing an exemplary process when a disconnection of wire W or a short circuit is detected in the LED element.

Further in the present Modified Example, another circuit (not shown), for example, a circuit for detecting a variation in current amount to be supplied to the LED element 21. With this configuration, as shown in FIG. 21, a disconnection of wire W or a short circuit in the LED element 21 can be detected in the LED element 21 (Step S10 and Step S12). If the disconnection of wire W or short circuit is detected (Step S10—Yes, Step S12—Yes), an abnormal signal indicating such a situation can be delivered to a vehicle-side apparatus (Step S14). Furthermore, the vehicle-side apparatus can perform notification (for example, display) based on the abnormal signal.

MODIFIED EXAMPLE 2-5

Next, a description will be given of the structure of the LED element 21 according to Modified Example 2-5 with reference to the drawings. FIGS. 22A, 22B, and 22C are a front view (top plan view) of the LED element 21, a cross sectional view (side view) of the LED element 21, and a luminance distribution diagram of the LED element 21, in particular, its light emission surface when viewed along line F-F of FIG. 22A, respectively.

In the embodiment and the respective Modified Examples above, the single element portion 21i including the n-type semiconductor layer 21b, the n electrode 21c, the active element 21d, the p-type semiconductor layer 21e, the transparent electrode 21f and the p electrode 21g was described with reference to FIG. 5A, to which the presently disclosed subject matter is not limited.

For example, as shown in FIGS. 22A and 22B, a plurality of (for example, two) element portions 21i. For example, at least one groove portion G2 can be formed by dry etching or the like from the surface of the p-type semiconductor layer 21e so as to reach the substrate 21a and extend in the same direction as the n electrode 21c, thereby separating the p-type semiconductor layer 21e, and the like in the vertical direction (for example, into two element portions, as shown in FIG. 22A). An n electrode 21c, a transparent electrode 21f and a p electrode 21g can be formed on each of the upper and lower p-type semiconductor layers 21e separated. In this manner, the vertically adjacent plurality of element portions 21i can be formed (see FIGS. 22A and 22B). It should be appreciated that a plurality of LED elements 21 can be arranged in the vertical direction side by side so as to form the plurality of element portions 21i.

A circuit (for example, a constant current circuit) can be connected to the upper element portion 21i and the lower element portion 21h so as to supply a constant current (for example, a forward current of 1 to 5 A with a current density of 35 A/cm$^2$ or larger) controlled by a DC-DC converter or the like to them. In the present Modified Example, the circuit can supply a current with larger current density to the upper element portion 21i than to the lower element portion 21i. FIG. 20A is an exemplary circuit for use in the above purpose.

According to the present Modified Example, a larger current is supplied to the upper element portion 21i so that a peak can appear in the vicinity of the p electrode 21g of the upper element portion 21i (the p electrode 21g closest to the one long side of the LED element among the plurality of p electrodes) in the vertical cross sectional direction while the current decreases from the p electrode 21g of the upper element portion 21i to the n electrode 21c of the lower element portion 21i. Accordingly, a current distribution substantially corresponding to the luminance distribution of FIG. 22C can be formed. In this case, the current density supplied to the upper element portion 21i can be made larger than that supplied to the lower element portion 21i.

Therefore, the current having such a distribution can activate the active layer 21d so that the active layers 21d of the upper and lower element portions 21i can emit light. Accordingly, the light emission surface of the entire LED element 21 can provide a luminance distribution similar to the current distribution. Namely, the luminance distribution taken along the vertical cross sectional direction can be formed such that a peak appears in the vicinity of the p electrode 21g of the upper element portion 21i and gradually decreases toward the n electrode 21c of the lower element portion 21i (see FIG. 22C) while the light emission surface of the LED element 21 can show a constant luminance distribution when taken along the horizontal cross sectional direction.

When the wavelength conversion layer 22 is disposed so as to cover the light emission surface of the LED element 21 according to the present Modified Example, a luminance distribution can be formed as shown in FIG. 22C such that a luminance peak appears in the vicinity of the p electrode 21g of the upper element portion 21i and gradually decreases toward the n electrode 21c of the lower element portion 21i in the vertical direction (see FIG. 22C) while a constant luminance distribution can be formed when taken along the horizontal cross sectional direction. In this manner, the light source 20 with the above configuration can form the luminance distribution suitable for forming a desired light distribution pattern for a headlamp, for example.

Furthermore, the light source 20 including the LED element 21 according to the present Modified Example can have a similar luminance distribution to that of the light source 20 of the above exemplary embodiment, namely, the luminance distribution can have a luminance peak in the vicinity of the p electrode 21g of the upper element portion 21i (the luminance is sharply risen at the side of the p electrode 21g of the upper element portion 21i). Accordingly, the light source 20 including the LED element 21 according to the present Modified Example can be applied to the vehicle lamp assembly 10 (see FIG. 5) and the respective vehicle lamp assemblies 10 of the Modified Examples 1-1 to 1-4 (see FIGS. 12 to 15).

For example, the luminance peak portion in the vicinity of the p electrode 21g of the upper element portion 21i can be positioned closer to the forefront side while the n electrode 21c of the lower element portion 21i can be disposed in the rear side (namely, closer to the reflector 31). In addition, the light source 20 can be disposed such that the illumination direction of the light source 20 (or the light emission surface of the light source 20) is directed downward (see FIG. 5B). In this manner, the vehicle lamp assembly 10 shown in FIG. 5 can be substantially produced. In the same manner, the vehicle lamp assemblies 10 shown in FIGS. 12 to 15 can also be produced.

It should be noted that the separate adjustment of the current to be supplied to the upper element portion 21$i$ and the lower element portion 21$i$ can control the target luminance distribution of the light emission surface of the LED element 21 (light source 20) in the direction along the vertical cross section (for example, the position, width and the like of the luminance peak portion).

Also in this case, the areas, vertical widths, thicknesses, and the like of the respective electrodes 21$c$, 21$f$ and 21$g$, the distance between both the electrodes 21$c$ and 21$g$, and the position, vertical width, number of the groove G2 can be adjusted to control the formed luminance distribution where the horizontal stripes including a plurality of peaks can be prevented from being generated.

Further in the present Modified Example, another circuit (not shown), for example, a circuit for detecting a variation in current amount to be supplied to the LED element 21. With this configuration, as shown in FIG. 21, a disconnection of wire W or a short circuit in the LED element 21 can be detected in the LED element 21 (Step S10 and Step S12). If the disconnection of wire W or short circuit is detected (Step S10—Yes, Step S12—Yes), an abnormal signal indicating such a situation can be delivered to a vehicle-side apparatus (Step S14). Furthermore, the vehicle-side apparatus can perform notification (for example, display) based on the abnormal signal.

A description will now be made below to vehicle lamp assemblies of the presently disclosed subject matter with reference to the accompanying drawings in accordance with other exemplary embodiments.

A vehicle lamp assembly 110 made in accordance with the principles of the presently disclosed subject matter can be suitable for a headlamp to be arranged on either side of the front portion of a vehicle body.

Figures 24A, 24B:
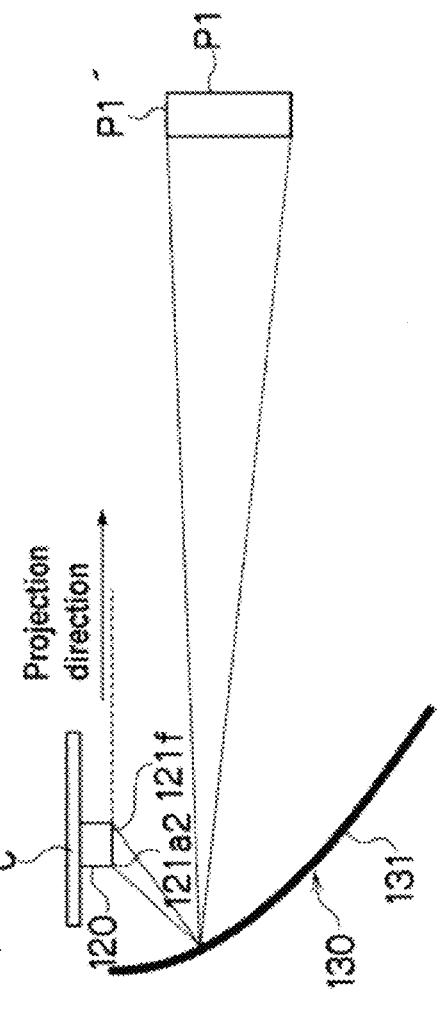
FIGS. 24A and 24B are a view illustrating an outer appearance of a vehicle lamp assembly made in accordance with principles of the presently disclosed subject matter and a vertical cross sectional view of the vehicle lamp assembly, respectively.
Figure 25:
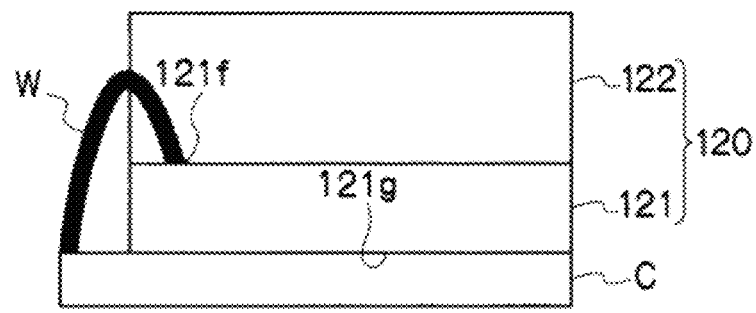
FIG. 25 is a schematic cross sectional view showing a light source for use in the vehicle lamp assembly in FIGS. 24A and 24B.

FIGS. 24A and 24B are a view illustrating an outer appearance of the vehicle lamp assembly 110 and a vertical cross sectional view of the vehicle lamp assembly 110, respectively. FIG. 25 is a schematic cross sectional view showing a light source 120 for use in the vehicle lamp assembly 110.

As shown in FIGS. 24A and 24B, the vehicle lamp assembly 110 can include a light source 120, a projection optical system 130, and the like components similarly to the vehicle lamp assembly 10 shown in FIGS. 5A and 5B. The light source 120 can include an LED element 121 and a wavelength conversion layer 122. The wavelength conversion layer 122 can be arranged to cover the light emission surface of the LED element 121. Since the present exemplary embodiment is different from the vehicle lamp assembly 10 in the LED element 121 of the light source 120, a description will be given of this difference.

[Structure of LED Element 121]

First, a description will be given of the structure of the LED element 121. FIGS. 26A, 26B, and 26C are a front view (top plan view) of the LED element 121, a cross sectional view (side view) of the LED element 121, and a luminance distribution diagram of the LED element 121, in particular, its light emission surface when viewed along line A-A of FIG. 26A, respectively.

The LED element 121 can be an LED element of a vertical type (so-called as a TF type or bonded type) that can allow a current to slow in the up-to-down direction and can have a rectangular light emission surface in a plan view (see FIG. 26A). The LED element 121 of the present exemplary embodiment can be configured to have a larger light emission surface with about 500 to 1200 µM (height (vertical width) H in a direction parallel to the short side) and about 4 to 5 mm (horizontal width W in a longitudinal direction or a direction parallel to the long side) (see FIG. 26A).

As shown in FIG. 26B, the LED element 121 can be configured to include a rectangular support substrate 121$e$, a rear side electrode 121$g$ formed on one surface of the support substrate 121$e$, a p electrode 121$d$ formed on the other surface of the support substrate 121$e$ and serving as a reflection electrode, a p-type semiconductor layer 121$c$ deposited on the p electrode 121$d$, an active layer 121$b$ deposited on the p-type semiconductor layer 121$c$, an n-type semiconductor layer 121$a$ deposited on the active layer 121$b$, and an n electrode 121$f$ formed on a narrow region 121$a$1 including the second long side of the n-type semiconductor layer 121$a$ and extending in the direction parallel to the long side.

The n-type semiconductor layer 121$a$ can be a nitride semiconductor layer such as an n-GaN layer. The active layer 121$b$ can be a light emission layer such as an InGaN layer. The p-type semiconductor layer 121$c$ can be a nitride semiconductor layer such as a p-GaN layer. The p electrode 121$d$ can be an electrode that has a high reflectance with respect to blue light, for example, and so-called as a reflection electrode. Because of the reflection action of the p electrode 121$d$, the LED element 121 of the present exemplary embodiment can provide an improved output when compared with the face-up type LED element that utilizes a transparent electrode. In the LED element 121 of the present exemplary embodiment, the p electrode 121$d$ can be a large sized one having a high heat dissipation efficiency. Accordingly, when compared with the face-up type LED element that uses the transparent electrode, the adverse effect of the heat generated by the LED element 121 due to a large amount of supplied current (such as deterioration of luminance) can be prevented or relieved. The support substrate 121$e$ can be a semiconductor substrate, for example, opaque to blue light. The n electrode 121$f$ can be an electrode including a pad 121$f$1 to be connected to a power supply wire. The number of pad 121$f$1 can be increased/decreased according to the supplied power.

Suppose the case where the lamp assembly is utilized for a headlamp. In this case, the LED element 121 can be connected to a circuit for supplying the element with a constant current (a forward current of 1 to 5 A with a current density of 35 A/cm$^2$ or larger) controlled by a DC-DC converter and the like. For example, such a circuit may be a constant current circuit (not shown). This circuit can supply the LED element 121 with a current with a certain current density for forming the following current distribution. The current from the circuit can flow through the rear electrode 121$g$, the p electrode 121$d$, the p-type semiconductor layer 121$c$, the active layer 121$b$, the n-type semiconductor layer 121$a$ and the n electrode 121$f$, thereby causing the active layer 121$b$ to emit blue light. The blue light can be emitted directly through the n-type semiconductor layer 121$a$ upward or by being reflected by the p electrode 121$d$ as shown in FIG. 26B.

The current supplied to the p electrode 121$d$ can be diffused uniformly through the p electrode 121$d$ because the p electrode 121$d$ is formed over the substantially entire region of the p-type semiconductor layer 121$c$. On the other hand, since the current is likely to pass the shortest path, it may concentrate in the vicinity of the n electrode 121$f$ (a peak appears on the side of the n electrode 121$f$, and decrease gradually from the n electrode 121$f$ to the other long side in the vertical direction (narrow width direction) (current distribution substantially corresponding to the luminance distribution of FIG. 26C). Furthermore, the current supplied to the p electrode 121$d$ can be diffused uniformly in the horizontal cross sectional direction due to the parallel arrangement of the n electrode 121$f$ and the p electrode 121$d$ (see FIG. 26B) so that a constant current distribution can be formed.

The current having such a distribution can activate the active layer 121$b$ so that the active layer 121$b$ can emit light. Accordingly, the light emission surface of the LED element 121 can provide a luminance distribution similar to the current distribution. Namely, the luminance distribution taken along the vertical cross sectional direction can be formed such that a peak appears in the vicinity of the n electrode 121$f$ (meaning the maximum luminance portion appears on the side of the n electrode 121$f$ and gradually decreases from the n electrode 121$f$ toward the farther long side (see FIG. 26C) while the light emission surface of the LED element 121 can show a constant luminance distribution when taken along the horizontal cross sectional direction. The luminance distribution appearing on the light emission surface of the LED element 121 can include a single luminous peak nearer the one long side (second long side) than the center area between the first long side and the second long side.

It should be noted that the adjustment of the areas of the respective electrodes 121$d$ and 121$f$, the distance between the electrodes 121$d$ and 121$f$, and the like can control the target luminance distribution of the light emission surface of the LED element 121 (light source 120) in the direction along the vertical cross section (for example, the position, width and the like of the luminance peak).

[Production Method of LED Element 121]

A description will next be given of a method for producing the LED element 121 as one example, to which the presently disclosed subject matter is not limited.

First, a sapphire substrate is prepared (not shown), and subjected to thermal cleaning. Then, the respective semiconductor layers including the n-type semiconductor layer 121$a$, the active layer 121$b$, the p-type semiconductor layer 121$c$, and the like can be grown by MOCVD (metal organic chemical vapor deposition) method. Specifically, TMG and $NH_3$ are supplied to form a buffer layer (not shown) composed of GaN layer. Then, TMG, $NH_3$, and $SiH_4$ which serves as a dopant gas are supplied to form the n-type semiconductor layer 121$a$ composed of n-type GaN layer. Next, the active layer 121$b$ is formed on the n-type semiconductor layer 121$a$. In the present example, the active layer 121$b$ is configured to include a multiple quantum well structure composed of InGaN/GaN. Specifically, assume that InGaN/GaN is formed in one cycle, and then the active layer 21$d$ is formed by performing the process for five cycles. More specifically, TMG, TMI, and $NH_3$ are supplied to form an InGaN well layer, and then TMG and $NH_3$ are supplied to form a GaN barrier layer. These processes are repeated for five cycles to form the active layer 121$b$. Next, TMG, TMA, $NH_3$, and $CP_2Mg$ (bis-cyclopentadienyl Mg) which serves as a dopant are supplied to form a p-type AlGaN cladding layer (not shown). Then, TMG, $NH_3$, and $CP_2Mg$ (bis-cyclopentadienyl Mg) as a dopant are supplied to form the p-type semiconductor layer 121$c$ composed of p-type GaN layer.

After the completion of the formation of the semiconductor layers, the bonding process between the semiconductor layer and the support substrate 121$e$.

In this case, the support substrate 121$e$ can be a semiconductor substrate that is opaque to the wavelength of emission light and can include an Si substrate, a Ge substrate, or the like. The semiconductor layer and the support substrate 121$e$ can be bonded via the p electrode 121$d$ (metal layer) that is composed of a stack of a plurality of metal films including, for example, AuSn solder. The p electrode 121$d$ (metal layer) can function as a bonding layer between the semiconductor layer and the support substrate 121$e$ in addition to the reflection electrode layer. It should be appreciated that the p electrode 121$d$ (metal layer) can be appropriately disposed on the semiconductor layer side and/or the support substrate 121$e$ side.

Further, instead of the support substrate 121$e$ such as an Si substrate or Ge substrate, it can be formed as a plated film such as Cu film on the p electrode 121$d$ (metal layer).

Then, the sapphire substrate is peeled off from the semiconductor layer by a known method such as the laser lift off (LLO) method or other known methods. In the LLO method, a laser beam is applied to the GaN layer formed on the sapphire substrate to decompose the layer into metal Ga and N, thereby peeling off the sapphire substrate. Then, the n-type semiconductor layer 121$a$ can be exposed (see FIG. 26B).

Next, on the surface of the n-type semiconductor layer 121$a$ having been exposed by peeling off the sapphire substrate, the n electrode 121$f$ (electrode pad) is formed. The n electrode 121$f$ can be formed by depositing Au, Ag, Al or the like metal on the n-type semiconductor layer 121$a$ by sputtering or the like, and then patterning the formed layer by photolithographic technique.

On the other hand, the rear electrode 121$g$ can be formed by vapor-deposition of metal such as Pt on the rear surface of the support substrate 121$e$.

In this manner, the LED element 121 is completed.

[Wavelength Conversion Layer 122]

The wavelength conversion layer 122 can be arranged so as to cover the light emission surface of the LED element 121. FIG. 25 shows one exemplary embodiment including an LED element 121 mounted on a mounting board C such as a ceramic or silicon substrate and a wavelength conversion layer 122 arranged so as to cover the light emission surface of the LED element 121. Note that the LED element 121 and the pattern electrode of the mounting board C can be electrically connected by a wiring W and the rear electrode 121$g$. It should be appreciated that the LED element 121 is shown as a simplified shape in this drawing for facilitating the understanding.

With this configuration, the LED element 121 can emit blue light and the blue light enters the wavelength conversion layer 122 so as to excite the wavelength conversion material contained in the wavelength conversion layer 122, whereby the wavelength conversion layer 122 can emit, for example, yellow light. The blue light that does not excite the wavelength conversion layer 122 and passes through the layer 122 and the yellow light from the layer 122 can be mixed to produce white light (pseudo white light). Accordingly, the light source 120 can emit white light or function as a white light source. The wavelength conversion layer 122 can be combined with the afore-mentioned type of LED element.

The luminance distribution can be formed on the light emission surface of the LED element 121 (see FIG. 26C). Namely, the luminance distribution taken along the vertical cross sectional direction (along narrow width side) can be formed such that a peak appears in the vicinity of the n electrode 121$f$ (on the side of the n electrode 121$f$) and gradually decreases from the n electrode 121$f$ toward the other long side (see FIG. 26C) while the light emission surface of the LED element 121 can show a constant luminance distribution when taken along the horizontal cross sectional direction (longitudinal direction).

FIG. 26C shows one example of the luminance distribution in the direction along the vertical cross section of the light emission surface of the LED element 121. The LED element 121 can provide the above mentioned luminance distribution having a peak in the vicinity of the n electrode 121f (the maximum peak portion is positioned on the side of the n electrode 121f) as shown in FIG. 26C.

The LED element with the conventional electrode configuration shows the luminance distribution as shown in the upper graph of FIG. 4 that has a luminance peak at its chip center. Accordingly, in order to comply with the required light distribution condition, the half of the light emission area is cut, resulting in waste of light (as shown in the lower graph of FIG. 4).

In contrast, the LED element 121 of the present exemplary embodiment can show the luminance distribution having a luminance peak in the vicinity of the n electrode 121f (the maximum luminance portion is disposed on the side of the n electrode 121f) as shown in FIG. 26C. Accordingly, part of the light emitted from the LED element need not be cut, but the light emission state of the LED element 121 with the above luminance distribution can be utilized as is, thereby being capable of forming the light distribution pattern P suitable for a low beam. Namely, without cutting part of the light, the portion on the side of the n electrode 121f (portion where the luminance peak is located in the luminance distribution) can be disposed at a position corresponding to the maximum luminance portion in the light distribution pattern. In this manner, it is possible to also dispose the luminance gradation portion to the required light distribution. This can improve the light utilization efficiency.

As described above, since the LED element 121 of the present exemplary embodiment can have the above specific electrode structure, the luminance distribution on the rectangular light emission surface can be formed such that a peak appears in the vicinity of the n electrode 121f (the maximum luminance portion is disposed on the side of the n electrode 121f) and gradually decreases from the n electrode 121f toward the other long side (see FIG. 26C) in the vertical cross sectional direction while the light emission surface of the LED element 121 can show a constant luminance distribution when taken along the horizontal cross sectional direction, thereby forming a luminance distribution suitable for a light distribution pattern for a headlamp.

Further, the LED element 121 being a single horizontally long LED element can form the light emission surface with more uniform luminance than the conventional lamp assembly that is composed of a plurality of LED elements arranged in line (see FIG. 1). It should be appreciated, as shown in FIG. 27, a plurality of LED element 121 with the electrode structure according to the presently disclosed subject matter can be arranged in line according to the desired luminance distribution.

When a horizontally long single LED element 121 is used, the wavelength conversion layer 122 can also has a horizontally long shape. Accordingly, when compared with the case where a plurality of conventional LED elements each covered with a corresponding wavelength conversion layer are arranged in line (like that shown in FIG. 1), the distribution of the phosphor particles is difficult to be uneven, thereby preventing the color unevenness, the luminance unevenness, and the like.

[Vehicle Lamp Assembly 110]

A description will now be given of the configuration of a vehicle lamp assembly 110 utilizing the light source 120 with the above configuration with reference to the accompanying drawings.

As shown in FIGS. 24A and 24B, the vehicle lamp assembly 110 can include the light source 120 disposed in the front side of a vehicle body, and a projection optical system having a reflector 131 and the like disposed in the rear of the light source 120.

The light source 120 with the above described structure of the presently disclosed subject matter can be disposed such that the n electrode 121f (or the luminance peak portion) side is positioned closer to the forefront side while the long side 121a2 far from the n electrode 121f side is positioned farther from the forefront side (namely, closer to the reflector 131). In addition, the light source 120 can be disposed such that the illumination direction of the light source 120 (or the light emission surface of the light source 120) is directed downward (see FIG. 24B).

The reflector 131 can be a revolved paraboloid having a focal point close to the light source 120. The reflector 131 can be disposed to cover a range from the side to the front of the light source 120 so as to allow the light from the light source 120 to impinge on the reflector 131. Namely, the reflector 131 can be disposed to face the light emission surface of the light source 120 (see FIGS. 24A and 24B). It should be noted that the reflector 131 can be composed of a plurality of small separated reflection regions, and is of a type so called "multi-reflector" in the present exemplary embodiment.

The reflector 131 can project a plurality of light source images P1 of the light emission surface of the light source 120 so that the image portion P1' corresponding to the n electrode 121f (luminance peak portion) can be disposed upper side when the image is projected onto the virtual vertical screen. Note that FIG. 24B shows only one light source image P1. The projection of the plurality of light source images P1 of the light source 120 can be controlled such that the respective image portions P1' of the light source images P1 corresponding to the n electrode 121f (luminance peak portion) are densely arranged in the horizontal direction and in the oblique direction (for example, by an angle of 15 degrees with respect to the horizontal direction) on the virtual vertical screen. This configuration including the plurality of light source images P1 can form the desired light distribution pattern P for a headlamp including a desired cut-off line (including the horizontal cut-off line CL1 and the oblique cut-off line CL2, see FIG. 11).

In the vehicle lamp assembly 110 of the present exemplary embodiment, the light source 120 and the reflector 131 can be arranged in the above described physical relationship (see FIGS. 24A and 24B). Accordingly, the respective image portions P1' of the light source images P1 corresponding to the n electrode 121f (luminance peak portion) can be densely arranged in the horizontal direction and in the oblique direction (for example, by an angle of 15 degrees with respect to the horizontal direction) on the virtual vertical screen. This configuration can form the desired light distribution pattern P, in particular, suitable for a low-beam, which can include the cut-off line (including the horizontal cut-off line CL1 and the oblique cut-off line CL2) with the maximum luminance distribution and have a gradation where the luminance distribution gradually decreases from the cut-off line to the lower side. The vehicle lamp assembly 110 with this configuration can provide an improved far-distance visibility (see FIG. 11).

Furthermore, in the vehicle lamp assembly 110 of the present exemplary embodiment, the LED element 121 can have the luminance distribution with the luminance peak portion at the n electrode 121f side (namely, the luminance peak portion is disposed on the side of the n electrode 121f side, see FIG. 26C). In the lamp assembly utilizing the conventional LED element, part of light is cut for forming a desired light distribution pattern (see FIG. 4). However, the vehicle lamp assembly 110 with the above configuration need not cut part of light from the LED element 121, but can utilize the light emission state as is of the LED element 121 with the above luminance distribution so as to form the light distribution pattern P for a low beam (see FIG. 11). Accordingly, the projection optical system can have the reflector 131 that is designed such that part of light from the LED element 121 is not cut and the plurality of images P1' corresponding to the luminance peak portion (the n electrode 121$f$ side) are densely arranged in the horizontal direction and in the oblique direction (for example, by an angle of 15 degrees with respect to the horizontal direction) in the light distribution pattern. Furthermore, the luminance gradation part can be matched to the desired light distribution pattern. The vehicle lamp assembly 110 of the present exemplary embodiment can improve the light utilization efficiency.

MODIFIED EXAMPLE 3-1

A description will next be given of Modified Example 3-1 of the vehicle lamp assembly 110 with reference to the drawings.

FIGS. 28A and 28B are a view illustrating an outer appearance of a vehicle lamp assembly 110 configured as Modified Example 3-1 and a vertical cross sectional view of the same, respectively.

As shown in FIGS. 28A and 28B, the vehicle lamp assembly 110 of Modified Example 3-1 can include a light source 120 disposed in the front side of a vehicle body and a projection optical system having a reflector 132 and the like disposed in the rear of the light source 120.

The light source 120 with the above described structure of the presently disclosed subject matter can be disposed such that the long side 121$a$2 far from the n electrode 121$f$ side is positioned closer to the forefront side while the n electrode 121$f$ (or the luminance peak portion) side is positioned farther from the forefront side (namely, closer to the reflector 131). In addition, the light source 120 can be disposed such that the illumination direction of the light source 120 (or the light emission surface of the light source 120) is directed upward (see FIG. 28B).

The reflector 132 can be a revolved paraboloid having a focal point close to the light source 120. The reflector 132 can be disposed to cover a range from the side to the front of the light source 120 so as to allow the light from the light source 120 to impinge on the reflector 131. Namely, the reflector 131 can be disposed to face the light emission surface of the light source 120 (see FIGS. 28A and 28B). It should be noted that the reflector 132 can be composed of a plurality of small separated reflection regions, and is of a type so called "multi-reflector" in the present exemplary embodiment.

As shown in FIG. 28B, the reflector 132 can project a plurality of light source images P1 of the light emission surface of the light source 120 so that the image portion P1' corresponding to the n electrode 121$f$ (luminance peak portion) can be disposed upper side when the image is projected onto the virtual vertical screen (not shown) assumed to be formed in front of the vehicle lamp assembly 110 and separated away from the same. Note that FIG. 28B shows only one light source image P1. The projection of the plurality of light source images P1 of the light source 120 can be controlled such that the respective image portions P1' of the light source images P1 corresponding to the n electrode 121$f$ (luminance peak portion) are densely arranged in the horizontal direction and in the oblique direction (for example, by an angle of 15 degrees with respect to the horizontal direction) on the virtual vertical screen. This configuration can form the desired light distribution pattern P for a headlamp including the cut-off line (including the horizontal cut-off line CL1 and the oblique cut-off line CL2, see FIG. 11) by the plurality of light source images P1.

In the vehicle lamp assembly 110 of the present Modified Example, the light source 120 and the reflector 132 can be arranged in the above described physical relationship (see FIGS. 28A and 28B). Accordingly, the respective image portions P1' of the light source images P1 corresponding to the n electrode 121$f$ (luminance peak portion) can be densely arranged in the horizontal direction and in the oblique direction (for example, by an angle of 15 degrees with respect to the horizontal direction) on the virtual vertical screen. This configuration can form the desired light distribution pattern P, in particular, suitable for a low-beam, which can include the cut-off line (including the horizontal cut-off line CL1 and the oblique cut-off line CL2) with the maximum luminance distribution and have a gradation where the luminance distribution gradually decreases from the cut-off line to the lower side. The vehicle lamp assembly 110 with this configuration can provide an improved far-distance visibility (see FIG. 11).

Furthermore, in the vehicle lamp assembly 110 of the present Modified Example, the LED element 121 can have the luminance distribution with the luminance peak at the n electrode 121$f$ side (namely, the maximum luminance portion is disposed on the side of the n electrode 121$f$, see FIG. 26C). In the lamp assembly utilizing the conventional LED element, part of light is cut for forming a desired light distribution pattern (see FIG. 4). However, the vehicle lamp assembly 110 with the above configuration need not cut part of light from the LED element 121, but can utilize the light emission state as is of the LED element 121 with the above luminance distribution so as to form the light distribution pattern P for a low beam (see FIG. 11). Accordingly, the projection optical system can have the reflector 132 that is designed such that part of light from the LED element 121 is not cut and the plurality of images P1' corresponding to the luminance peak portion (the n electrode side 121$f$) are densely arranged in the horizontal direction and in the oblique direction (for example, by an angle of 15 degrees with respect to the horizontal direction) in the light distribution pattern. Furthermore, the luminance gradation part can be matched to the desired light distribution pattern. The vehicle lamp assembly 110 of the present Modified Example can improve the light utilization efficiency.

MODIFIED EXAMPLE 3-2

A description will next be given of Modified Example 3-2 of the vehicle lamp assembly 110 with reference to the drawings.

Figure 29B:
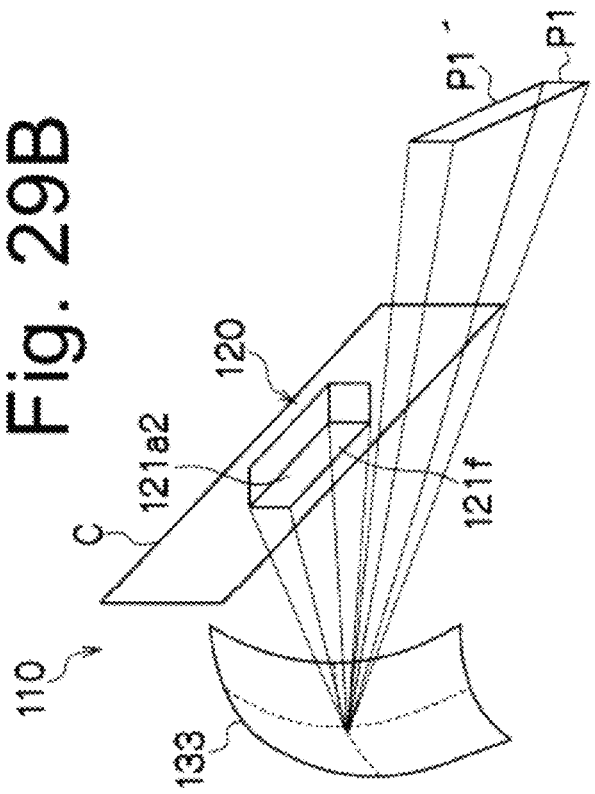
FIGS. 29A and 29B are a view illustrating an outer appearance of a vehicle lamp assembly configured as Modified Example 3-2 and a vertical cross sectional view of the same, respectively.
Figure 29A:
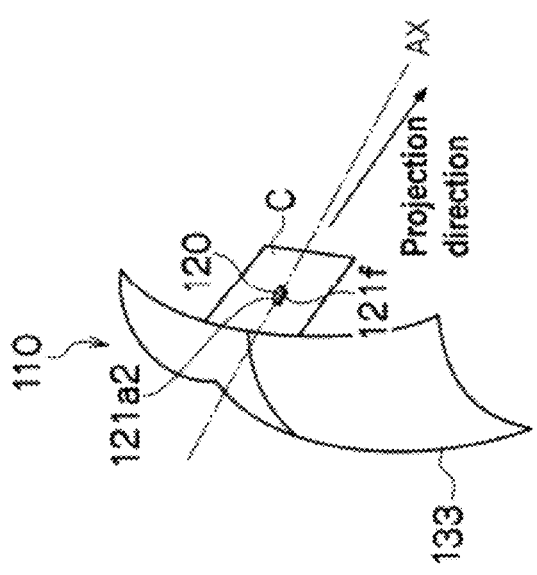

FIGS. 29A and 29B are a view illustrating an outer appearance of a vehicle lamp assembly 110 configured as Modified Example 3-2 and a vertical cross sectional view of the same, respectively.

As shown in FIGS. 29A and 29B, the vehicle lamp assembly 110 of Modified Example 3-2 can include a light source 120 disposed in the front side of a vehicle body and a projection optical system having a reflector 133 and the like disposed in the rear of the light source 120.

The light source 120 with the above described structure of the presently disclosed subject matter can be disposed such that the long side 121$a$2 far from the n electrode 121$f$ is positioned upward in the vertical direction while the n electrode 121$f$ (or the luminance peak portion) side is positioned downward in the vertical direction. In addition, the light source 120 can be disposed such that the illumination direction of the light source 120 (or the light emission surface of the light source 120) is directed substantially in the horizontal direction (namely, the light emission surface of the light source 120 is directed in the substantially vertical direction, see FIG. 29B).

The reflector 133 can be a revolved paraboloid having a focal point close to the light source 120. The reflector 133 can be disposed in front of the light source 120 so as to allow the light from the light source 120 to impinge on the reflector 133 (see FIGS. 29A and 29B). It should be noted that the reflector 133 can be composed of a plurality of small separated reflection regions, and is of a type so called "multi-reflector" in the present exemplary embodiment.

As shown in FIG. 29B, the reflector 133 can project a plurality of light source images P1 of the light emission surface of the light source 120 so that the image portion P1' corresponding to the n electrode 121*f* (luminance peak portion) can be disposed upper side when the image is projected onto the virtual vertical screen (not shown) assumed to be formed in front of the vehicle lamp assembly 110 and separated away from the same. Note that FIG. 29B shows only one light source image P1. The projection of the plurality of light source images P1 of the light source 120 can be controlled such that the respective image portions P1' of the light source images P1 corresponding to the n electrode 121*f* (luminance peak portion) are densely arranged in the horizontal direction and in the oblique direction (for example, by an angle of 15 degrees with respect to the horizontal direction) on the virtual vertical screen. This configuration can form the desired light distribution pattern P for a headlamp including the cut-off line (including the horizontal cut-off line CL1 and the oblique cut-off line CL2, see FIG. 11) by the plurality of light source images P1.

In the vehicle lamp assembly 110 of the present Modified Example, the light source 120 and the reflector 133 can be arranged in the above described physical relationship (see FIGS. 29A and 29B). Accordingly, the respective image portions P1' of the light source images P1 corresponding to the n electrode 121*f* (luminance peak portion) can be densely arranged in the horizontal direction and in the oblique direction (for example, by an angle of 15 degrees with respect to the horizontal direction) on the virtual vertical screen. This configuration can form the desired light distribution pattern P, in particular, suitable for a low-beam, which can include the cut-off line (including the horizontal cut-off line CL1 and the oblique cut-off line CL2) with the maximum luminance distribution and have a gradation where the luminance distribution gradually decreases from the cut-off line to the lower side. The vehicle lamp assembly 110 with this configuration can provide an improved far-distance visibility (see FIG. 11).

Furthermore, in the vehicle lamp assembly 110 of the present Modified Example, the LED element 121 can have the luminance distribution with the luminance peak at the n electrode 121*f* side (namely, the maximum luminance portion is disposed on the side of the n electrode 121*f*, see FIG. 26C). In the lamp assembly utilizing the conventional LED element, part of light is cut for forming a desired light distribution pattern (see FIG. 4). However, the vehicle lamp assembly 110 with the above configuration need not cut part of light from the LED element 121, but can utilize the light emission state as is of the LED element 121 with the above luminance distribution so as to form the light distribution pattern P for a low beam (see FIG. 11). Accordingly, the projection optical system can have the reflector 133 that is designed such that part of light from the LED element 121 is not cut and the plurality of images P1' corresponding to the luminance peak portion (the n electrode side 121*f*) are densely arranged in the horizontal direction and in the oblique direction (for example, by an angle of 15 degrees with respect to the horizontal direction) in the light distribution pattern. Furthermore, the luminance gradation part can be matched to the desired light distribution pattern. The vehicle lamp assembly 110 of the present Modified Example can improve the light utilization efficiency.

MODIFIED EXAMPLE 3-3

A description will next be given of Modified Example 3-3 of the vehicle lamp assembly 110 with reference to the drawings.

Figure 30:
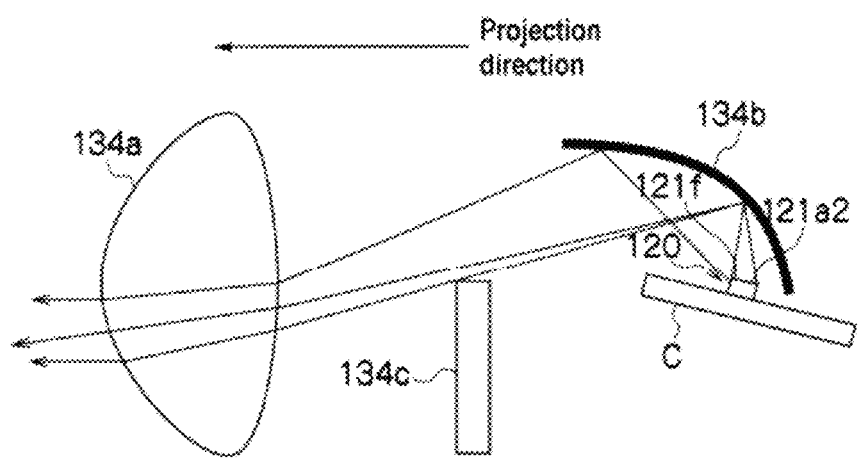
FIG. 30 is a vertical cross sectional view of a vehicle lamp assembly configured as Modified Example 3-3.

FIG. 30 is a vertical cross sectional view of a vehicle lamp assembly 110 configured as Modified Example 3-3.

As shown in FIG. 30, the vehicle lamp assembly 110 of the present Modified Example can include a projection lens 134*a* disposed in the front side of a vehicle body, a light source 120 disposed in the rear of the projection lens 134*a*, a reflector 134*b* disposed so as to cover the range from the side to the front of the light source 120 in order to allow the light from the light source 120 to impinge on the reflector 134*b* (namely, the reflector 134*b* faces the light source 120), a shade 134*c* disposed between the projection lens 134*a* and the light source 120, and the like. The projection lens 134*a*, the reflector 134*b*, and the shade 134*c* can constitute the projection optical system of the presently disclosed subject matter.

The light source 120 with the above described structure of the presently disclosed subject matter can be disposed such that the n electrode 121*f* (or the luminance peak portion) side is positioned closer to the forefront side while the long side 121*a*2 far from the n electrode 121*f* side is positioned farther from the forefront side. In addition, the light source 120 can be disposed such that the illumination direction of the light source 120 (or the light emission surface of the light source 120) is directed upward (see FIG. 30).

The reflector 134*b* can be a revolved elliptic surface having a first focal point close to the light source 120 and a second focal point close to the upper edge of the shade 134*c*. The reflector 134*b* can be disposed to cover the range from the side to the front of the light source 120 so as to allow the light from the light source 120 to impinge on the reflector 134*b*. Namely, the reflector 134*b* can be disposed to face the light emission surface of the light source 120 (see FIG. 30).

The reflector 134*b* can project a plurality of light source images P1 of the light emission surface of the light source 120 so that the image portion P1' corresponding to the n electrode 121*f* (luminance peak portion) can be disposed upper side when the image is projected onto the virtual vertical screen (not shown). The projection of the plurality of light source images P1 of the light source 120 can be controlled such that the respective image portions P1' of the light source images P1 corresponding to the n electrode 121*f* (luminance peak portion) are densely arranged in the horizontal direction and in the oblique direction (for example, by an angle of 15 degrees with respect to the horizontal direction) on the virtual vertical screen. This configuration can form the desired light distribution pattern P for a headlamp including a desired cut-off line (including the horizontal cut-off line CL1 and the oblique cut-off line CL2, see FIG. 11).

The shade 134*c* can be a shading member configured to form the cut-off line by shielding part of light reflected from the reflector 134*b*. The shade 134*c* can be disposed between the projection lens 134*a* and the light source 120 so that the upper edge thereof is positioned at or near the focal point of the projection lens 134*a*.

In the vehicle lamp assembly 110 of the present Modified Example, the light source 120 and the projection light system can be arranged in the above described physical relationship (see FIG. 30). Accordingly, the respective image portions P1' of the light source images P1 corresponding to the n electrode 121f (luminance peak portion) can be densely arranged in the horizontal direction and in the oblique direction (for example, by an angle of 15 degrees with respect to the horizontal direction) on the virtual vertical screen. This configuration can form the desired light distribution pattern P, in particular, suitable for a low-beam, which can include the cut-off line (including the horizontal cut-off line CL1 and the oblique cut-off line CL2) with the maximum luminance distribution and have a gradation where the luminance distribution gradually decreases from the cut-off line to the lower side. The vehicle lamp assembly 110 with this configuration can provide an improved far-distance visibility (see FIG. 11).

Furthermore, in the vehicle lamp assembly 110 of the present Modified Example, the LED element 121 can have the luminance distribution with the luminance peak at the n electrode 121f side (namely, the maximum luminance portion is disposed on the side of the n electrode 121f side, see FIG. 26C). In the lamp assembly utilizing the conventional LED element, part of light (approximately half thereof) is cut for forming a desired light distribution pattern (see FIG. 4). However, the vehicle lamp assembly 110 with the above configuration need not cut part of light from the LED element 121, but can utilize the light emission state as is of the LED element 121 with the above luminance distribution so as to form the light distribution pattern P for a low beam (see FIG. 11). Accordingly, the projection optical system can have the reflector 134b that is designed such that part of light from the LED element 121 is not cut and the plurality of images P1' corresponding to the luminance peak portion (the n electrode side 121f) are densely arranged in the horizontal direction and in the oblique direction (for example, by an angle of 15 degrees with respect to the horizontal direction) in the light distribution pattern. Furthermore, the luminance gradation part can be matched to the desired light distribution pattern. The vehicle lamp assembly 110 of the present Modified Example can improve the light utilization efficiency.

According to the vehicle lamp assembly 110 of the present Modified Example, the shade 134c can receive energy less than that in the lamp assembly utilizing a conventional LED element. Specifically, since the shade 134c can receive only part of light from the LED element 121 at the high luminance side, it is possible to reduce the amount of heat unnecessarily applied to the shade 134c.

MODIFIED EXAMPLE 3-4

A description will next be given of Modified Example 3-4 of the vehicle lamp assembly 110 with reference to the drawings.

Figure 31:
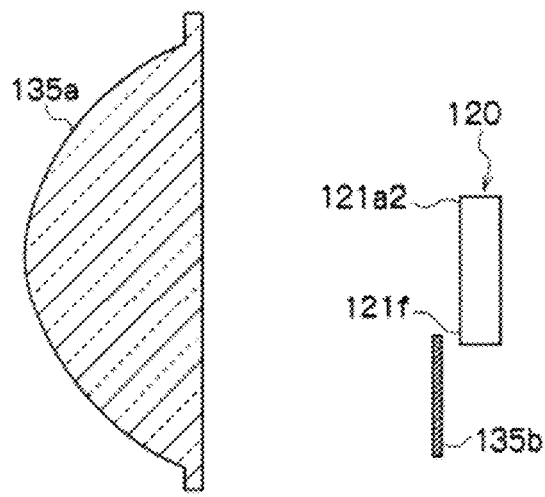
FIG. 31 is a vertical cross sectional view of a vehicle lamp assembly configured as Modified Example 3-4.

FIG. 31 is a vertical cross sectional view of a vehicle lamp assembly 110 configured as Modified Example 3-4.

As shown in FIG. 31, the vehicle lamp assembly 110 of the present Modified Example can include a projection lens 135a disposed in the front side of a vehicle body, a light source 120 disposed in the rear of the projection lens 135a, a shade 135b disposed between the projection lens 135a and the light source 120, and the like. The projection lens 135a and the shade 135b can constitute the projection optical system of the presently disclosed subject matter.

The light source 120 with the above described structure of the presently disclosed subject matter can be disposed such that the long side 121a2 far from the n electrode 121f side is positioned upward in the vertical direction while the n electrode 121f (or the luminance peak portion) side is positioned downward in the vertical direction. In addition, the light source 120 can be disposed such that the illumination direction of the light source 120 (or the light emission surface of the light source 120) is directed substantially in the horizontal direction (namely, the light emission surface of the light source 120 is directed in the substantially vertical direction, see FIG. 31).

The shade 135b can be a shading member configured to form the cut-off line by shielding part of light from the light source 120. The shade 135b can be disposed between the projection lens 135a and the light source 120 so that the upper edge thereof is positioned at or near the focal point of the projection lens 135a.

In the vehicle lamp assembly 110 of the present Modified Example, the light source 120 and the projection light system can be arranged in the above described physical relationship (see FIG. 31). Accordingly, the respective image portions P1' of the light source images P1 corresponding to the n electrode 121f (luminance peak portion) can be densely arranged in the horizontal direction and in the oblique direction (for example, by an angle of 15 degrees with respect to the horizontal direction) on the virtual vertical screen. This configuration can form the desired light distribution pattern P, in particular, suitable for a low-beam, which can include the cut-off line (including the horizontal cut-off line CL1 and the oblique cut-off line CL2) with the maximum luminance distribution and have a gradation where the luminance distribution gradually decreases from the cut-off line to the lower side. The vehicle lamp assembly 110 with this configuration can provide an improved far-distance visibility (see FIG. 11).

Furthermore, in the vehicle lamp assembly 110 of the present Modified Example, the LED element 121 can have the luminance distribution with the luminance peak at the n electrode 121f side (namely, the maximum luminance portion is disposed on the side of the n electrode 121f, see FIG. 26C). In the lamp assembly utilizing the conventional LED element, part of light (approximately half thereof) is cut for forming a desired light distribution pattern (see FIG. 4). However, the vehicle lamp assembly 110 with the above configuration need not cut part of light from the LED element 121, but can utilize the light emission state as is of the LED element 121 with the above luminance distribution so as to form the light distribution pattern P for a low beam (see FIG. 11). Accordingly, the projection optical system can have the projection optical system that is designed such that part of light from the LED element 121 is not cut and the plurality of images P1' corresponding to the luminance peak portion (the n electrode 121f side) are densely arranged in the horizontal direction and in the oblique direction (for example, by an angle of 15 degrees with respect to the horizontal direction) in the light distribution pattern. Furthermore, the luminance gradation part can be matched to the desired light distribution pattern. The vehicle lamp assembly 110 of the present Modified Example can improve the light utilization efficiency.

According to the vehicle lamp assembly 110 of the present Modified Example, the shade 135b can receive energy less than that in the lamp assembly utilizing a conventional LED element. Specifically, since the shade 135b can receive only part of light from the LED element 121 at the high luminance side, it is possible to reduce the amount of heat unnecessarily applied to the shade 135b.

MODIFIED EXAMPLE 4-1

Next, a description will be given of the structure of the LED element 121 according to Modified Example 4-1 with reference to the drawings. FIGS. 32A, 32B, and 32C are a front view (top plan view) of the LED element 121, a cross sectional view (side view) of the LED element 121, and a luminance distribution diagram of the LED element 121, in particular, its light emission surface when viewed along line B-B of FIG. 32A, respectively.

In the embodiment and the respective Modified Examples above, the n electrode 121*f* can be formed on the narrow region 121*a*1 including one long side on the surface of the n-type semiconductor layer 121*a* (see FIG. 26A). However, the presently disclosed subject matter is not limited thereto. For example, as shown in FIGS. 32A and 32B, an additional n electrode 121*f*2 can be formed so as to be connected to the n electrode 121*f* and extend in the same direction as the n electrode 121*f*. Specifically, as shown in FIGS. 32A and 32B, the additional n electrode 121*f*2 can be formed between one long side 121*a*2 and the other long side 121*a*4 on the surface of the n-type semiconductor layer 121*a* and can be connected to the n electrode 121*f* by an additional n electrode 121*f*3 extending in the vertical direction (or short side direction). In this case, the conduction wire for externally supplying power can be electrically connected to the n electrode 121*f*.

In the present Modified Example, the current supplied to the p electrode 121*d* can be uniformly diffused through the p electrode 121*d* because the p electrode 121*d* is formed over the substantially entire region of the p-type semiconductor layer 121*c*. On the other hand, since the current is likely to pass the shortest path, it may concentrate in the vicinity of the n electrode 121*f* (and the additional n electrode 121*f*2), and decrease gradually from the n electrode 121*f* in the vertical direction (narrow width direction) (current distribution substantially corresponding to the luminance distribution of FIG. 32C). Furthermore, the current supplied to the p electrode 121*d* can be diffused uniformly in the horizontal cross sectional direction due to the parallel arrangement of the n electrode 121*f* and the p electrode 121*d* (see FIG. 32B) so that a constant current distribution can be formed.

The current having such a distribution can activate the active layer 121*b* so that the active layer 121*b* can emit light. Accordingly, the light emission surface of the LED element 121 can provide a luminance distribution similar to the current distribution. Namely, the luminance distribution taken along the vertical cross sectional direction can be formed such that a peak appears in the vicinity of the n electrode 121*f* (meaning the maximum luminance portion appears on the side of the n electrode 121*f*) and gradually decreases from the n electrode 121*f* toward the farther side (see FIG. 32C) while the light emission surface of the LED element 121 can show a constant luminance distribution when taken along the horizontal cross sectional direction.

When the wavelength conversion layer 122 is disposed so as to cover the light emission surface of the LED element 121 according to the present Modified Example (see FIG. 25), a luminance distribution can be formed as shown in FIG. 32C such that a luminance peak appears in the vicinity of the n electrode 121*f* in the vertical cross sectional direction (namely, the maximum luminance portion is disposed on the side of the n electrode 121*f*) and gradually decreases from the n electrode 121*f* toward the other long side in the vertical direction (see FIG. 32C) while a constant luminance distribution can be formed when taken along the horizontal cross sectional direction. In this manner, the light source 120 with the above configuration can form the luminance distribution suitable for forming a desired light distribution pattern for a headlamp, for example.

Furthermore, the light source 120 including the LED element 121 according to the present Modified Example can have a similar luminance distribution to that of the light source 120 of the above exemplary embodiment, namely, the luminance distribution can have a luminance peak in the vicinity of the n electrode 121*f*. Accordingly, the light source 120 including the LED element 121 according to the present Modified Example can be applied to the vehicle lamp assembly 110 (see FIG. 24) and the respective vehicle lamp assemblies 110 of the Modified Examples 3-1 to 3-4 (see FIGS. 28 to 31).

It should be noted that the adjustment of the distance H1 between the n electrode 121*f* and the additional n electrode 121*f*2 (see FIG. 32A), the area and number of the additional n electrodes 121*f*2 and the like can control the target luminance distribution of the light emission surface of the LED element 121 (light source 120) in the direction along the vertical cross section (for example, the position, width and the like of the luminance peak portion).

In this case, the distance H1 between the n electrode 121*f* and the additional n electrode 121*f*2 (see FIG. 32A), the area and number of the additional n electrode 121*f*2 and the like can be adjusted to control the formed luminance distribution where the horizontal stripes including a plurality of peaks can be prevented from being generated.

MODIFIED EXAMPLE 4-2

Next, a description will be given of the structure of the LED element 121 according to Modified Example 4-2 with reference to the drawings. FIGS. 33A, 33B, and 33C are a front view (top plan view) of the LED element 121, a cross sectional view (side view) of the LED element 121, and a luminance distribution diagram of the LED element 121, in particular, its light emission surface when viewed along line C-C of FIG. 33A, respectively.

As shown in FIGS. 33A and 33B, a plurality of structural units 121*a*3 can be formed on the surface of the n-type semiconductor layer 121*a*. The structural unit 121*a*3 can be configured to extract light from the active layer 121*b* (direct light from the active layer 121*b* and the light reflected by the p electrode 121*d*), and is called as a micro-cone, for example. The structural unit 121*a*3 can be convex or concave with respect to the surface of the n-type semiconductor layer 121*a*.

For example, as shown in FIGS. 33A and 33B, an additional n electrode 121*f*2 can be formed along one long side 121*a*2 far from the n electrode 121*f* and extend in the same direction as the n electrode 121*f*, and can be connected to the n electrode 121*f* by an additional n electrode 121*f*3 extending in the vertical direction (or short side direction). Further, as shown in FIG. 33A, the plurality of structural units 121*a*3 can be formed so that the density of the structural units 121*a*3 is increased from the long side 121*a*2 far from the n electrode 121*f* toward the n electrode 121*f* (control by the number of the structural units). The size of the structural unit 121*a*3 can vary the light extraction efficiency, and accordingly, this size control can be utilized to adjust the luminance distribution.

The plurality of structural units 121*a*3 can be formed by, before the formation of the n electrode 121*f*, wet etching the upper surface (C surface) of the n-type semiconductor layer 121*a* that has been exposed by peeling off the sapphire substrate, for example immersing it in an alkaline solution including KOH or the like. During the wet etching, a mask having an open area ratio that is increased from the long side 121*a*2 far from the n electrode 121*f* toward the n electrode 121*f* can be utilized to form the plurality of structural units 121*a*3 the density of which is increased from the long side 121*a*2 far from the n electrode 121*f* toward the n electrode 121*f*. Further, when a plurality of stages are performed for the alkaline solution process, the immersion time in the alkaline solution for each stage can be controlled to adjust the size of the formed structural unit so that the structural unit with the larger size is formed from the long side 121*a*2 to the n electrode 121*f*.

When the micro-cone formation is performed, it is appropriate to form an alkaline-solution protection film in order to prevent the reaction between the KOH solution and the metal elements contained in the p-type electrode layer and bonding layer. The protection film can be removed after wet etching. It should be appreciated that dry etching can be utilized to form the plurality of structural units 121*a*3 instead of wet etching.

In the present Modified Example, the current supplied from the p electrode 121*d* to the n electrode 121*f* (including the additional n electrodes 121*f*2 and 121*f*3) can activate the active layer 121*b* so that the active layer 121*b* can emit light from its entire area. The light emitted from the active layer 121*b* can be taken out more from the n electrode 121*f* side where the plurality of structural units 121*a*3 are formed densely on the surface of the n-type semiconductor layer 121*a* than the thin area where the units 121*a*3 are formed with a low density. Accordingly, a luminance distribution on the light emission surface of the LED element 121 can have a luminance peak portion in the vicinity of the n electrode 121*f* in the vertical cross sectional direction, and decrease gradually from the n electrode 121*f* to the farther long side (see FIG. 33C). Furthermore, the light emission surface of the LED element 121 can show a constant luminance distribution when taken along the horizontal cross sectional direction.

When the wavelength conversion layer 122 is disposed so as to cover the light emission surface of the LED element 121 according to the present Modified Example (see FIG. 25), a luminance distribution can be formed as shown in FIG. 33C such that a luminance peak appears in the vicinity of the n electrode 121*f* in the vertical cross sectional direction (namely, the maximum luminance portion is disposed on the side of the n electrode 121*f*) and gradually decreases from the n electrode 121*f* toward the other long side in the vertical direction (see FIG. 33C) while a constant luminance distribution can be formed when taken along the horizontal cross sectional direction. In this manner, the light source 120 with the above configuration can form the luminance distribution suitable for forming a desired light distribution pattern for a headlamp, for example.

Furthermore, the light source 120 including the LED element 121 according to the present Modified Example can have a similar luminance distribution to that of the light source 120 of the above exemplary embodiment, namely, the luminance distribution can have a luminance peak in the vicinity of the n electrode 121*f*. Accordingly, the light source 120 including the LED element 121 according to the present Modified Example can be applied to the vehicle lamp assembly 110 (see FIG. 24) and the respective vehicle lamp assemblies 110 of the Modified Examples 3-1 to 3-4 (see FIGS. 28 to 31).

It should be noted that the adjustment of the density and size of the plurality of structural units 121*a*3 can control the target luminance distribution of the light emission surface of the LED element 121 (light source 120) in the direction along the vertical cross section (for example, the position, width and the like of the luminance peak portion).

MODIFIED EXAMPLE 4-3

Next, a description will be given of the structure of the LED element 121 according to Modified Example 4-3 with reference to the drawings. FIGS. 34A, 34B, and 34C are a front view (top plan view) of the LED element 121, a cross sectional view (side view) of the LED element 121, and a luminance distribution diagram of the LED element 121, in particular, its light emission surface when viewed along line D-D of FIG. 34A, respectively.

As shown in FIGS. 34A and 34B, the LED element 121 can include a plurality of additional n electrodes 121*f*2 connected to the n electrode 121*f* and extending in the same direction as the n electrode 121*f*.

For example, as shown in FIGS. 34A and 34B, a plurality of additional n electrodes 121*f*2 can be formed so that a distance between adjacent additional electrodes is decreased from the long side 121*a*2 far from the n electrode 121*f* toward the n electrode 121*f* (i.e., density). In addition, additional n electrodes 121*f*3 extending in the vertical direction (in the direction parallel to the short side) can be formed so that the plurality of additional n electrodes 121*f*2 are connected to the n electrode 121*f*.

According to the present Modified Example, the current supplied to the p electrode 121*d* can be uniformly diffused thereinside because the p electrode 121*g* is formed over the entire region of the p-type semiconductor layer 121*c*. On the other hand, since the current is likely to pass the shortest path, it may concentrate in the vicinity of the n electrode 121*f* (a peak appears on the side of the n electrode 121*f*) where the n electrode 121*f* and the plurality of additional n electrodes 121*f*2 are densely formed, and decrease gradually from the n electrode 121*f* to the other long side in the vertical direction (current distribution substantially corresponding to the luminance distribution of FIG. 34C). Furthermore, the current supplied to the p electrode 121*d* can form a constant current distribution in the horizontal cross sectional direction.

The current having such a distribution can activate the active layer 121*b* so that the active layer 121*b* can emit light. Accordingly, the light emission surface of the LED element 121 can provide a luminance distribution similar to the current distribution. Namely, the luminance distribution taken along the vertical cross sectional direction can be formed such that a peak appears in the vicinity of the n electrode 121*f* and gradually decreases from the n electrode 121*f* toward the farther side (see FIG. 34C) while the light emission surface of the LED element 121 can show a constant luminance distribution when taken along the horizontal cross sectional direction.

When the wavelength conversion layer 122 is disposed so as to cover the light emission surface of the LED element 121 according to the present Modified Example (see FIG. 25), a luminance distribution can be formed as shown in FIG. 34C such that a luminance peak appears in the vicinity of the n electrode 121*f* in the vertical cross sectional direction (namely, the maximum luminance portion is disposed on the side of the n electrode 121*f*) and gradually decreases from the n electrode 121*f* toward the other long side in the vertical direction (see FIG. 34C) while a constant luminance distribution can be formed when taken along the horizontal cross sectional direction. In this manner, the light source 120 with the above configuration can form the luminance distribution suitable for forming a desired light distribution pattern for a headlamp, for example.

Furthermore, the light source 120 including the LED element 121 according to the present Modified Example can have a similar luminance distribution to that of the light source 120 of the above exemplary embodiment, namely, the luminance distribution can have a luminance peak in the vicinity of the n electrode 121*f*. Accordingly, the light source 120 including the LED element 121 according to the present Modified Example can be applied to the vehicle lamp assembly 110 (see FIG. 24) and the respective vehicle lamp assemblies 110 of the Modified Examples 3-1 to 3-4 (see FIGS. 28 to 31).

It should be noted that the adjustment of the distance between the additional n electrodes 121f2, the area and number of the additional n electrodes 121f2 and the like can control the target luminance distribution of the light emission surface of the LED element 121 (light source 120) in the direction along the vertical cross section (for example, the position, width and the like of the luminance peak portion).

MODIFIED EXAMPLE 4-4

Next, a description will be given of the structure of the LED element 121 according to Modified Example 4-4 with reference to the drawings. FIGS. 35A, 35B, 35C, and 35D are a front view (top plan view) of the LED element 121, a front view of the p electrode 121d, a cross sectional view (side view) of the LED element 121, and a luminance distribution diagram of the LED element 121, in particular, its light emission surface when viewed along line E-E of FIG. 35A, respectively.

As shown in FIGS. 35A and 35C, the LED element 121 can include a plurality of additional n electrodes 121f2 extending in the same direction as the n electrode 121f. Further, as shown in FIGS. 35B and 35C, the p electrode 121d can include a plurality of high reflectance electrodes 121d1 extending in the same direction as the n electrode 121f (corresponding to first reflectance electrodes) and a plurality of low reflectance electrodes 121d2 extending in the same direction as the n electrode 121f (second reflectance electrodes). The high reflectance electrode 121d1 can be an electrode made of a high reflectance metal material with respect to blue light (for example, made of 100% Al). The low reflectance electrode 121d2 can be an electrode made of a relatively-low reflectance metal material compared with the high reflectance electrode 121d1 (for example, made of 80% Al).

Furthermore, as shown in FIGS. 35A and 35C, a plurality of additional n electrodes 121f2 can be formed in addition to the n electrode 121f so that the distance between the adjacent electrodes is equal to each other. The plurality of additional n electrodes 121f2 and the n electrode 121f can be connected by additional n electrodes 121f3 extending in the vertical direction.

Furthermore, as shown in FIGS. 35B and 35C, in the layer where the p electrode 121d is formed, the low reflectance electrode 121d2 can be formed so that a distance between adjacent low reflectance electrodes 121d2 is decreased from the n electrode 121f toward the long side 121a2 (i.e., density).

According to the present Modified Example, the p electrode 121d can be composed of the high reflectance electrodes 121d1 and the low reflectance electrodes 121d2, and a current flowing from the p electrode 121d to the n electrode 121f (also the additional n electrodes 121f2 and 121f3) can activate the active layer 121b so that the active layer 121b can emit light over the entire area. The light emitted from the active layer 121b can be taken out more in the area in the vicinity of the n electrode 121f where the high reflectance electrode 121d1 with a larger vertical width is formed (namely, where the low reflectance electrodes 121d2 are not densely disposed) than the other area where the low reflectance electrodes 121d2 are densely disposed. By controlling the reflection light, a luminance distribution can be formed on the light emission surface of the LED element 121 (in the vertical cross sectional direction) so as to have a luminance peak on the side of the n electrode 121f and decrease gradually from the n electrode 121f to the other long side in the vertical direction (see FIG. 35D). Furthermore, a constant luminance distribution can be formed in the horizontal cross sectional direction of the light emission surface of the LED element 121.

When the wavelength conversion layer 122 is disposed so as to cover the light emission surface of the LED element 121 according to the present Modified Example (see FIG. 25), a luminance distribution can be formed as shown in FIG. 35D such that a luminance peak appears in the vicinity of the n electrode 121f in the vertical cross sectional direction (namely, the maximum luminance portion is disposed on the side of the n electrode 121f) and gradually decreases from the n electrode 121f toward the other long side in the vertical direction (see FIG. 35D) while a constant luminance distribution can be formed when taken along the horizontal cross sectional direction. In this manner, the light source 120 with the above configuration can form the luminance distribution suitable for forming a desired light distribution pattern for a headlamp, for example.

Furthermore, the light source 120 including the LED element 121 according to the present Modified Example can have a similar luminance distribution to that of the light source 120 of the above exemplary embodiment, namely, the luminance distribution can have a luminance peak in the vicinity of the n electrode 121f. Accordingly, the light source 120 including the LED element 121 according to the present Modified Example can be applied to the vehicle lamp assembly 110 (see FIG. 24) and the respective vehicle lamp assemblies 110 of the Modified Examples 3-1 to 3-4 (see FIGS. 28 to 31).

It should be noted that the adjustment of the vertical size (vertical width) of the respective high and low reflectance electrodes 121d1 and 121d2 and the like can control the target luminance distribution of the light emission surface of the LED element 121 (light source 120) in the direction along the vertical cross section (for example, the position, width and the like of the luminance peak portion).

Further, the Modified Example 4-4 can be combined with the other Modified Examples to form different LED elements 121.

MODIFIED EXAMPLE 4-5

Next, a description will be given of the structure of the LED element 121 according to Modified Example 4-5 with reference to the drawings. FIGS. 36A, 36B, and 36C are a front view (top plan view) of the LED element 121, a cross sectional view (side view) of the LED element 121, and a luminance distribution diagram of the LED element 121, in particular, its light emission surface when viewed along line F-F of FIG. 36A, respectively.

As shown in FIGS. 36A and 34B, the LED element 121 can include a plurality of transparent conductive films 121B with a high refractive index (corresponding to the first transparent conductive film) extending in the same direction as the n electrode 121f, and a transparent conductive film 121A with a low refractive index (corresponding to the second transparent conductive film) covering the plurality of transparent conductive films 121B and the surface between the transparent conductive films 121B.

For example, as shown in FIG. 36B, the overlapping area between the transparent conductive films 121A and 121B can be formed on the surface of the n-type semiconductor layer 121a such that the vertical dimension of the overlapping area becomes larger toward the n electrode 121f side from the long side 121a2.

These transparent conductive films 121A and 121B can be formed after the peeling off of the sapphire substrate, by the following processes. First, the sapphire substrate is peeled off to expose the surface of the n-type semiconductor layer 121a. Then, the transparent conductive films 121B made of, for example, an ITO film can be formed partly by sputtering. Then, the transparent conductive film 121A made of, for example, a ZnO film can be formed over the surface of the n-type semiconductor layer 121a and the ITO films 121B. According to the adjustment of the film formation conditions, the ZnO film with a refractive index of 2.0 to 2.1 and the ITO film with a refractive index of 2.2 to 2.3 can be obtained. Note that the ITO film and the ZnO film can make ohomic contact with the n-type semiconductor layer 121a made of GaN with a refractive index of approximately 2.7. Next, the n electrode 121f is formed on the transparent conductive film 121A (the surface of the ZnO film).

In this manner, the transparent conductive films 121A and 121A can be formed on the surface of the n-type semiconductor layer 121a.

According to the present Modified Example, a current flowing from the p electrode 121d to the n electrode 121f (and the transparent conductive films 121A and 121B) can activate the active layer 121b so that the active layer 121b can emit light over the entire area. The light emitted from the active layer 121b can be taken out more from the n electrode 121a side where the transparent conductive films 121A and 121B are overlapped with each other in a large area than the other long side where the overlapped area is small. This is because the total reflection amount from the boundary formed between the LED element 121 and the outer environment (resin, air, and the like) is made smaller in the area where the transparent conductive films 121A and 121B are overlapped than in the area where only the transparent conductive film 121A is formed. Accordingly, a luminance distribution on the light emission surface of the LED element 121 can have a luminance peak portion in the vicinity of the n electrode 121f in the vertical cross sectional direction, and decrease gradually from the n electrode 121f to the farther long side (see FIG. 36C). Furthermore, the light emission surface of the LED element 121 can show a constant luminance distribution when taken along the horizontal cross sectional direction. The luminance distribution in the vertical cross sectional direction can be substantially equal to that shown in FIG. 36C.

When the wavelength conversion layer 122 is disposed so as to cover the light emission surface of the LED element 121 according to the present Modified Example (see FIG. 25), a luminance distribution can be formed as shown in FIG. 36C such that a luminance peak appears in the vicinity of the n electrode 121f in the vertical cross sectional direction (namely, the maximum luminance portion is disposed on the side of the n electrode 121f) and gradually decreases from the n electrode 121f toward the other long side in the vertical direction (see FIG. 36C) while a constant luminance distribution can be formed when taken along the horizontal cross sectional direction. In this manner, the light source 120 with the above configuration can form the luminance distribution suitable for forming a desired light distribution pattern for a headlamp, for example.

Furthermore, the light source 120 including the LED element 121 according to the present Modified Example can have a similar luminance distribution to that of the light source 120 of the above exemplary embodiment, namely, the luminance distribution can have a luminance peak in the vicinity of the n electrode 121f. Accordingly, the light source 120 including the LED element 121 according to the present Modified Example can be applied to the vehicle lamp assembly 110 (see FIG. 24) and the respective vehicle lamp assemblies 110 of the Modified Examples 3-1 to 3-4 (see FIGS. 28 to 31).

It should be noted that the adjustment of the vertical dimension (vertical width) of the overlapping areas of the transparent conductive films 121A and 121B can control the target luminance distribution of the light emission surface of the LED element 121 (light source 120) in the direction along the vertical cross section (for example, the position, width and the like of the luminance peak portion).

A description will now be made below to vehicle lamp assemblies of the presently disclosed subject matter with reference to the accompanying drawings in accordance with still other exemplary embodiments.

A vehicle lamp assembly 210 made in accordance with the principles of the presently disclosed subject matter can be suitable for a headlamp to be arranged on either side of the front portion of a vehicle body.

Figure 38:
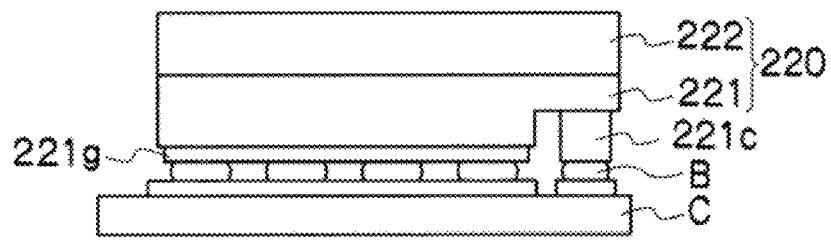
FIG. 38 is a schematic cross sectional view showing a light source for use in the vehicle lamp assembly in FIGS. 37A and 37B.

FIGS. 37A and 37B are a view illustrating an outer appearance of the vehicle lamp assembly 210 and a vertical cross sectional view of the vehicle lamp assembly 210, respectively. FIG. 38 is a schematic cross sectional view showing a light source 220 for use in the vehicle lamp assembly 210.

As shown in FIGS. 37A and 37B, the vehicle lamp assembly 210 can include a light source 220, a projection optical system 230, and the like components similarly to the vehicle lamp assembly 10 shown in FIGS. 5A and 5B. The light source 220 can include an LED element 221 and a wavelength conversion layer 222. The wavelength conversion layer 222 can be arranged to cover the light emission surface of the LED element 221. Since the present exemplary embodiment is different from the vehicle lamp assembly 10 in the LED element 221 of the light source 220, a description will be given of this difference.

[Structure of LED Element 221]

First, a description will be given of the structure of the LED element 221. FIGS. 39A, 39B, 39C and 39D are a front view (top plan view) of the LED element 221, a rear side view of the LED element 221, a cross sectional view (side view) of the LED element 221, and a luminance distribution diagram of the LED element 221, in particular, its light emission surface when viewed along line A-A of FIG. 39A, respectively.

The LED element 221 can be an LED element of a flip chip type (so-called as a FC type) that can have a substrate (for example, a sapphire substrate) and is mounted on a board such that the substrate is positioned at the uppermost side, thereby taking out blue light from the substrate side. The LED element 221 can have a rectangular light emission surface in a plan view (see FIG. 39A). The LED element 221 of the present exemplary embodiment can be configured to have a larger light emission surface with about 500 to 1200 μM (height (vertical width) H in a direction parallel to the short side) and about 4 to 5 mm (horizontal width W in a longitudinal direction or a direction parallel to the long side) (see FIG. 39A).

As shown in FIG. 39B, the LED element 221 can be configured to include a rectangular substrate 221a, an n-type semiconductor layer 221b formed on the surface of the substrate 221a, an n electrode 221c formed on a narrow region 221b1 including the second long side of the n-type semiconductor layer 221b and extending in the direction parallel to the long side, an active layer 221d formed on the n-type semiconductor layer 221b between the first long side (or the long side far from the n electrode 221c) and the n electrode 221c, a p-type semiconductor layer 221e formed between the first and second long sides on the active layer 221d, a transparent electrode 221f formed between the first and second long sides on the p-type semiconductor layer 221e, and p electrode 221g formed between the first and second long sides on the transparent electrode 221f.

The substrate 221a can be a single crystalline substrate such as a sapphire substrate having a transparency to blue light.

The n-type semiconductor layer 221b can be a nitride semiconductor layer such as an n-GaN layer. The n electrode 221c can be an electrode including a pad 221c1 to be connected to a wiring pattern on a board via a bump, for example. Note that the pad 221c1 is an optional component and the number thereof may be determined as needed. The active layer 221d can be a light emission layer such as an InGaN layer. The p-type semiconductor layer 221e can be a nitride semiconductor layer such as a p-GaN layer. The transparent electrode 221f can be a thin transparent electrode with a low resistance made of such as AuNi or ITO. The transparent electrode 221f can be used in order to compensate for the current diffusion in the p-type semiconductor layer 221e with a higher resistivity than the n-type semiconductor layer 221b. The p electrode 221g can be an electrode that has a high reflectance with respect to blue light, for example, and so-called as a reflection electrode. The p electrode 221g can be formed over the substantially entire region from the one long side to the other long side on the surface of the transparent electrode 221f (see FIG. 39B). Because of the reflection action of the p electrode 121d, the LED element 221 of the present exemplary embodiment can provide an improved output when compared with the face-up type LED element that utilizes a transparent electrode. In the LED element 321 of the present exemplary embodiment, the p electrode 221g can be a large sized one having a high heat dissipation efficiency. Accordingly, when compared with the face-up type LED element that uses the transparent electrode, the adverse effect of the heat generated by the LED element 221 due to a large amount of supplied current (such as deterioration of luminance) can be prevented or relieved. Suppose the case where the lamp assembly is utilized for a headlamp. In this case, the LED element 221 can be connected to a circuit for supplying the element with a constant current (a forward current of 1 to 5 A with a current density of 35 A/cm$^2$ or larger) controlled by a DC-DC converter and the like. For example, such a circuit may be a constant current circuit (not shown). This circuit can supply the LED element 221 with a current with a certain current density for forming the following current distribution. The current from the circuit can flow through the p electrode 221g, the transparent electrode 221f, the p-type semiconductor layer 221e, the active layer 221d, the n-type semiconductor layer 221b and the n electrode 221c, thereby causing the active layer 221d to emit blue light. The blue light can be emitted directly through the substrate 221a upward or by being reflected by the p electrode 221g as shown in FIG. 39C.

The current supplied to the p electrode 221g can be diffused uniformly through the p electrode 221g because the p electrode 221g and the transparent electrode 221f are formed over the substantially entire region of the p-type semiconductor layer 221e. On the other hand, since the current is likely to pass the shortest path, it may concentrate in the vicinity of the n electrode 221c (a peak appears on the side of the n electrode 221c), and decrease gradually from the n electrode 221c to the other long side in the vertical direction (narrow width direction) (current distribution substantially corresponding to the luminance distribution of FIG. 39D). Furthermore, the current supplied to the p electrode 221g can form a constant current distribution in the horizontal cross sectional direction because the n electrode 221c and the p electrode 221g are disposed in parallel to each other.

The current having such a distribution can activate the active layer 221d so that the active layer 221d can emit light. Accordingly, the light emission surface of the LED element 221 can provide a luminance distribution similar to the current distribution. Namely, the luminance distribution taken along the vertical cross sectional direction can be formed such that a peak appears in the vicinity of the n electrode 221c (meaning the maximum luminance portion appears on the side of the n electrode 221c) and gradually decreases from the n electrode 221c toward the farther long side (see FIG. 39D) while the light emission surface of the LED element 221 can show a constant luminance distribution when taken along the horizontal cross sectional direction. The luminance distribution appearing on the light emission surface of the LED element 221 can include a single luminous peak nearer the one long side (second long side) than the center area between the first long side and the second long side.

It should be noted that the adjustment of the thickness of the transparent electrode 221f, the areas of the respective electrodes 221c, 221f, and 221g, the distance between the electrodes 221c and 221g, and the like can control the target luminance distribution of the light emission surface of the LED element 221 (light source 220) in the direction along the vertical cross section (for example, the position, width and the like of the luminance peak).

[Production Method of LED Element 221]

A description will next be given of a method for producing the LED element 221 as one example, to which the presently disclosed subject matter is not limited.

First, a sapphire substrate 221a is prepared, and the respective semiconductor layers including the n-type semiconductor layer 221b, the active layer 221d, the p-type semiconductor layer 221e, and the like can be grown by epitaxial growth method.

Specifically, the growth of the semiconductor layers will be described in order. The sapphire substrate 221a is transferred to an MOCVD device, and subjected to thermal cleaning in a hydrogen atmosphere at 1000° C. for 10 minutes. Specifically, TMG and $NH_3$ are supplied to form a buffer layer (not shown) composed of GaN layer. Then, TMG, $NH_3$, and $SiH_4$ which serves as a dopant gas are supplied to form the n-type semiconductor layer 221b composed of n-type GaN layer. Next, the active layer 221d is formed on the n-type semiconductor layer 221b. In the present example, the active layer 221d is configured to include a multiple quantum well structure composed of InGaN/GaN. Specifically, assume that InGaN/GaN is formed in one cycle, and then the active layer 221d is formed by performing the process for five cycles. More specifically, TMG, TMI, and $NH_3$ are supplied to form an InGaN well layer, and then TMG and $NH_3$ are supplied to form a GaN barrier layer. These processes are repeated for five cycles to form the active layer 221d. Next, TMG, TMA, $NH_3$, and $CP_2Mg$ (bis-cyclopentadienyl Mg) which serves as a dopant are supplied to form a p-type AlGaN cladding layer (not shown). Then, TMG, $NH_3$, and $CP_2Mg$ (bis-cyclopentadienyl Mg) as a dopant are supplied to form the p-type semiconductor layer 221e composed of p-type GaN layer.

Then, dry etching is performed above the wafer to expose part of the n-type semiconductor layer 221b (n-type GaN layer). A resist pattern for covering the exposed portions 221b1 of the n-type semiconductor layer 221b (n-type GaN layer) is newly formed by photolithography. Then, the transparent electrode 221f made of ITO is formed so as to cover the p-type semiconductor layer 221e. Next, an electron beam evaporation method is carried out to form the reflective electrode 221g. The reflective electrode 221g can be a multi-layered film composed of Ag/Ti/Pt/Au, for example. The reflective electrode 221g may be formed by a resistive heat evaporation method. Then, the resist pattern can be removed.

Next, the n electrode 221c made of TiAu is formed on the exposed surface 221b1 of the n-type semiconductor layer 221b (n-type GaN layer). When a pad or an electrode 221c is to be formed, masks are formed by photolithography at the regions where the pad or the electrode 221c is formed. After the formation of the pad or electrode 221c, the masks are removed by a remover.

In this manner, the LED element 221 is completed.

[Wavelength Conversion Layer 222]

The wavelength conversion layer 222 can be arranged so as to cover the light emission surface of the LED element 221. FIG. 38 shows one exemplary embodiment including an LED element 221 mounted on a mounting board C such as a ceramic or silicon substrate and a wavelength conversion layer 222 arranged so as to cover the light emission surface of the LED element 221. Note that the p electrode 221g and the n electrode 221c of the LED element 221 and the pattern electrode of the mounting board C can be electrically connected by bumps or the like. It should be appreciated that the LED element 221 is shown as a simplified shape in this drawing for facilitating the understanding.

With this configuration, the LED element 221 can emit blue light and the blue light enters the wavelength conversion layer 222 so as to excite the wavelength conversion material contained in the wavelength conversion layer 222, whereby the wavelength conversion layer 222 can emit, for example, yellow light. The blue light that does not excite the wavelength conversion layer 222 and passes through the layer 222 and the yellow light from the layer 222 can be mixed to produce white light (pseudo white light). Accordingly, the light source 220 can emit white light or function as a white light source. The wavelength conversion layer 122 can be combined with the afore-mentioned type of LED element.

The luminance distribution can be formed on the light emission surface of the LED element 221 (see FIG. 39D). Namely, the luminance distribution taken along the vertical cross sectional direction (along narrow width side) can be formed such that a peak appears in the vicinity of the n electrode 221c (on the side of the n electrode 221c) and gradually decreases from the n electrode 221c toward the other long side (see FIG. 39D) while the light emission surface of the LED element 221 can show a constant luminance distribution when taken along the horizontal cross sectional direction (longitudinal direction).

FIG. 39D shows one example of the luminance distribution in the direction along the vertical cross section of the light emission surface of the LED element 221. The LED element 221 can provide the above mentioned luminance distribution having a peak in the vicinity of the n electrode 221c (the maximum peak portion is positioned on the side of the n electrode 221c) as shown in FIG. 39C.

The LED element with the conventional electrode configuration shows the luminance distribution as shown in the upper graph of FIG. 4 that has a luminance peak at its chip center. Accordingly, in order to comply with the required light distribution condition, the half of the light emission area is cut, resulting in waste of light (as shown in the lower graph of FIG. 4).

In contrast, the LED element 221 of the present exemplary embodiment can show the luminance distribution having a luminance peak in the vicinity of the n electrode 221c (the maximum luminance portion is disposed on the side of the n electrode 221c) as shown in FIG. 39D. Accordingly, part of the light emitted from the LED element need not be cut, but the light emission state of the LED element 221 with the above luminance distribution can be utilized as is, thereby being capable of forming the light distribution pattern P suitable for a low beam. Namely, without cutting part of the light, the portion on the side of the n electrode 221c (portion where the luminance peak is located in the luminance distribution) can be disposed at a position corresponding to the maximum luminance portion in the light distribution pattern. In this manner, it is possible to also dispose the luminance gradation portion to the required light distribution. This can improve the light utilization efficiency.

As described above, since the LED element 221 of the present exemplary embodiment can have the above specific electrode structure, the luminance distribution on the rectangular light emission surface can be formed such that a peak appears in the vicinity of the n electrode 221c (the maximum luminance portion is disposed on the side of the n electrode 221c) and gradually decreases from the n electrode 221c toward the other long side (see FIG. 39D) in the vertical cross sectional direction while the light emission surface of the LED element 221 can show a constant luminance distribution when taken along the horizontal cross sectional direction, thereby forming a luminance distribution suitable for a light distribution pattern for a headlamp.

Further, the LED element 221 being a single horizontally long LED element can form the light emission surface with more uniform luminance than the conventional lamp assembly that is composed of a plurality of LED elements arranged in line (see FIG. 1). It should be appreciated, as shown in FIG. 40, a plurality of LED element 221 with the electrode structure according to the presently disclosed subject matter can be arranged in line according to the desired luminance distribution.

When a horizontally long single LED element 221 is used, the wavelength conversion layer 222 can also has a horizontally long shape. Accordingly, when compared with the case where a plurality of conventional LED elements each covered with a corresponding wavelength conversion layer are arranged in line (like that shown in FIG. 1), the distribution of the phosphor particles is difficult to be uneven, thereby preventing the color unevenness, the luminance unevenness, and the like.

[Vehicle Lamp Assembly 210]

A description will now be given of the configuration of a vehicle lamp assembly 210 utilizing the light source 220 with the above configuration with reference to the accompanying drawings.

As shown in FIGS. 37A and 37B, the vehicle lamp assembly 210 can include the light source 220 disposed in the front side of a vehicle body, and a projection optical system having a reflector 231 and the like disposed in the rear of the light source 220.

The light source 220 with the above described structure of the presently disclosed subject matter can be disposed such that the n electrode 221c (or the luminance peak portion) side is positioned closer to the forefront side while the long side 221a2 far from the n electrode 221c side is positioned farther from the forefront side (namely, closer to the reflector 231). In addition, the light source 220 can be disposed such that the illumination direction of the light source 220 (or the light emission surface of the light source 220) is directed downward (see FIG. 37B).

The reflector 231 can be a revolved paraboloid having a focal point close to the light source 220. The reflector 231 can be disposed to cover a range from the side to the front of the light source 220 so as to allow the light from the light source 220 to impinge on the reflector 231. Namely, the reflector 231 can be disposed to face the light emission surface of the light source 220 (see FIGS. 37A and 37B). It should be noted that the reflector 231 can be composed of a plurality of small separated reflection regions, and is of a type so called "multi-reflector" in the present exemplary embodiment.

The reflector 231 can project a plurality of light source images P1 of the light emission surface of the light source 220 so that the image portion P1' corresponding to the n electrode 221c (luminance peak portion) can be disposed upper side when the image is projected onto the virtual vertical screen. Note that FIG. 37B shows only one light source image P1. The projection of the plurality of light source images P1 of the light source 220 can be controlled such that the respective image portions P1' of the light source images P1 corresponding to the n electrode 221c (luminance peak portion) are densely arranged in the horizontal direction and in the oblique direction (for example, by an angle of 15 degrees with respect to the horizontal direction) on the virtual vertical screen. This configuration including the plurality of light source images P1 can form the desired light distribution pattern P for a headlamp including a desired cut-off line (including the horizontal cut-off line CL1 and the oblique cut-off line CL2, see FIG. 11).

In the vehicle lamp assembly 210 of the present exemplary embodiment, the light source 220 and the reflector 231 can be arranged in the above described physical relationship (see FIGS. 37A and 37B). Accordingly, the respective image portions P1' of the light source images P1 corresponding to the n electrode 221c (luminance peak portion) can be densely arranged in the horizontal direction and in the oblique direction (for example, by an angle of 15 degrees with respect to the horizontal direction) on the virtual vertical screen. This configuration can form the desired light distribution pattern P, in particular, suitable for a low-beam, which can include the cut-off line (including the horizontal cut-off line CL1 and the oblique cut-off line CL2) with the maximum luminance distribution and have a gradation where the luminance distribution gradually decreases from the cut-off line to the lower side. The vehicle lamp assembly 210 with this configuration can provide an improved far-distance visibility (see FIG. 11).

Furthermore, in the vehicle lamp assembly 210 of the present exemplary embodiment, the LED element 221 can have the luminance distribution with the luminance peak portion at the n electrode 221c side (namely, the luminance peak portion is disposed on the side of the n electrode 221c side, see FIG. 37D). In the lamp assembly utilizing the conventional LED element, part of light is cut for forming a desired light distribution pattern (see FIG. 4). However, the vehicle lamp assembly 210 with the above configuration need not cut part of light from the LED element 221, but can utilize the light emission state as is of the LED element 221 with the above luminance distribution so as to form the light distribution pattern P for a low beam (see FIG. 11). Accordingly, the projection optical system can have the reflector 231 that is designed such that part of light from the LED element 221 is not cut and the plurality of images P1' corresponding to the luminance peak portion (the n electrode 221c side) are densely arranged in the horizontal direction and in the oblique direction (for example, by an angle of 15 degrees with respect to the horizontal direction) in the light distribution pattern. Furthermore, the luminance gradation part can be matched to the desired light distribution pattern. The vehicle lamp assembly 210 of the present exemplary embodiment can improve the light utilization efficiency.

MODIFIED EXAMPLE 5-1

A description will next be given of Modified Example 5-1 of the vehicle lamp assembly 210 with reference to the drawings.

FIGS. 41A and 41B are a view illustrating an outer appearance of a vehicle lamp assembly 210 configured as Modified Example 5-1 and a vertical cross sectional view of the same, respectively.

As shown in FIGS. 41A and 41B, the vehicle lamp assembly 210 of Modified Example 5-1 can include a light source 220 disposed in the front side of a vehicle body and a projection optical system having a reflector 232 and the like disposed in the rear of the light source 220.

The light source 220 with the above described structure of the presently disclosed subject matter can be disposed such that the long side 221a2 far from the n electrode 221c side is positioned closer to the forefront side while the n electrode 221c (or the luminance peak portion) side is positioned farther from the forefront side (namely, closer to the reflector 231). In addition, the light source 220 can be disposed such that the illumination direction of the light source 220 (or the light emission surface of the light source 220) is directed upward (see FIG. 41B).

The reflector 232 can be a revolved paraboloid having a focal point close to the light source 220. The reflector 232 can be disposed to cover a range from the side to the front of the light source 220 so as to allow the light from the light source 220 to impinge on the reflector 231. Namely, the reflector 231 can be disposed to face the light emission surface of the light source 220 (see FIGS. 41A and 41B). It should be noted that the reflector 232 can be composed of a plurality of small separated reflection regions, and is of a type so called "multi-reflector" in the present exemplary embodiment.

As shown in FIG. 41B, the reflector 232 can project a plurality of light source images P1 of the light emission surface of the light source 220 so that the image portion P1' corresponding to the n electrode 221c (luminance peak portion) can be disposed upper side when the image is projected onto the virtual vertical screen (not shown) assumed to be formed in front of the vehicle lamp assembly 210 and separated away from the same. Note that FIG. 41B shows only one light source image P1. The projection of the plurality of light source images P1 of the light source 220 can be controlled such that the respective image portions P1' of the light source images P1 corresponding to the n electrode 221c (luminance peak portion) are densely arranged in the horizontal direction and in the oblique direction (for example, by an angle of 15 degrees with respect to the horizontal direction) on the virtual vertical screen. This configuration can form the desired light distribution pattern P for a headlamp including the cut-off line (including the horizontal cut-off line CL1 and the oblique cut-off line CL2, see FIG. 11) by the plurality of light source images P1.

In the vehicle lamp assembly 210 of the present Modified Example, the light source 220 and the reflector 232 can be arranged in the above described physical relationship (see FIGS. 41A and 41B). Accordingly, the respective image portions P1' of the light source images P1 corresponding to the n electrode 221c (luminance peak portion) can be densely arranged in the horizontal direction and in the oblique direction (for example, by an angle of 15 degrees with respect to the horizontal direction) on the virtual vertical screen. This configuration can form the desired light distribution pattern P, in particular, suitable for a low-beam, which can include the cut-off line (including the horizontal cut-off line CL1 and the oblique cut-off line CL2) with the maximum luminance distribution and have a gradation where the luminance distribution gradually decreases from the cut-off line to the lower side. The vehicle lamp assembly 210 with this configuration can provide an improved far-distance visibility (see FIG. 11).

Furthermore, in the vehicle lamp assembly 210 of the present Modified Example, the LED element 221 can have the luminance distribution with the luminance peak at the n electrode 221c side (namely, the maximum luminance portion is disposed on the side of the n electrode 221c, see FIG. 39D). In the lamp assembly utilizing the conventional LED element, part of light is cut for forming a desired light distribution pattern (see FIG. 4). However, the vehicle lamp assembly 210 with the above configuration need not cut part of light from the LED element 221, but can utilize the light emission state as is of the LED element 221 with the above luminance distribution so as to form the light distribution pattern P for a low beam (see FIG. 11). Accordingly, the projection optical system can have the reflector 232 that is designed such that part of light from the LED element 221 is not cut and the plurality of images P1' corresponding to the luminance peak portion (the n electrode side 221c) are densely arranged in the horizontal direction and in the oblique direction (for example, by an angle of 15 degrees with respect to the horizontal direction) in the light distribution pattern. Furthermore, the luminance gradation part can be matched to the desired light distribution pattern. The vehicle lamp assembly 210 of the present Modified Example can improve the light utilization efficiency.

MODIFIED EXAMPLE 5-2

A description will next be given of Modified Example 5-2 of the vehicle lamp assembly 210 with reference to the drawings.

FIGS. 42A and 42B are a view illustrating an outer appearance of a vehicle lamp assembly 210 configured as Modified Example 5-2 and a vertical cross sectional view of the same, respectively.

As shown in FIGS. 42A and 42B, the vehicle lamp assembly 210 of Modified Example 5-2 can include a light source 220 disposed in the front side of a vehicle body and a projection optical system having a reflector 233 and the like disposed in the rear of the light source 220.

The light source 220 with the above described structure of the presently disclosed subject matter can be disposed such that the long side 221a2 far from the n electrode 221c is positioned upward in the vertical direction while the n electrode 221c (or the luminance peak portion) side is positioned downward in the vertical direction. In addition, the light source 220 can be disposed such that the illumination direction of the light source 220 (or the light emission surface of the light source 220) is directed substantially in the horizontal direction (namely, the light emission surface of the light source 220 is directed in the substantially vertical direction, see FIG. 42B).

The reflector 233 can be a revolved paraboloid having a focal point close to the light source 220. The reflector 233 can be disposed in front of the light source 220 so as to allow the light from the light source 220 to impinge on the reflector 233 (see FIGS. 42A and 42B). It should be noted that the reflector 233 can be composed of a plurality of small separated reflection regions, and is of a type so called "multi-reflector" in the present exemplary embodiment.

As shown in FIG. 42B, the reflector 233 can project a plurality of light source images P1 of the light emission surface of the light source 220 so that the image portion P1' corresponding to the n electrode 221c (luminance peak portion) can be disposed upper side when the image is projected onto the virtual vertical screen (not shown) assumed to be formed in front of the vehicle lamp assembly 210 and separated away from the same. Note that FIG. 42B shows only one light source image P1. The projection of the plurality of light source images P1 of the light source 220 can be controlled such that the respective image portions P1' of the light source images P1 corresponding to the n electrode 221c (luminance peak portion) are densely arranged in the horizontal direction and in the oblique direction (for example, by an angle of 15 degrees with respect to the horizontal direction) on the virtual vertical screen. This configuration can form the desired light distribution pattern P for a headlamp including the cut-off line (including the horizontal cut-off line CL1 and the oblique cut-off line CL2, see FIG. 11) by the plurality of light source images P1.

In the vehicle lamp assembly 210 of the present Modified Example, the light source 220 and the reflector 233 can be arranged in the above described physical relationship (see FIGS. 42A and 42B). Accordingly, the respective image portions P1' of the light source images P1 corresponding to the n electrode 221c (luminance peak portion) can be densely arranged in the horizontal direction and in the oblique direction (for example, by an angle of 15 degrees with respect to the horizontal direction) on the virtual vertical screen. This configuration can form the desired light distribution pattern P, in particular, suitable for a low-beam, which can include the cut-off line (including the horizontal cut-off line CL1 and the oblique cut-off line CL2) with the maximum luminance distribution and have a gradation where the luminance distribution gradually decreases from the cut-off line to the lower side. The vehicle lamp assembly 210 with this configuration can provide an improved far-distance visibility (see FIG. 11).

Furthermore, in the vehicle lamp assembly 210 of the present Modified Example, the LED element 221 can have the luminance distribution with the luminance peak at the n electrode 221c side (namely, the maximum luminance portion is disposed on the side of the n electrode 221c, see FIG. 39D). In the lamp assembly utilizing the conventional LED element, part of light is cut for forming a desired light distribution pattern (see FIG. 4). However, the vehicle lamp assembly 210 with the above configuration need not cut part of light from the LED element 221, but can utilize the light emission state as is of the LED element 221 with the above luminance distribution so as to form the light distribution pattern P for a low beam (see FIG. 11). Accordingly, the projection optical system can have the reflector 233 that is designed such that part of light from the LED element 221 is not cut and the plurality of images P1' corresponding to the luminance peak portion (the n electrode side 221c) are densely arranged in the horizontal direction and in the oblique direction (for example, by an angle of 15 degrees with respect to the horizontal direction) in the light distribution pattern. Furthermore, the luminance gradation part can be matched to the desired light distribution pattern. The vehicle lamp assembly 210 of the present Modified Example can improve the light utilization efficiency.

MODIFIED EXAMPLE 5-3

A description will next be given of Modified Example 5-3 of the vehicle lamp assembly 210 with reference to the drawings.

Figure 43:
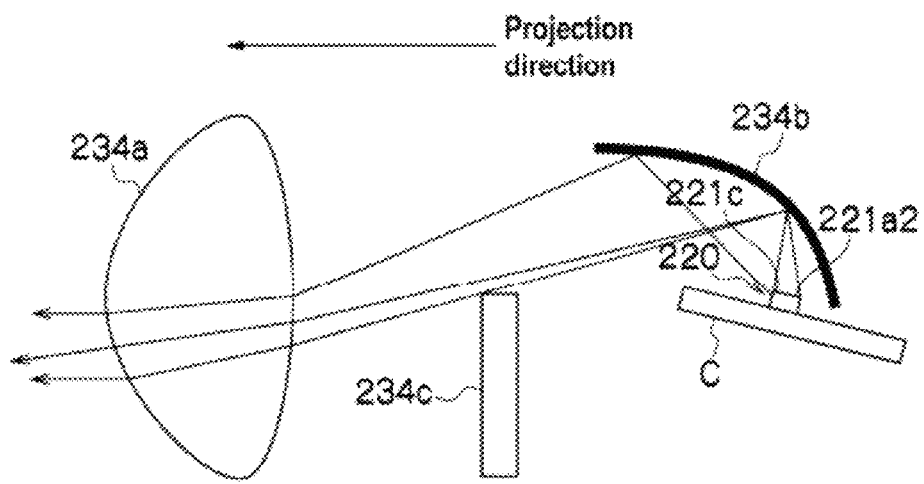
FIG. 43 is a vertical cross sectional view of a vehicle lamp assembly configured as Modified Example 5-3.

FIG. 43 is a vertical cross sectional view of a vehicle lamp assembly 210 configured as Modified Example 5-3.

As shown in FIG. 43, the vehicle lamp assembly 210 of the present Modified Example can include a projection lens 234a disposed in the front side of a vehicle body, a light source 220 disposed in the rear of the projection lens 234a, a reflector 234b disposed so as to cover the range from the side to the front of the light source 220 in order to allow the light from the light source 220 to impinge on the reflector 234b (namely, the reflector 234b faces the light source 220), a shade 234c disposed between the projection lens 234a and the light source 220, and the like. The projection lens 234a, the reflector 234b, and the shade 234c can constitute the projection optical system of the presently disclosed subject matter.

The light source 220 with the above described structure of the presently disclosed subject matter can be disposed such that the n electrode 221c (or the luminance peak portion) side is positioned closer to the forefront side while the long side 221a2 far from the n electrode 221c side is positioned farther from the forefront side. In addition, the light source 220 can be disposed such that the illumination direction of the light source 220 (or the light emission surface of the light source 220) is directed upward (see FIG. 43).

The reflector 234b can be a revolved elliptic surface having a first focal point close to the light source 220 and a second focal point close to the upper edge of the shade 234c. The reflector 234b can be disposed to cover the range from the side to the front of the light source 220 so as to allow the light from the light source 220 to impinge on the reflector 234b. Namely, the reflector 234b can be disposed to face the light emission surface of the light source 220 (see FIG. 43). The reflector 234b can project a plurality of light source images P1 of the light emission surface of the light source 220 so that the image portion P1' corresponding to the n electrode 221c (luminance peak portion) can be disposed upper side when the image is projected onto the virtual vertical screen (not shown). The projection of the plurality of light source images P1 of the light source 220 can be controlled such that the respective image portions P1' of the light source images P1 corresponding to the n electrode 221c (luminance peak portion) are densely arranged in the horizontal direction and in the oblique direction (for example, by an angle of 15 degrees with respect to the horizontal direction) on the virtual vertical screen. This configuration can form the desired light distribution pattern P for a headlamp including a desired cut-off line (including the horizontal cut-off line CL1 and the oblique cut-off line CL2, see FIG. 11).

The shade 234c can be a shading member configured to form the cut-off line by shielding part of light reflected from the reflector 234b. The shade 234c can be disposed between the projection lens 234a and the light source 220 so that the upper edge thereof is positioned at or near the focal point of the projection lens 234a.

In the vehicle lamp assembly 210 of the present Modified Example, the light source 220 and the projection light system can be arranged in the above described physical relationship (see FIG. 43). Accordingly, the respective image portions P1' of the light source images P1 corresponding to the n electrode 221c (luminance peak portion) can be densely arranged in the horizontal direction and in the oblique direction (for example, by an angle of 15 degrees with respect to the horizontal direction) on the virtual vertical screen. This configuration can form the desired light distribution pattern P, in particular, suitable for a low-beam, which can include the cut-off line (including the horizontal cut-off line CL1 and the oblique cut-off line CL2) with the maximum luminance distribution and have a gradation where the luminance distribution gradually decreases from the cut-off line to the lower side. The vehicle lamp assembly 210 with this configuration can provide an improved far-distance visibility (see FIG. 11).

Furthermore, in the vehicle lamp assembly 210 of the present Modified Example, the LED element 221 can have the luminance distribution with the luminance peak at the n electrode 221c side (namely, the maximum luminance portion is disposed on the side of the n electrode 221c side, see FIG. 39C). In the lamp assembly utilizing the conventional LED element, part of light (approximately half thereof) is cut for forming a desired light distribution pattern (see FIG. 4). However, the vehicle lamp assembly 210 with the above configuration need not cut part of light from the LED element 221, but can utilize the light emission state as is of the LED element 221 with the above luminance distribution so as to form the light distribution pattern P for a low beam (see FIG. 11). In the lamp assembly utilizing the conventional LED element, part of light (approximately half thereof) is cut for forming a desired light distribution pattern (see FIG. 4). However, the vehicle lamp assembly 210 with the above configuration need not cut part of light from the LED element 221, but can utilize the light emission state as is of the LED element 221 with the above luminance distribution so as to form the light distribution pattern P for a low beam (see FIG. 11). The vehicle lamp assembly 210 of the present Modified Example can improve the light utilization efficiency.

According to the vehicle lamp assembly 210 of the present Modified Example, the shade 234c can receive energy less than that in the lamp assembly utilizing a conventional LED element. Specifically, since the shade 234c can receive only part of light from the LED element 221 at the high luminance side, it is possible to reduce the amount of heat unnecessarily applied to the shade 234c.

MODIFIED EXAMPLE 5-4

A description will next be given of Modified Example 5-4 of the vehicle lamp assembly 210 with reference to the drawings.

Figure 44:
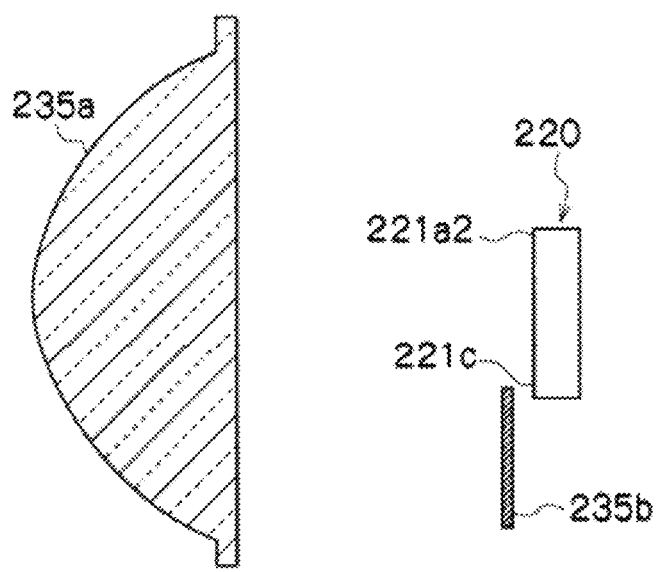
FIG. 44 is a vertical cross sectional view of a vehicle lamp assembly configured as Modified Example 5-4.

FIG. 44 is a vertical cross sectional view of a vehicle lamp assembly 210 configured as Modified Example 5-4.

As shown in FIG. 44, the vehicle lamp assembly 210 of the present Modified Example can include a projection lens 235a disposed in the front side of a vehicle body, a light source 220 disposed in the rear of the projection lens 235a, a shade 235b disposed between the projection lens 235a and the light source 220, and the like. The projection lens 235a and the shade 235b can constitute the projection optical system of the presently disclosed subject matter.

The light source 220 with the above described structure of the presently disclosed subject matter can be disposed such that the long side 221a2 far from the n electrode 221c side is positioned upward in the vertical direction while the n electrode 221c (or the luminance peak portion) side is positioned downward in the vertical direction. In addition, the light source 220 can be disposed such that the illumination direction of the light source 220 (or the light emission surface of the light source 220) is directed substantially in the horizontal direction (namely, the light emission surface of the light source 120 is directed in the substantially vertical direction, see FIG. 44).

The shade 235b can be a shading member configured to form the cut-off line by shielding part of light from the light source 220. The shade 235b can be disposed between the projection lens 235a and the light source 220 so that the upper edge thereof is positioned at or near the focal point of the projection lens 235a.

In the vehicle lamp assembly 210 of the present Modified Example, the light source 220 and the projection light system can be arranged in the above described physical relationship (see FIG. 44). Accordingly, the respective image portions P1' of the light source images P1 corresponding to the n electrode 221c (luminance peak portion) can be densely arranged in the horizontal direction and in the oblique direction (for example, by an angle of 15 degrees with respect to the horizontal direction) on the virtual vertical screen. This configuration can form the desired light distribution pattern P, in particular, suitable for a low-beam, which can include the cut-off line (including the horizontal cut-off line CL1 and the oblique cut-off line CL2) with the maximum luminance distribution and have a gradation where the luminance distribution gradually decreases from the cut-off line to the lower side. The vehicle lamp assembly 210 with this configuration can provide an improved far-distance visibility (see FIG. 11).

Furthermore, in the vehicle lamp assembly 210 of the present Modified Example, the LED element 221 can have the luminance distribution with the luminance peak at the n electrode 221c side (namely, the maximum luminance portion is disposed on the side of the n electrode 221c, see FIG. 39D). In the lamp assembly utilizing the conventional LED element, part of light (approximately half thereof) is cut for forming a desired light distribution pattern (see FIG. 4). However, the vehicle lamp assembly 210 with the above configuration need not cut part of light from the LED element 221, but can utilize the light emission state as is of the LED element 221 with the above luminance distribution so as to form the light distribution pattern P for a low beam (see FIG. 11). Accordingly, the projection optical system can have the projection optical system that is designed such that part of light from the LED element 221 is not cut and the plurality of images P1' corresponding to the luminance peak portion (the n electrode 221c side) are densely arranged in the horizontal direction and in the oblique direction (for example, by an angle of 15 degrees with respect to the horizontal direction) in the light distribution pattern. Furthermore, the luminance gradation part can be matched to the desired light distribution pattern. The vehicle lamp assembly 210 of the present Modified Example can improve the light utilization efficiency.

According to the vehicle lamp assembly 210 of the present Modified Example, the shade 235b can receive energy less than that in the lamp assembly utilizing a conventional LED element. Specifically, since the shade 235b can receive only part of light from the LED element 221 at the high luminance side, it is possible to reduce the amount of heat unnecessarily applied to the shade 235b.

MODIFIED EXAMPLE 6-1

Next, a description will be given of the structure of the LED element 221 according to Modified Example 6-1 with reference to the drawings. FIGS. 45A, 45B, 45C, and 45D are a front view (top plan view) of the LED element 221, a rear view of the LED element 221, a cross sectional view (side view) of the LED element 221, and a luminance distribution diagram of the LED element 221, in particular, its light emission surface when viewed along line B-B of FIG. 45A, respectively.

As shown in FIGS. 45B and 45C, the p electrode 221g can include a plurality of electrodes 221g1 extending in the same direction as the n electrode 221c.

For example, as shown in FIGS. 45B and 45C, the plurality of electrodes 221g1 can be formed at certain intervals on the surface of the transparent electrode 221f in the vertical direction so that the vertical dimension (vertical width) thereof becomes larger from the farther long side to the n electrode 221c.

According to the present Modified Example, a current flowing from the respective electrodes 221g1 to the n electrode 221c can activate the active layer 221d so that the active layer 221d can emit light over the substantially entire area. The light emitted from the active layer 221d can be taken out more in the area in the vicinity of the n electrode 221c where the electrode 221g1 with a larger vertical width is formed than the other area where the electrode 221g1 with a smaller vertical width is formed. This is because the larger electrode 221g1 (reflection electrode) can have a larger reflection action. By controlling the reflection light with the reflection electrode, a luminance distribution can be formed on the light emission surface of the LED element 221 (in the vertical cross sectional direction) so as to have a luminance peak in the vicinity of the n electrode 221c and decrease gradually from the n electrode 221c to the other long side in the vertical direction (see FIG. 45D). Furthermore, a constant luminance distribution can be formed in the horizontal cross sectional direction of the light emission surface of the LED element 221.

When the wavelength conversion layer 222 is disposed so as to cover the light emission surface of the LED element 221 according to the present Modified Example (see FIG. 38), a luminance distribution can be formed as shown in FIG. 45D such that a luminance peak appears in the vicinity of the n electrode 221c in the vertical cross sectional direction (namely, the maximum luminance portion is disposed on the side of the n electrode 221c) and gradually decreases from the n electrode 221c toward the other long side in the vertical direction (see FIG. 45D) while a constant luminance distribution can be formed when taken along the horizontal cross sectional direction. In this manner, the light source 220 with the above configuration can form the luminance distribution suitable for forming a desired light distribution pattern for a headlamp, for example.

Furthermore, the light source 220 including the LED element 221 according to the present Modified Example can have a similar luminance distribution to that of the light source 220 of the above exemplary embodiment, namely, the luminance distribution can have a luminance peak in the vicinity of the n electrode 221c. Accordingly, the light source 220 including the LED element 221 according to the present Modified Example can be applied to the vehicle lamp assembly 210 (see FIG. 37) and the respective vehicle lamp assemblies 210 of the Modified Examples 5-1 to 5-4 (see FIGS. 41 to 44).

It should be noted that the adjustment of the vertical size (vertical width) of the respective electrodes 221g1 and the like can control the target luminance distribution of the light emission surface of the LED element 221 (light source 220) in the direction along the vertical cross section (for example, the position, width and the like of the luminance peak portion).

In this case, the number of the electrodes 221g1, the vertical width H1 between the electrodes 221g1, and the like can be adjusted to control the formed luminance distribution where the horizontal stripes including a plurality of peaks can be prevented from being generated.

MODIFIED EXAMPLE 6-2

Next, a description will be given of the structure of the LED element 221 according to Modified Example 6-2 with reference to the drawings. FIGS. 46A, 46B, 46C, 46D are a front view (top plan view) of the LED element 221, a rear view of the LED element 221, a cross sectional view (side view) of the LED element 221, and a luminance distribution diagram of the LED element 221, in particular, its light emission surface when viewed along line C-C of FIG. 46A, respectively.

As shown in FIGS. 46A and 46C, a plurality of structural units 221a1 can be formed on the surface of the substrate 221a. The structural unit 221a1 can be configured to extract light from the active layer 221d (direct light from the active layer 221d and the light reflected by the p electrode 221g), and is called as a micro-cone, for example. The structural unit 221a1 can be convex or concave with respect to the surface of the substrate 221a.

For example, as shown in FIG. 46B, an additional n electrode 221c2 can be formed along one long side far from the n electrode 221c and extend in the same direction as the n electrode 221c, and can be connected to the n electrode 221c by an additional n electrode 221c3 extending in the vertical direction (or short side direction). Further, as shown in FIG. 46A, the plurality of structural units 221a1 can be formed so that the density of the structural units 221a1 is increased from the long side 221a2 far from the n electrode 221c toward the n electrode 221c (control by the number of the structural units). The size of the structural unit 221a1 can vary the light extraction efficiency, and accordingly, this size control can be utilized to adjust the luminance distribution.

For example, the surface of the substrate 221a can be subjected to dry etching to form the plurality of structural units 221a1.

In the present Modified Example, the current supplied from the p electrode 221g to the n electrode 221c (including the additional n electrodes 221c2 and 221c3) can activate the active layer 221d so that the active layer 221d can emit light from its entire area. The light emitted from the active layer 221d can be taken out more from the n electrode 221c side where the plurality of structural units 221a1 are formed densely on the surface of the substrate 221a than the thin area where the units 121a3 are formed with a low density. Accordingly, a luminance distribution on the light emission surface of the LED element 221 can have a luminance peak portion in the vicinity of the n electrode 221c in the vertical cross sectional direction, and decrease gradually from the n electrode 221c to the farther long side (see FIG. 46D). Furthermore, the light emission surface of the LED element 221 can show a constant luminance distribution when taken along the horizontal cross sectional direction.

When the wavelength conversion layer 222 is disposed so as to cover the light emission surface of the LED element 221 according to the present Modified Example (see FIG. 38), a luminance distribution can be formed as shown in FIG. 46C such that a luminance peak appears in the vicinity of the n electrode 221c in the vertical cross sectional direction (namely, the maximum luminance portion is disposed on the side of the n electrode 221c) and gradually decreases from the n electrode 221c toward the other long side in the vertical direction (see FIG. 46D) while a constant luminance distribution can be formed when taken along the horizontal cross sectional direction. In this manner, the light source 220 with the above configuration can form the luminance distribution suitable for forming a desired light distribution pattern for a headlamp, for example.

Furthermore, the light source 220 including the LED element 221 according to the present Modified Example can have a similar luminance distribution to that of the light source 220 of the above exemplary embodiment, namely, the luminance distribution can have a luminance peak in the vicinity of the n electrode 221c. Accordingly, the light source 220 including the LED element 221 according to the present Modified Example can be applied to the vehicle lamp assembly 210 (see FIG. 37) and the respective vehicle lamp assemblies 210 of the Modified Examples 5-1 to 5-4 (see FIGS. 41 to 44).

It should be noted that the adjustment of the density and size of the plurality of structural units 221a1 can control the target luminance distribution of the light emission surface of the LED element 221 (light source 220) in the direction along the vertical cross section (for example, the position, width and the like of the luminance peak portion).

Note that the plurality of structural units 221a1 can be formed not on the surface of the substrate 221a, but on the other areas between the substrate 221a and the n-type semiconductor layer 221b.

Further, the Modified Example 6-2 can be combined with the other Modified Examples to form different LED elements 221.

It will be apparent to those skilled in the art that various modifications and variations can be made in the presently disclosed subject matter without departing from the spirit or scope of the presently disclosed subject matter. Thus, it is intended that the presently disclosed subject matter cover the modifications and variations of the presently disclosed subject matter provided they come within the scope of the appended claims and their equivalents. All related art references described above are hereby incorporated in their entirety by reference.

What is claimed is:

1. A lamp assembly including an illumination direction, comprising:
a light source including an LED element with an emission surface; and
a projection optical system for projecting an image of the light source in the illumination direction so that a desired light distribution pattern is formed on a virtual vertical screen disposed in front of the lamp assembly, wherein
the light source has a rectangular shape having long sides and short sides, and is configured to provide a luminance distribution on the emission surface such that a luminance peak portion is provided substantially at one of the long sides,
the lamp assembly is configured to project an image corresponding to the luminance peak portion toward a predetermined area in the desired light distribution pattern,
the LED element has a first long side and a second long side and includes
a rectangular substrate,
a rear surface electrode formed on one surface of the substrate,
a p electrode formed on a surface opposite to the one surface of the substrate, the p electrode configured to serve as a reflection electrode,
a p-type semiconductor layer deposited on the p electrode,
an active layer formed on the p-type semiconductor layer,
an n-type semiconductor layer formed on the active layer, and
an n electrode formed on a narrow region including the first long side of a surface of the n-type semiconductor layer and extending in a direction parallel to the first long side of the LED element, the LED element being of a vertical type, and wherein
the projection optical system is configured to project an image of the light source in the illumination direction as a plurality of light source images so that the image of the luminance peak portion corresponding to the n electrode is positioned on one side of the light distribution pattern, thereby forming the light distribution pattern for a headlamp including a cut-off line formed of the images of the luminance peak portions of the plurality of the light source images on a virtual vertical screen located a certain distance away from the lamp assembly in the illumination direction, and a plurality of concave and/or convex structural units are formed on the surface of the n-type semiconductor layer so that a density of the structural units is increased from the second long side of the LED element toward the n electrode.

2. The lamp assembly according to claim 1, wherein the light source further includes a wavelength conversion layer disposed so as to cover the emission surface, so that the light source emits light with a desired color by additive color mixture using light emitted from the LED element which passes through the wavelength conversion layer and light emitted from the wavelength conversion layer as a result of excitation of the wavelength conversion layer by light from the LED element.

3. The lamp assembly according to claim 1, wherein the LED element further includes an additional n electrode connected to the n electrode, extending in the direction parallel to the first long side of the LED element and formed in a midway position between the first long side of the LED element and the second long side of the LED element on the surface of the n-type semiconductor layer.

4. The lamp assembly according to claim 2, wherein the LED element further includes an additional n electrode connected to the n electrode, extending in the direction parallel to the first long side of the LED element and formed in a midway position between the first long side of the LED element and the second long side of the LED element on the surface of the n-type semiconductor layer.

5. The lamp assembly according to claim 1, wherein the LED element further includes a plurality of additional n electrodes each connected to the n electrode and extending in the direction parallel to the first long side of the LED element and formed so that a distance between adjacent additional n electrodes is decreased from the second long side of the LED element toward the n electrode.

6. The lamp assembly according to claim 2, wherein the LED element further includes a plurality of additional n electrodes each connected to the n electrode and extending in the direction parallel to the first long side of the LED element and formed so that a distance between adjacent additional n electrodes is decreased from the second long side of the LED element toward the n electrode.

7. The lamp assembly according to claim 1, wherein the LED element further includes a plurality of additional n electrodes each connected to the n electrode and extending in the direction parallel to the first long side of the LED element, and the p electrode includes a plurality of first reflectance electrodes extending in the direction parallel to the first long side of the LED element and a plurality of second reflectance electrodes extending in the direction parallel to the first long side of the LED element, the second reflectance electrode having a reflectance lower than the first reflectance electrode, the first reflectance electrodes and the second reflectance electrodes being formed alternately, the plurality of second reflectance electrodes being formed so that a distance between adjacent second reflectance electrodes is decreased from the n electrode toward the second long side of the LED element.

8. The lamp assembly according to claim 2, wherein the LED element further includes a plurality of additional n electrodes each connected to the n electrode and extending in the direction parallel to the first long side of the LED element, and the p electrode includes a plurality of first reflectance electrodes extending in the direction parallel to the first long side of the LED element and a plurality of second reflectance electrodes extending in the direction parallel to the first long side of the LED element, the second reflectance electrode having a reflectance lower than the first reflectance electrode, the first reflectance electrodes and the second reflectance electrodes being formed alternately, the plurality of second reflectance electrodes being formed so that a distance between adjacent second reflectance electrodes is decreased from the n electrode toward the second long side of the LED element.

9. The lamp assembly according to claim 1, wherein the LED element further includes a plurality of first transparent conductive films formed on the surface of the n-type semiconductor layer and extending in the direction parallel to the first long side of the LED element and a second transparent conductive film covering the plurality of first transparent conductive films and the surface of the n-type semiconductor layer exposed between the first transparent conductive films, the second transparent conductive film having a refractive index lower than the first transparent conductive film, and wherein portions where the first transparent conductive film and the second transparent conductive film overlap with each other have a dimension in a direction parallel to a short side of the LED element so that the dimension is increased away from the second long side of the LED element toward the n electrode.

10. The lamp assembly according to claim 2, wherein the LED element further includes a plurality of first transparent conductive films formed on the surface of the n-type semiconductor layer and extending in the direction parallel to the first long side of the LED element and a second transparent conductive film covering the plurality of first transparent conductive films and the surface of the n-type semiconductor layer exposed between the first transparent conductive films, the second transparent conductive film having a refractive index lower than the first transparent conductive film, and wherein portions where the first transparent conductive film and the second transparent conductive film overlap with each other have a dimension in a direction parallel to a short side so that the dimension is increased away from the second long side of the LED element toward the n electrode.

11. The lamp assembly according to claim 2, wherein the additive color mixture produces white light, and the lamp assembly is configured for use with a vehicle.

* * * * *